United States Patent
Cok et al.

(10) Patent No.: US 10,522,719 B2
(45) Date of Patent: Dec. 31, 2019

(54) COLOR-FILTER DEVICE

(71) Applicant: X-Celeprint Limited, Cork (IE)

(72) Inventors: Ronald S. Cok, Rochester, NY (US); Christopher Andrew Bower, Raleigh, NC (US); Robert R. Rotzoll, Colorado Springs, CO (US); Mark Willner, Denver, CO (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 16/227,477

(22) Filed: Dec. 20, 2018

(65) Prior Publication Data

US 2019/0148604 A1    May 16, 2019

Related U.S. Application Data

(60) Division of application No. 15/663,437, filed on Jul. 28, 2017, now Pat. No. 10,199,546, which is a
(Continued)

(51) Int. Cl.
*H01L 33/50*    (2010.01)
*H01L 25/075*    (2006.01)
(Continued)

(52) U.S. Cl.
CPC ........ *H01L 33/502* (2013.01); *H01L 25/0753* (2013.01); *H01L 27/15* (2013.01);
(Continued)

(58) Field of Classification Search
CPC . H01L 33/502; H01L 33/0095; H01L 33/505; H01L 27/15; H01L 24/95;
(Continued)

(56) References Cited

U.S. PATENT DOCUMENTS 4,746,202 A    5/1988 Perilloux et al.
5,060,027 A    10/1991 Hart et al.
(Continued)

FOREIGN PATENT DOCUMENTS

CN    103677427 A    3/2014
EP    1662301 A1    5/2006
(Continued)

OTHER PUBLICATIONS

Bower, C. A. et al., Transfer Printing: An Approach for Massively Parallel Assembly of Microscale Devices, IEEE, Electronic Components and Technology Conference, (2008).
(Continued)

*Primary Examiner* — Yosef Gebreyesus
(74) *Attorney, Agent, or Firm* — William R. Haulbrook; Michael D. Schmitt; Choate, Hall & Stewart LLP

(57) ABSTRACT

A micro-transfer color-filter device comprises a color filter, an electrical conductor disposed in contact with the color filter, and at least a portion of a color-filter tether attached to the color filter or structures formed in contact with the color filter. In certain embodiments, a color filter is a variable color filter electrically controlled through one or more electrodes and can be responsive to heat, electrical current, or an electrical field to modify its optical properties, such as color, transparency, absorption, or reflection. In certain embodiments, A color-filter device includes connection posts and can be provided in or on a source wafer suitable for micro-transfer printing. In some embodiments, a color-filter device is disposed on a device substrate and can include a control circuit for controlling the color filter. An array of micro-transfer color-filter devices can be disposed on a display substrate in order to form a display.

20 Claims, 35 Drawing Sheets

Related U.S. Application Data continuation-in-part of application No. 15/461,871, filed on Mar. 17, 2017, now Pat. No. 10,008,483.

(60) Provisional application No. 62/318,512, filed on Apr. 5, 2016.

(51) Int. Cl.
*H01L 27/15* (2006.01)
*H01L 33/00* (2010.01)
*H01L 23/00* (2006.01)

(52) U.S. Cl.
CPC ........ *H01L 33/0095* (2013.01); *H01L 33/505* (2013.01); *H01L 24/95* (2013.01); *H01L 2933/0016* (2013.01); *H01L 2933/0025* (2013.01); *H01L 2933/0041* (2013.01)

(58) Field of Classification Search
CPC ..... H01L 2933/0016; H01L 2933/0025; H01L 2933/0041
See application file for complete search history.

(56) References Cited

U.S. PATENT DOCUMENTS

| | | |
|---|---|---|
| 5,550,066 A | 8/1996 | Tang et al. |
| 5,621,555 A | 4/1997 | Park |
| 5,625,202 A | 4/1997 | Chai |
| 5,748,161 A | 5/1998 | Lebby et al. |
| 5,751,388 A | 5/1998 | Larson |
| 5,815,303 A | 9/1998 | Berlin |
| 5,886,401 A | 3/1999 | Liu |
| 5,917,572 A | 6/1999 | Kurauchi et al. |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,288,824 B1 | 9/2001 | Kastalsky |
| 6,340,999 B1 | 1/2002 | Masuda et al. |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,466,281 B1 | 10/2002 | Huang et al. |
| 6,504,180 B1 | 1/2003 | Heremans et al. |
| 6,552,740 B1 | 4/2003 | Wong et al. |
| 6,574,032 B1 | 6/2003 | Roddy et al. |
| 6,577,367 B2 | 6/2003 | Kim |
| 6,650,382 B1 | 11/2003 | Sumida et al. |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,825,559 B2 | 11/2004 | Mishra et al. |
| 6,828,724 B2 | 12/2004 | Burroughes |
| 6,881,946 B2 | 4/2005 | Cok et al. |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,157,838 B2 | 1/2007 | Thielemans et al. |
| 7,195,733 B2 | 3/2007 | Rogers et al. |
| 7,259,391 B2 | 8/2007 | Liu et al. |
| 7,288,753 B2 | 10/2007 | Cok |
| 7,394,194 B2 | 7/2008 | Cok |
| 7,402,951 B2 | 7/2008 | Cok |
| 7,408,296 B2 | 8/2008 | Cok et al. |
| 7,417,648 B2 | 8/2008 | Credelle |
| 7,420,221 B2 | 9/2008 | Nagai |
| 7,466,075 B2 | 12/2008 | Cok et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,614,757 B2 | 11/2009 | Nesterenko et al. |
| 7,622,367 B1 | 11/2009 | Nuzzo et al. |
| 7,629,955 B2 | 12/2009 | Asao et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,872,722 B2 | 1/2011 | Kimura |
| 7,893,612 B2 | 2/2011 | Cok |
| 7,898,734 B2 | 3/2011 | Coleman et al. |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,948,172 B2 | 5/2011 | Cok et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,004,758 B2 | 8/2011 | Coleman et al. |
| 8,029,139 B2 | 10/2011 | Ellinger et al. |
| 8,039,847 B2 | 10/2011 | Nuzzo et al. |
| 8,058,663 B2 | 11/2011 | Fan et al. |
| 8,179,401 B2 | 5/2012 | Ishii |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,446,081 B2 | 5/2013 | Cheng |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,536,584 B2 | 9/2013 | Yao |
| 8,581,827 B2 | 11/2013 | Park et al. |
| 8,596,846 B2 | 12/2013 | Yankov et al. |
| 8,599,118 B2 | 12/2013 | Cok |
| 8,619,011 B2 | 12/2013 | Kimura |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,829,663 B2 | 9/2014 | Pohl et al. |
| 8,835,940 B2 | 9/2014 | Hu et al. |
| 8,836,624 B2 | 9/2014 | Roberts et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,896,505 B2 | 11/2014 | Cok et al. |
| 8,901,578 B2 | 12/2014 | Kobayakawa et al. |
| 8,902,152 B2 | 12/2014 | Bai et al. |
| 8,912,020 B2 | 12/2014 | Bedell et al. |

(56) References Cited

U.S. PATENT DOCUMENTS

| | | |
|---|---|---|
| 8,946,760 B2 | 2/2015 | Kim |
| 8,987,765 B2 | 3/2015 | Bibl et al. |
| 9,022,632 B2 | 5/2015 | Kim et al. |
| 9,048,449 B2 | 6/2015 | Kim et al. |
| 9,105,813 B1 | 8/2015 | Chang |
| 9,153,171 B2 | 10/2015 | Sakariya et al. |
| 9,161,448 B2 | 10/2015 | Menard et al. |
| 9,178,123 B2 | 11/2015 | Sakariya et al. |
| 9,202,996 B2 | 12/2015 | Orsley et al. |
| 9,226,361 B2 | 12/2015 | Toth |
| 9,252,375 B2 | 2/2016 | Bibl et al. |
| 9,277,618 B2 | 3/2016 | Odnoblyudov et al. |
| 9,293,422 B1 | 3/2016 | Parsa et al. |
| 9,308,649 B2 | 4/2016 | Golda et al. |
| 9,329,430 B2 | 5/2016 | Erinjippurath et al. |
| 9,343,042 B2 | 5/2016 | Miller et al. |
| 9,358,775 B2 | 6/2016 | Bower et al. |
| 9,362,348 B2 | 6/2016 | Lowenthal et al. |
| 9,368,683 B1 | 6/2016 | Meitl et al. |
| 9,412,977 B2 | 8/2016 | Rohatgi |
| 9,437,782 B2 | 9/2016 | Bower et al. |
| 9,444,015 B2 | 9/2016 | Bower et al. |
| 9,520,537 B2 | 12/2016 | Bower et al. |
| 9,537,069 B1 | 1/2017 | Bower et al. |
| 9,590,025 B2 | 3/2017 | Yu et al. |
| 9,601,356 B2 | 3/2017 | Bower et al. |
| 9,626,908 B2 | 4/2017 | Sakariya et al. |
| 9,640,715 B2 | 5/2017 | Bower et al. |
| 9,698,308 B2 | 7/2017 | Bower et al. |
| 9,705,042 B2 | 7/2017 | Bower et al. |
| 9,716,082 B2 | 7/2017 | Bower et al. |
| 9,741,785 B2 | 8/2017 | Bower et al. |
| 9,818,725 B2 | 11/2017 | Bower et al. |
| 9,847,047 B2 | 12/2017 | Wu et al. |
| 9,860,955 B2 | 1/2018 | Kim et al. |
| 9,871,345 B2 | 1/2018 | Bower et al. |
| 9,929,053 B2 | 3/2018 | Bower et al. |
| 9,980,341 B2 | 5/2018 | Bower et al. |
| 9,991,163 B2 | 6/2018 | Bower et al. |
| 9,997,501 B2 | 6/2018 | Bower et al. |
| 10,008,483 B2 | 6/2018 | Cok et al. |
| 10,050,351 B2 | 8/2018 | Bower et al. |
| 10,066,819 B2 | 9/2018 | Cok |
| 10,078,239 B2 | 9/2018 | Sugita et al. |
| 10,103,069 B2 | 10/2018 | Bower et al. |
| 10,153,256 B2 | 12/2018 | Cok et al. |
| 10,153,257 B2 | 12/2018 | Cok et al. |
| 10,199,546 B2 | 2/2019 | Cok et al. |
| 10,209,813 B2 | 2/2019 | Yao et al. |
| 2001/0022564 A1 | 9/2001 | Youngquist et al. |
| 2002/0084952 A1 | 7/2002 | Morley et al. |
| 2002/0096994 A1 | 7/2002 | Iwafuchi et al. |
| 2002/0118321 A1 | 8/2002 | Ge |
| 2002/0126194 A1* | 9/2002 | Okabe .................. B41J 2/01 347/106 |
| 2002/0140646 A1 | 10/2002 | Sato et al. |
| 2002/0171792 A1 | 11/2002 | Kubota et al. |
| 2002/0171801 A1 | 11/2002 | Hsieh et al. |
| 2003/0001165 A1 | 1/2003 | Taki |
| 2004/0080483 A1 | 4/2004 | Chosa |
| 2004/0080941 A1 | 4/2004 | Jiang et al. |
| 2004/0135160 A1 | 7/2004 | Cok |
| 2004/0180476 A1 | 9/2004 | Kazlas et al. |
| 2004/0212296 A1 | 10/2004 | Nakamura et al. |
| 2004/0227704 A1 | 11/2004 | Wang et al. |
| 2004/0252933 A1 | 12/2004 | Sylvester et al. |
| 2005/0006657 A1 | 1/2005 | Terashita |
| 2005/0012076 A1 | 1/2005 | Morioka |
| 2005/0116621 A1 | 6/2005 | Bellmann et al. |
| 2005/0140275 A1 | 6/2005 | Park |
| 2005/0168987 A1 | 8/2005 | Tamaoki et al. |
| 2005/0194606 A1 | 9/2005 | Oohata |
| 2005/0202595 A1 | 9/2005 | Yonehara et al. |
| 2005/0264472 A1 | 12/2005 | Rast |
| 2005/0275615 A1 | 12/2005 | Kahen et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2006/0132671 A1 | 6/2006 | Koma |
| 2006/0180818 A1 | 8/2006 | Nagai et al. |
| 2006/0246811 A1 | 11/2006 | Winters et al. |
| 2006/0273862 A1 | 12/2006 | Shimmura |
| 2006/0289972 A1 | 12/2006 | Nishimura et al. |
| 2007/0035340 A1 | 2/2007 | Kimura |
| 2007/0077349 A1 | 4/2007 | Newman et al. |
| 2007/0182809 A1 | 8/2007 | Yarid et al. |
| 2007/0201056 A1 | 8/2007 | Cok et al. |
| 2008/0108171 A1 | 5/2008 | Rogers et al. |
| 2008/0211734 A1 | 9/2008 | Huitema et al. |
| 2008/0296717 A1 | 12/2008 | Beroz et al. |
| 2009/0045420 A1 | 2/2009 | Eng et al. |
| 2009/0140630 A1 | 6/2009 | Kijima et al. |
| 2009/0146921 A1 | 6/2009 | Takahashi |
| 2009/0251040 A1 | 10/2009 | Kim |
| 2009/0278142 A1 | 11/2009 | Watanabe et al. |
| 2009/0284696 A1 | 11/2009 | Cheong et al. |
| 2009/0295706 A1 | 12/2009 | Feng |
| 2009/0315054 A1 | 12/2009 | Kim et al. |
| 2010/0038655 A1 | 2/2010 | Chen et al. |
| 2010/0060553 A1 | 3/2010 | Zimmerman et al. |
| 2010/0078670 A1 | 4/2010 | Kim et al. |
| 2010/0123134 A1 | 5/2010 | Nagata |
| 2010/0123268 A1 | 5/2010 | Menard |
| 2010/0148198 A1 | 6/2010 | Sugizaki et al. |
| 2010/0149117 A1 | 6/2010 | Chien et al. |
| 2010/0155575 A1 | 6/2010 | Lundin |
| 2010/0186883 A1 | 7/2010 | Tomoda |
| 2010/0190293 A1 | 7/2010 | Maeda et al. |
| 2010/0201253 A1 | 8/2010 | Cok et al. |
| 2010/0207852 A1 | 8/2010 | Cok |
| 2010/0213819 A1 | 8/2010 | Cok et al. |
| 2010/0214245 A1 | 8/2010 | Hirota |
| 2010/0214247 A1 | 8/2010 | Tang et al. |
| 2010/0220459 A1 | 9/2010 | Jagt et al. |
| 2010/0248484 A1 | 9/2010 | Bower et al. |
| 2010/0258710 A1 | 10/2010 | Wiese et al. |
| 2010/0270912 A1 | 10/2010 | Ko |
| 2010/0289115 A1 | 11/2010 | Akiyama et al. |
| 2010/0317132 A1 | 12/2010 | Rogers et al. |
| 2010/0321414 A1 | 12/2010 | Muroi et al. |
| 2010/0328268 A1 | 12/2010 | Teranishi et al. |
| 2011/0032277 A1 | 2/2011 | Lee et al. |
| 2011/0043435 A1 | 2/2011 | Hebenstreit et al. |
| 2011/0069013 A1 | 3/2011 | Rabenstein et al. |
| 2011/0108800 A1 | 5/2011 | Pan |
| 2011/0120678 A1 | 5/2011 | Palm |
| 2011/0205448 A1 | 8/2011 | Takata |
| 2011/0211348 A1 | 9/2011 | Kim |
| 2011/0242027 A1 | 10/2011 | Chang |
| 2011/0309378 A1 | 12/2011 | Lau et al. |
| 2011/0316008 A1 | 12/2011 | Yokogawa |
| 2012/0018745 A1 | 1/2012 | Liu et al. |
| 2012/0049222 A1 | 3/2012 | Yoshizumi et al. |
| 2012/0056835 A1 | 3/2012 | Choo et al. |
| 2012/0062135 A1 | 3/2012 | Tamaki et al. |
| 2012/0105518 A1 | 5/2012 | Kang et al. |
| 2012/0119249 A1 | 5/2012 | Kim et al. |
| 2012/0126229 A1 | 5/2012 | Bower |
| 2012/0141799 A1 | 6/2012 | Kub et al. |
| 2012/0193652 A1 | 8/2012 | Horng et al. |
| 2012/0206428 A1 | 8/2012 | Cok |
| 2012/0206499 A1 | 8/2012 | Cok |
| 2012/0212465 A1 | 8/2012 | White et al. |
| 2012/0223636 A1 | 9/2012 | Shin et al. |
| 2012/0223875 A1 | 9/2012 | Lau et al. |
| 2012/0228669 A1 | 9/2012 | Bower et al. |
| 2012/0236022 A1 | 9/2012 | Homma et al. |
| 2012/0256163 A1 | 10/2012 | Yoon et al. |
| 2012/0274669 A1 | 11/2012 | Neal |
| 2012/0281028 A1 | 11/2012 | Orlick et al. |
| 2012/0314388 A1 | 12/2012 | Bower et al. |
| 2012/0320308 A1 | 12/2012 | Yeo et al. |
| 2012/0320566 A1 | 12/2012 | Namekata |
| 2012/0320581 A1 | 12/2012 | Rogers et al. |

(56) References Cited

U.S. PATENT DOCUMENTS

| | | |
|---|---|---|
| 2012/0326175 A1 | 12/2012 | Hu et al. |
| 2013/0006524 A1 | 1/2013 | Sasaki et al. |
| 2013/0010405 A1 | 1/2013 | Rothkopf et al. |
| 2013/0015483 A1 | 1/2013 | Shimokawa et al. |
| 2013/0016494 A1 | 1/2013 | Speier et al. |
| 2013/0036928 A1 | 2/2013 | Rogers et al. |
| 2013/0069275 A1 | 3/2013 | Menard et al. |
| 2013/0088416 A1 | 4/2013 | Smith et al. |
| 2013/0128585 A1 | 5/2013 | Bibl et al. |
| 2013/0153277 A1 | 6/2013 | Menard et al. |
| 2013/0153934 A1 | 6/2013 | Meitl et al. |
| 2013/0161667 A1 | 6/2013 | Chen et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0248889 A1 | 9/2013 | Lin |
| 2013/0249375 A1 | 9/2013 | Panagotacos et al. |
| 2013/0257264 A1 | 10/2013 | Tamaki et al. |
| 2013/0273695 A1 | 10/2013 | Menard et al. |
| 2013/0278513 A1 | 10/2013 | Jang |
| 2014/0014960 A1 | 1/2014 | Yamazaki et al. |
| 2014/0027709 A1 | 1/2014 | Higginson et al. |
| 2014/0070380 A1 | 3/2014 | Chiu et al. |
| 2014/0082934 A1 | 3/2014 | Cok |
| 2014/0084240 A1 | 3/2014 | Hu et al. |
| 2014/0084482 A1 | 3/2014 | Hu et al. |
| 2014/0085214 A1 | 3/2014 | Cok |
| 2014/0094878 A1 | 4/2014 | Gossler et al. |
| 2014/0104157 A1 | 4/2014 | Burns et al. |
| 2014/0104243 A1 | 4/2014 | Sakariya et al. |
| 2014/0111442 A1 | 4/2014 | Cok et al. |
| 2014/0146273 A1 | 5/2014 | Kim et al. |
| 2014/0151715 A1 | 6/2014 | Smirnov et al. |
| 2014/0159043 A1 | 6/2014 | Sakariya et al. |
| 2014/0159065 A1 | 6/2014 | Hu et al. |
| 2014/0159066 A1 | 6/2014 | Hu et al. |
| 2014/0168037 A1 | 6/2014 | Sakariya et al. |
| 2014/0175498 A1 | 6/2014 | Lai |
| 2014/0183446 A1 | 7/2014 | Nago et al. |
| 2014/0192061 A1 | 7/2014 | Payne et al. |
| 2014/0192079 A1 | 7/2014 | Lee et al. |
| 2014/0197509 A1 | 7/2014 | Haddad et al. |
| 2014/0198373 A1 | 7/2014 | Ray |
| 2014/0217448 A1 | 8/2014 | Kim et al. |
| 2014/0225938 A1 | 8/2014 | Soni et al. |
| 2014/0231839 A1 | 8/2014 | Jeon et al. |
| 2014/0231851 A1 | 8/2014 | Tsai et al. |
| 2014/0240617 A1 | 8/2014 | Fukutome et al. |
| 2014/0264763 A1 | 9/2014 | Meitl et al. |
| 2014/0267683 A1 | 9/2014 | Bibl et al. |
| 2014/0306248 A1 | 10/2014 | Ahn et al. |
| 2014/0319486 A1 | 10/2014 | Hong |
| 2014/0339495 A1 | 11/2014 | Bibl et al. |
| 2014/0340900 A1 | 11/2014 | Bathurst et al. |
| 2014/0367633 A1 | 12/2014 | Bibl et al. |
| 2014/0367705 A1 | 12/2014 | Bibl et al. |
| 2015/0003040 A1 | 1/2015 | Bessho et al. |
| 2015/0014024 A1 | 1/2015 | Yang |
| 2015/0015517 A1 | 1/2015 | Zhao |
| 2015/0021632 A1 | 1/2015 | Taghizadeh et al. |
| 2015/0084054 A1 | 3/2015 | Fan et al. |
| 2015/0135525 A1 | 5/2015 | Bower |
| 2015/0137153 A1 | 5/2015 | Bibl et al. |
| 2015/0169011 A1 | 6/2015 | Bibl et al. |
| 2015/0170602 A1 | 6/2015 | Kang |
| 2015/0179453 A1 | 6/2015 | Cheng et al. |
| 2015/0255438 A1 | 9/2015 | Oraw et al. |
| 2015/0263066 A1 | 9/2015 | Hu et al. |
| 2015/0263256 A1 | 9/2015 | Hsieh et al. |
| 2015/0279822 A1 | 10/2015 | Hsu |
| 2015/0280066 A1 | 10/2015 | Fujimura et al. |
| 2015/0280089 A1 | 10/2015 | Obata et al. |
| 2015/0296580 A1 | 10/2015 | Kim et al. |
| 2015/0308634 A1 | 10/2015 | van de Ven et al. |
| 2015/0318328 A1 | 11/2015 | Bibl et al. |
| 2015/0327388 A1 | 11/2015 | Menard et al. |
| 2015/0362165 A1 | 12/2015 | Chu et al. |
| 2015/0370130 A1 | 12/2015 | Lin |
| 2015/0371585 A1 | 12/2015 | Bower et al. |
| 2015/0371974 A1 | 12/2015 | Bower et al. |
| 2015/0372051 A1 | 12/2015 | Bower et al. |
| 2015/0372052 A1 | 12/2015 | Bower et al. |
| 2015/0372053 A1 | 12/2015 | Bower et al. |
| 2015/0372187 A1 | 12/2015 | Bower et al. |
| 2015/0373793 A1 | 12/2015 | Bower et al. |
| 2016/0004123 A1 | 1/2016 | Tanabe |
| 2016/0005721 A1 | 1/2016 | Bower et al. |
| 2016/0018094 A1 | 1/2016 | Bower et al. |
| 2016/0056725 A1 | 2/2016 | Kim et al. |
| 2016/0057822 A1 | 2/2016 | Chu |
| 2016/0057827 A1 | 2/2016 | Miskin |
| 2016/0057832 A1 | 2/2016 | Briggs et al. |
| 2016/0064363 A1 | 3/2016 | Bower et al. |
| 2016/0085120 A1 | 3/2016 | Xu |
| 2016/0093600 A1 | 3/2016 | Bower et al. |
| 2016/0103547 A1 | 4/2016 | Lu et al. |
| 2016/0131329 A1 | 5/2016 | Park et al. |
| 2016/0163765 A1 | 6/2016 | Hu et al. |
| 2016/0210895 A1 | 7/2016 | Fan et al. |
| 2016/0211245 A1 | 7/2016 | Do |
| 2016/0260388 A1 | 9/2016 | Yata et al. |
| 2016/0266697 A1 | 9/2016 | Cheng et al. |
| 2016/0343772 A1 | 11/2016 | Bower et al. |
| 2016/0351539 A1 | 12/2016 | Bower et al. |
| 2016/0364030 A1 | 12/2016 | Peana et al. |
| 2016/0370855 A1 | 12/2016 | Lanier et al. |
| 2017/0005244 A1 | 1/2017 | Bower et al. |
| 2017/0010706 A1 | 1/2017 | Cok |
| 2017/0025075 A1 | 1/2017 | Cok et al. |
| 2017/0025395 A1 | 1/2017 | Chen et al. |
| 2017/0025484 A1 | 1/2017 | Forrest et al. |
| 2017/0047393 A1 | 2/2017 | Bower et al. |
| 2017/0048976 A1 | 2/2017 | Prevatte et al. |
| 2017/0061842 A1 | 3/2017 | Cok et al. |
| 2017/0068362 A1 | 3/2017 | Den Boer et al. |
| 2017/0092863 A1 | 3/2017 | Bower et al. |
| 2017/0102797 A1 | 4/2017 | Cok |
| 2017/0122502 A1 | 5/2017 | Cok et al. |
| 2017/0133818 A1 | 5/2017 | Cok |
| 2017/0148771 A1 | 5/2017 | Cha et al. |
| 2017/0167703 A1 | 6/2017 | Cok |
| 2017/0186740 A1 | 6/2017 | Cok et al. |
| 2017/0187976 A1 | 6/2017 | Cok |
| 2017/0199429 A1 | 7/2017 | Kang et al. |
| 2017/0206845 A1 | 7/2017 | Sakariya et al. |
| 2017/0221266 A1 | 8/2017 | Schubert et al. |
| 2017/0250167 A1 | 8/2017 | Bower et al. |
| 2017/0250219 A1 | 8/2017 | Bower et al. |
| 2017/0256521 A1 | 9/2017 | Cok et al. |
| 2017/0256522 A1 | 9/2017 | Cok et al. |
| 2017/0287882 A1 | 10/2017 | Cok et al. |
| 2017/0338374 A1 | 11/2017 | Zou et al. |
| 2017/0352646 A1 | 12/2017 | Bower et al. |
| 2017/0352647 A1 | 12/2017 | Raymond et al. |
| 2017/0357127 A1 | 12/2017 | Cok et al. |
| 2017/0358717 A1 | 12/2017 | Cok et al. |
| 2018/0007750 A1 | 1/2018 | Meitl et al. |
| 2018/0033853 A1 | 2/2018 | Bower et al. |
| 2018/0041005 A1 | 2/2018 | Bower et al. |
| 2018/0084614 A1 | 3/2018 | Bower et al. |
| 2018/0119931 A1 | 5/2018 | Bower et al. |
| 2018/0130400 A1 | 5/2018 | Meitl et al. |
| 2018/0174932 A1 | 6/2018 | Cok et al. |
| 2018/0175248 A1 | 6/2018 | Ahmed |
| 2018/0197471 A1 | 7/2018 | Rotzoll et al. |
| 2018/0211945 A1 | 7/2018 | Cok et al. |
| 2018/0226386 A1 | 8/2018 | Cok |
| 2018/0277525 A1 | 9/2018 | Cok et al. |
| 2018/0323180 A1 | 11/2018 | Cok |
| 2018/0340681 A1 | 11/2018 | Cok |
| 2018/0366450 A1 | 12/2018 | Gardner et al. |
| 2019/0027534 A1 | 1/2019 | Rotzoll et al. |
| 2019/0088630 A1 | 3/2019 | Cok et al. |

(56) References Cited

U.S. PATENT DOCUMENTS

FOREIGN PATENT DOCUMENTS

| EP | 2078978 A2 | 7/2009 |
|---|---|---|
| EP | 2148264 A2 | 1/2010 |
| EP | 2 610 314 A1 | 7/2013 |
| EP | 2703969 A2 | 3/2014 |
| GB | 2 496 183 A | 5/2013 |
| JP | 11-142878 | 5/1999 |
| JP | 2002-261335 A | 9/2002 |
| JP | 2010-103186 A | 5/2010 |
| JP | 2013-221965 A | 10/2013 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/111601 A2 | 9/2010 |
| WO | WO-2010/132552 A1 | 11/2010 |
| WO | WO-2013/011415 A1 | 1/2013 |
| WO | WO-2013/064800 A1 | 5/2013 |
| WO | WO-2013/165124 A1 | 11/2013 |
| WO | WO-2014/121635 A1 | 8/2014 |
| WO | WO-2014/149864 A1 | 9/2014 |
| WO | WO-2015/088629 A1 | 6/2015 |
| WO | WO-2015/193434 A2 | 12/2015 |
| WO | WO-2016/030422 A1 | 3/2016 |
| WO | WO-2016/046283 A2 | 3/2016 |
| WO | WO-2017/042252 A1 | 3/2017 |
| WO | WO-2017/060487 A2 | 4/2017 |
| WO | WO-2017/149067 A1 | 9/2017 |
| WO | WO-2017/174632 A1 | 10/2017 |

OTHER PUBLICATIONS

Cok, R. S. et al., 60.3: AMOLED Displays Using Transfer-Printed Integrated Circuits, Society for Information Display, 10:902-904, (2010).
Feng, X. et al., Competing Fracture in Kinetically Controlled Transfer Printing, Langmuir, 23(25):12555-12560, (2007).
Gent, A.N., Adhesion and Strength of Viscoelastic Solids. Is There a Relationship between Adhesion and Bulk Properties?, American Chemical Society, Langmuir, 12(19):4492-4496, (1996).
Kim, Dae-Hyeong et al., Optimized Structural Designs for Stretchable Silicon Integrated Circuits, Small, 5(24):2841-2847, (2009).
Kim, Dae-Hyeong et al., Stretchable and Foldable Silicon Integrated Circuits, Science, 320:507-511, (2008).
Kim, S. et al., Microstructured elastomeric surfaces with reversible adhesion and examples of their use in deterministic assembly by transfer printing, PNAS, 107(40):17095-17100 (2010).
Kim, T. et al., Kinetically controlled, adhesiveless transfer printing using microstructured stamps, Applied Physics Letters, 94(11):113502-1-113502-3, (2009).
Meitl, M. A. et al., Transfer printing by kinetic control of adhesion to an elastomeric stamp, Nature Material, 5:33-38, (2006).
Michel, B. et al., Printing meets lithography: Soft approaches to high-resolution patterning, J. Res. & Dev. 45(5):697-708, (2001).
Choi, H. W. et al., Efficient GaN-based Micro-LED Arrays, Mat. Res. Soc. Symp. Proc., 743:L6.28.1-L6.28.6 (2003).
Cok, R. S. et al., AMOLED displays with transfer-printed integrated circuits, Journal of SID, 19(4):335-341 (2011).
Cok, R. S. et al., Inorganic light-emitting diode displays using micro-transfer printing, Journal of the SID, 25(10):589-609, (2017).
International Search Report, PCT/EP2017/058066, 3 pages, dated Jul. 5, 2017.
Johnson, K. et al., Advances in Red VCSEL Technology, Advances in Optical Technologies, 2012:569379, 13 pages (2012).
Kasahara, D. et al, Nichia reports first room-temperature blue/'green' VCSELs with current injection, Appl. Phys. Express, 4(7):3 pages (2011).
Koma, N. et al., 44.2: Novel Front-light System Using Fine-pitch Patterned OLED, SID, 08:655-658 (2008).
Lee, S. H. etal, Laser Lift-Offof GaN Thin Film and its Application to the Flexible Light Emitting Diodes, Proc. of SPIE, 8460:846011-1-846011-6 (2012).
Matioli, E. et al., High-brightness polarized light-emitting diodes, Light: Science & Applications, 1:e22:1-7 (2012).
Ogihara, Mitsuhiko, Latest Trend of High Definition LED Printheads, Oki Technical Review, 208(73)(4):28-31, 2006.
Poher, V. et al., Micro-LED arrays: a tool for two-dimensional neuron stimulation, J. Phys. D: Appl. Phys. 41:094014 (2008).
Roscher, H., VCSEL Arrays with Redundant Pixel Designs for 10Gbits/s 2-D Space—Parallel MMF Transmission, Annual Report, optoelectronics Department, (2005).
Seurin, J.F. et al, High-power red VCSEL arrays, Proc. of SPIE, 8639:1-9 (2013).
Trindade, A.J. et al., Precision transfer printing of ultra-thin AlInGaN micron-size light-emitting diodes, Crown, pp. 217-218, (2012).
Written Opinion, PCT/EP2017/058066, 8 pages, dated Jul. 5, 2017.
Yaniv et al., A 640×480 Pixel Computer Display Using Pin Diodes with Device Redundancy, 1988 International Display Research Conference, IEEE, CH-2678-1/88:152-154 (1988).
Yoon, J. et al., Heterogeneously Integrated Optoelectronic Devices Enabled by MicroTransfer Printing, Adv. Optical Mater., 3:1313-1335 (2015).
Yu, Jennifer and Bulovic, Vladimir, Micropatterning metal electrode of organic light emitting devices using rapid polydimethylsiloxane lift-off, Applied Physics Letters, 91:043102-1-043102-3, (2007).

\* cited by examiner

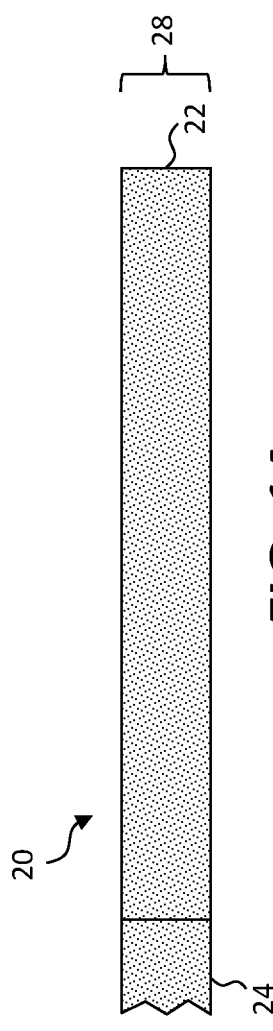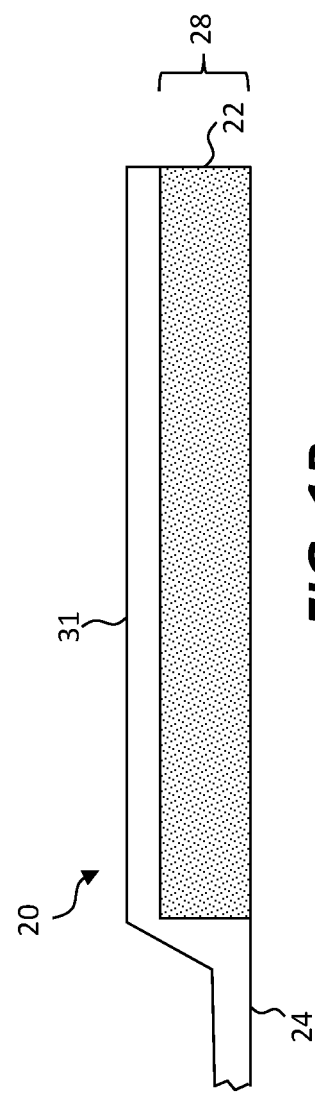

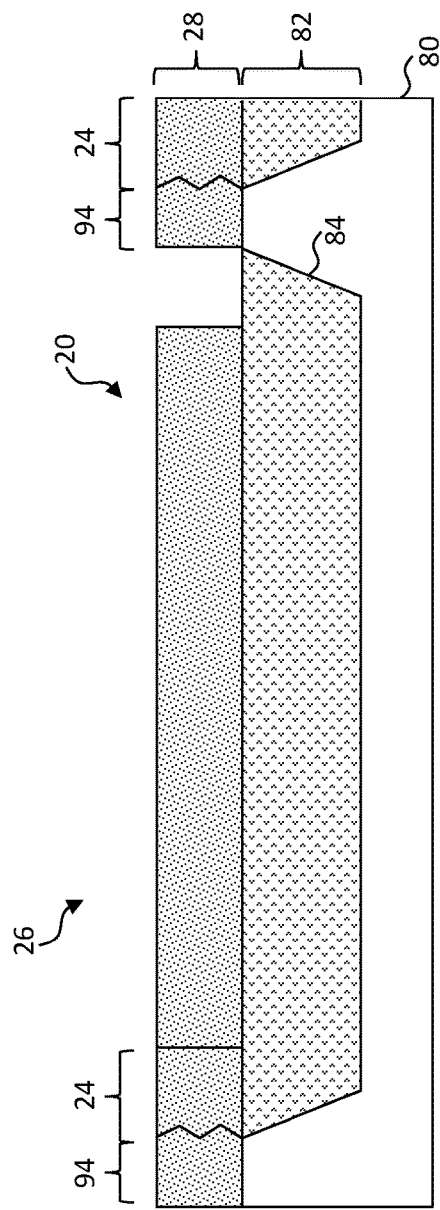
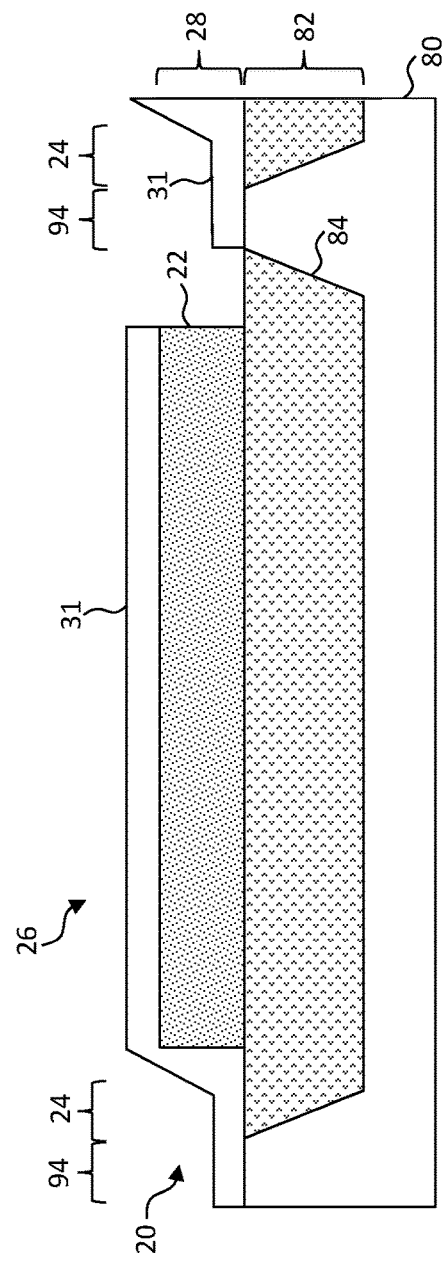
FIG. 2A
FIG. 2B

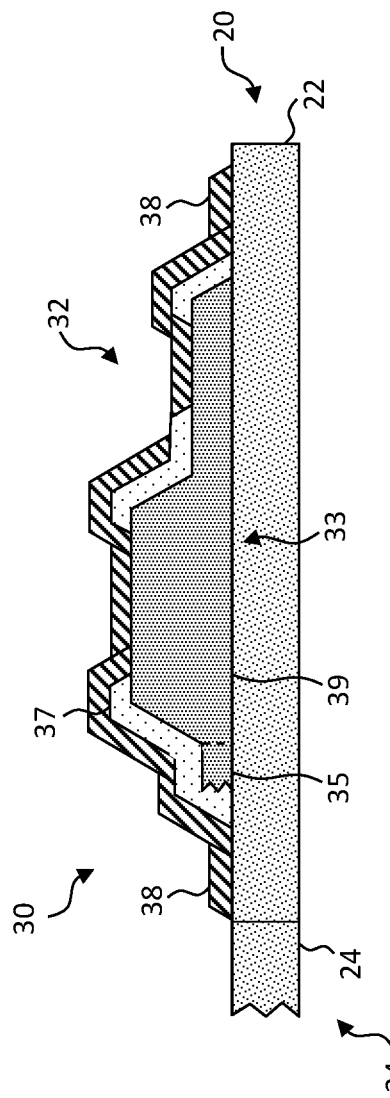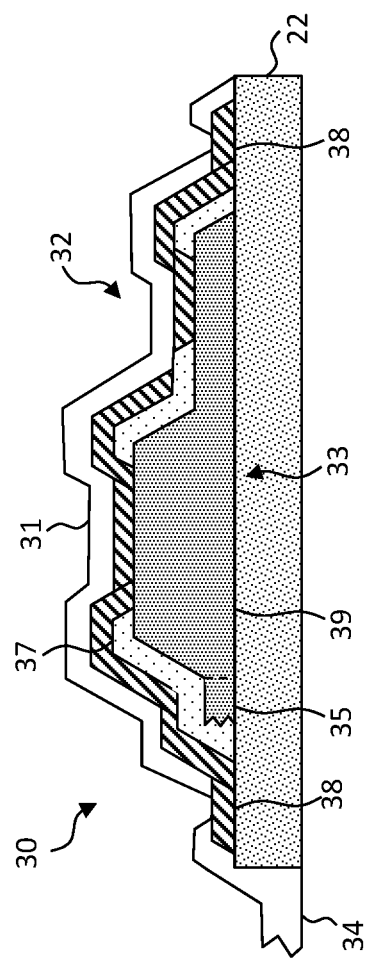
FIG. 4A
FIG. 4B

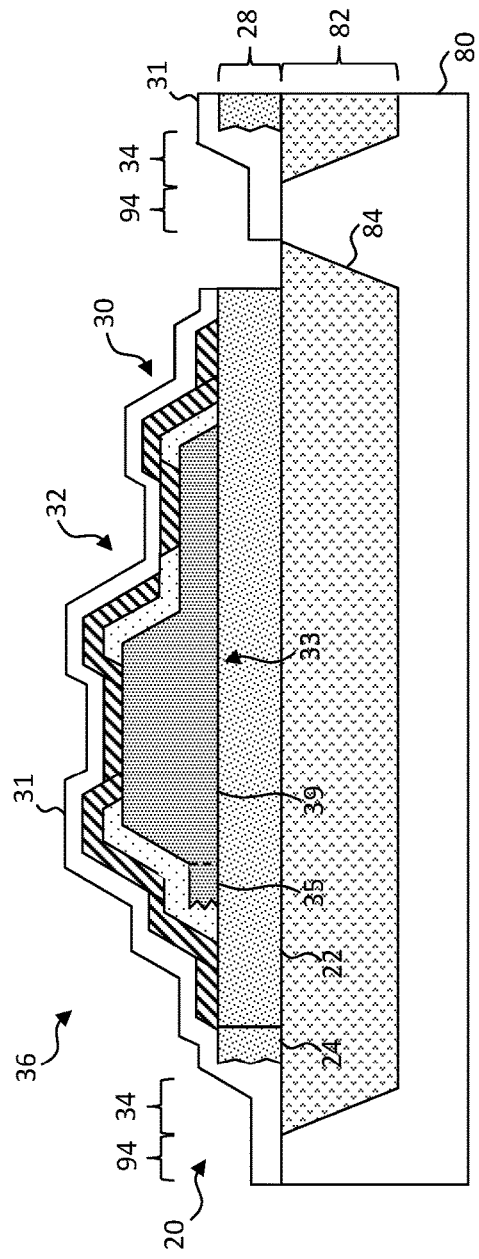
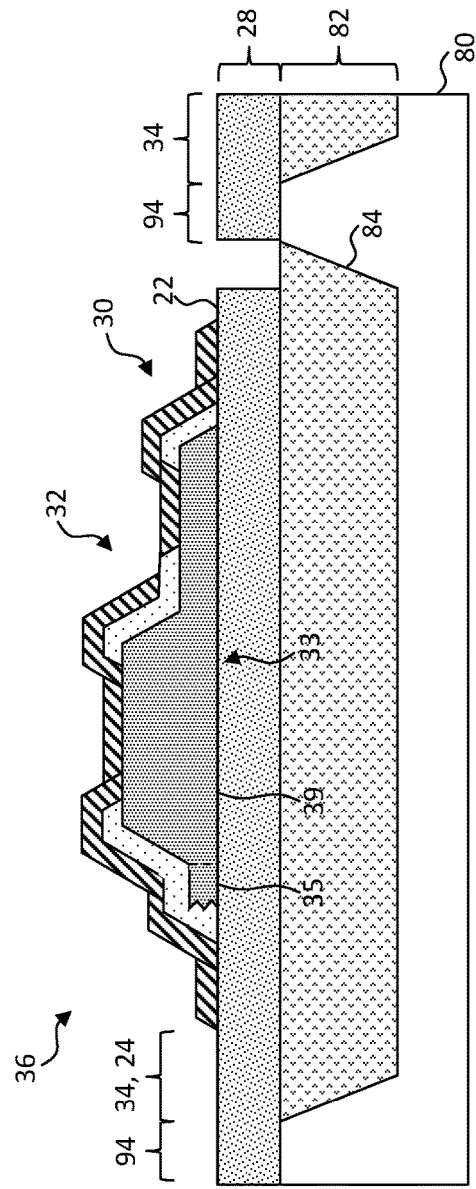
FIG. 5A
FIG. 5B

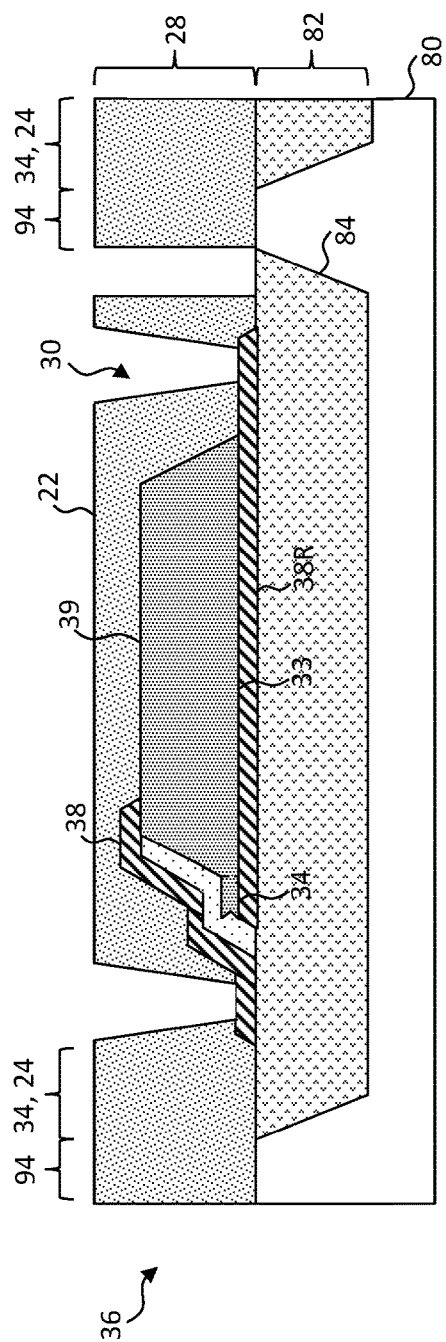
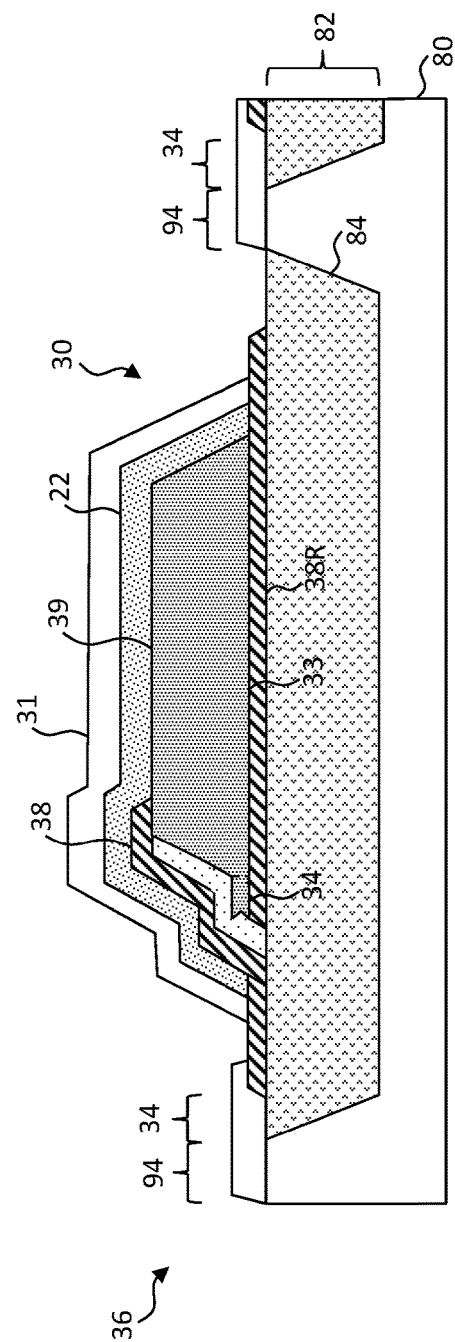
FIG. 6A
FIG. 6B

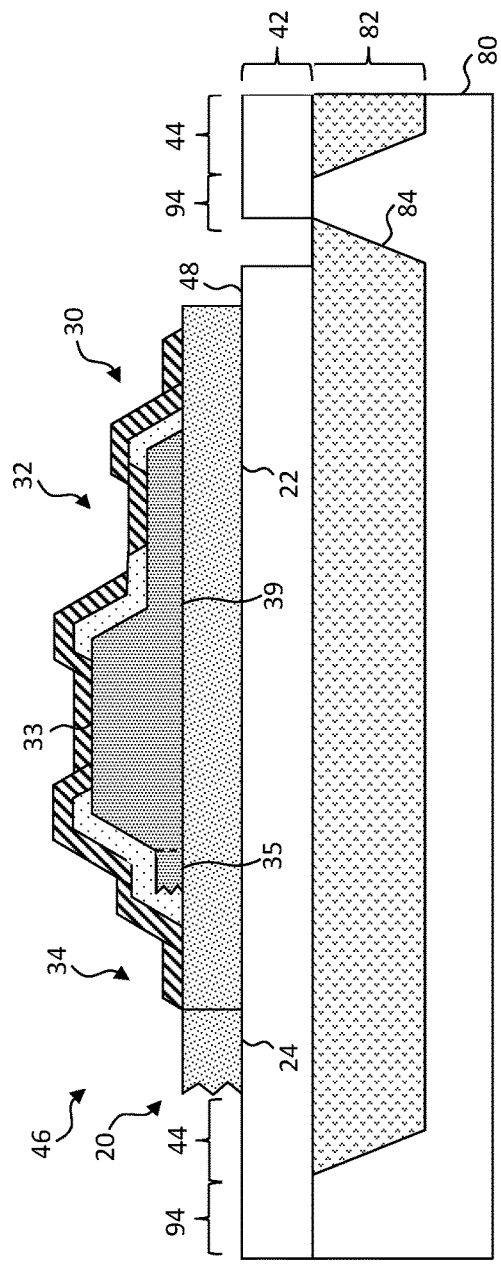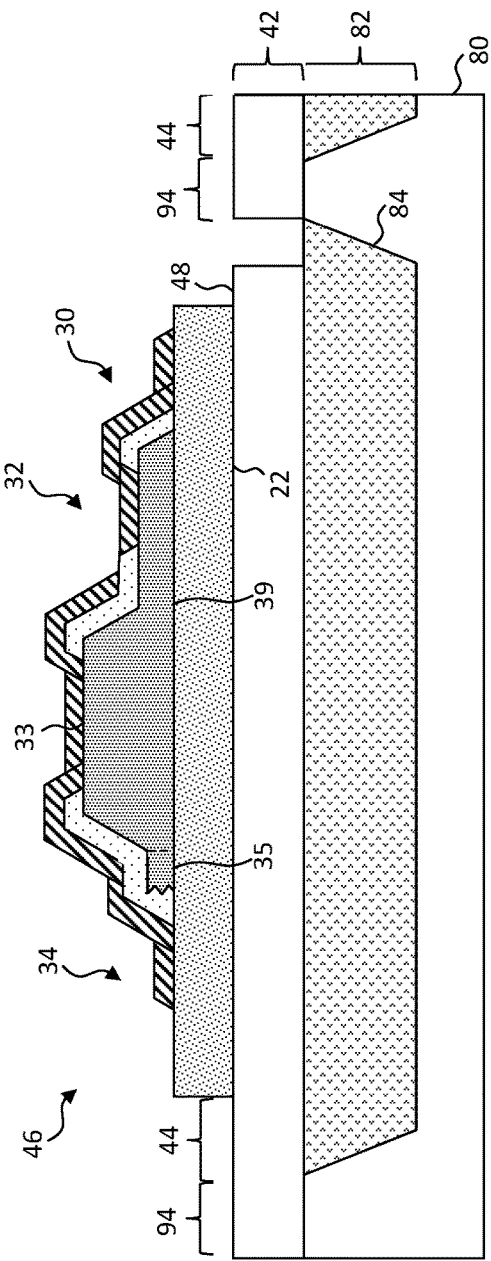
FIG. 9A
FIG. 9B

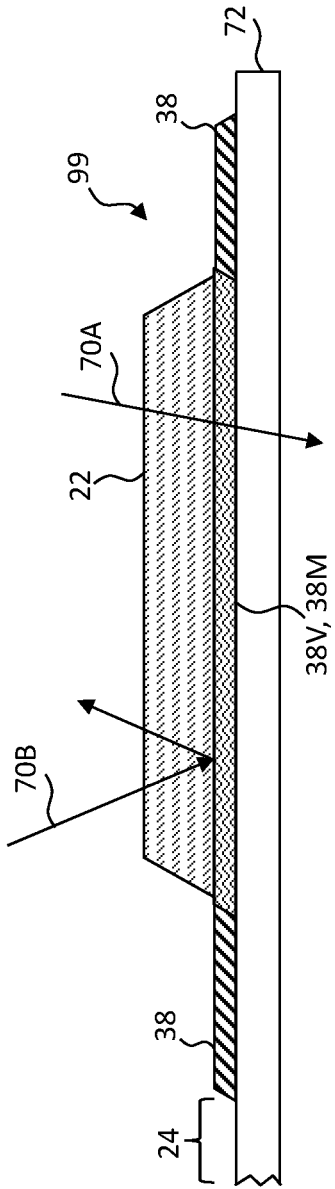
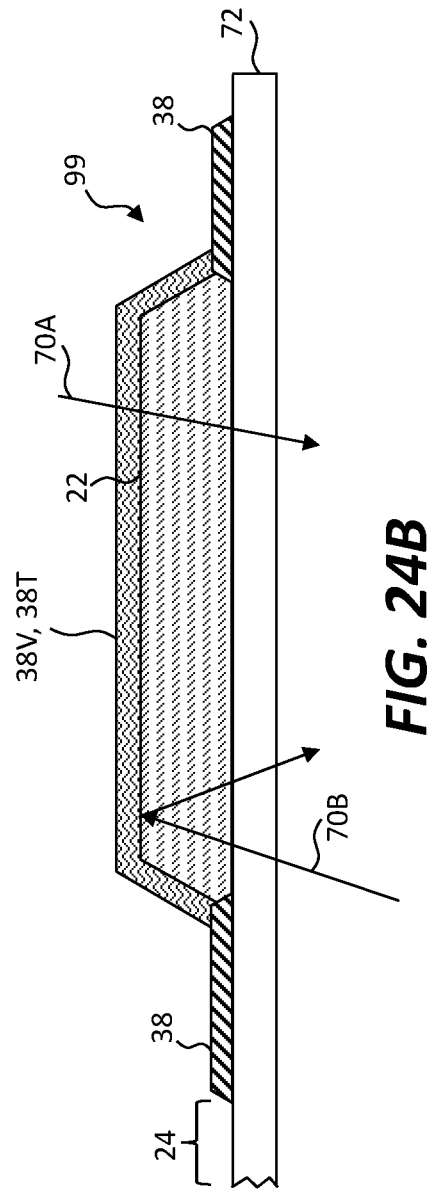

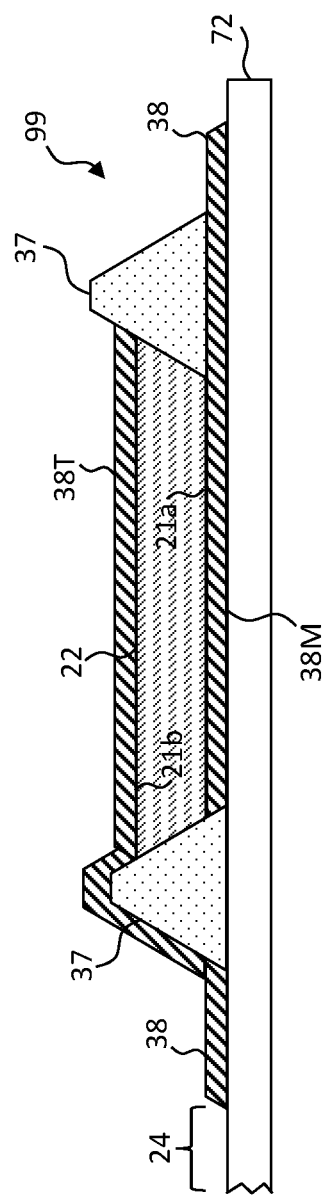

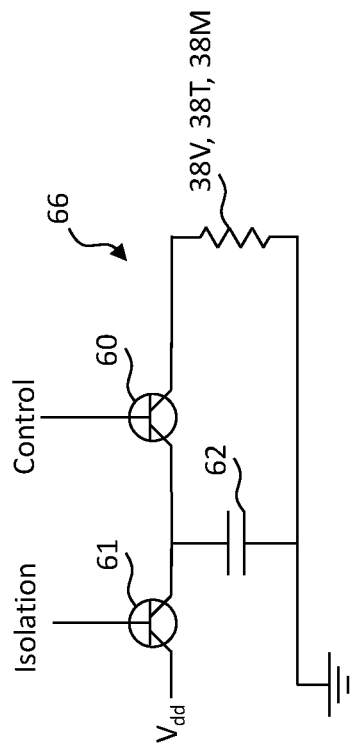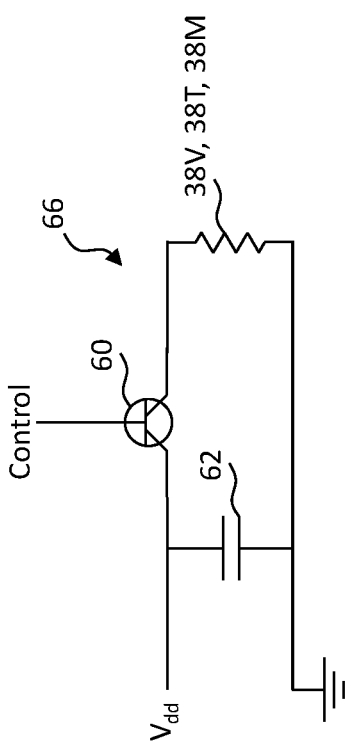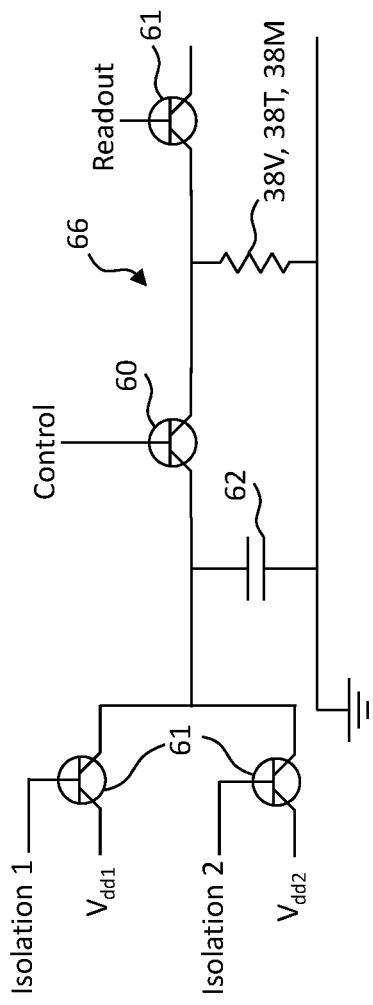
FIG. 26A
FIG. 26B
FIG. 26C

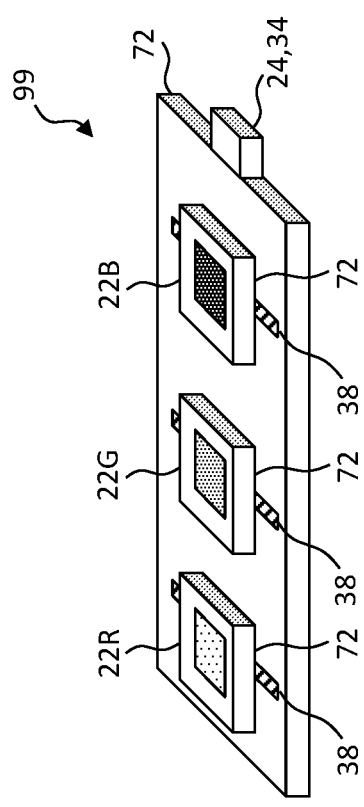
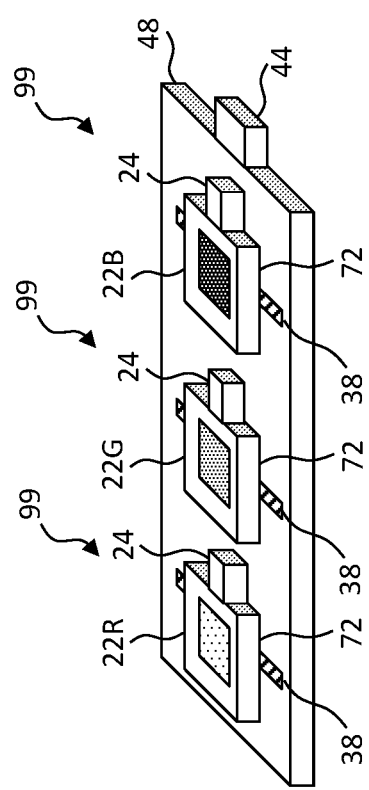
FIG. 27A
FIG. 27B

US 10,522,719 B2

COLOR-FILTER DEVICE

PRIORITY APPLICATIONS

This application is a divisional of U.S. patent application Ser. No. 15/663,437, filed Jul. 28, 2017, entitled Color-Filter Device, which is a continuation-in-part of U.S. patent application Ser. No. 15/461,871, filed Mar. 17, 2017, entitled Micro-Transfer Printed LED and Color Filter Structure which claims the benefit of U.S. Provisional Patent Application No. 62/318,512, filed Apr. 5, 2016, entitled Micro-Transfer Printed LED and Color Filter Structure, the disclosure of each of which is hereby incorporated by reference herein in its entirety.

FIELD OF THE INVENTION

The present invention relates generally to color-filter structures and devices (e.g., micro-transfer printable color-filter devices).

BACKGROUND OF THE INVENTION

Solid-state electrically controlled light emitters are widely used in the display and lighting industries. Displays often use differently colored emitters, and lighting applications require a large color rendering index (CRI). In either case, the efficient production of a variety of colors is important.

Colored light is produced in liquid crystal displays (LCDs) and some organic light-emitting diode (OLED) displays using white-light emitters (such as a backlight) and color filters, for example as taught in U.S. Pat. No. 6,392,340. However, this approach has the disadvantage of wasting much of the white light produced by the back light. In a different approach, light emitters emit a specific desired color. Even in this case, however, improved color gamut can be achieved by combining the light emitters with color filters.

Inorganic displays use arrays of inorganic light emitters, typically light-emitting diodes (LEDs). Because of the variability in LED materials and manufacturing processes, different LEDs, even when made in similar materials, will emit a range of frequencies and groups of LEDs, for example in a display, experience uniformity variations.

Another technique used to provide colored light is color conversion, in which a single kind of light emitter is used to optically stimulate (pump) a second light emitter with light having a first energy (frequency). The second light emitter absorbs the first light and then emits second light having a lower energy (frequency). By choosing a variety of different second light emitters that emit light of different frequencies, a display or a solid-state light device can emit light of different colors. For example, a blue light emitter can be used to emit blue light and to optically pump yellow, red, or green light emitters. U.S. Pat. No. 7,990,058 describes an OLED device with a color-conversion material layer.

Phosphors are often used as color-conversion materials. For example, U.S. Pat. No. 8,450,927 describes an LED lamp using a phosphor and U.S. Pat. No. 7,969,085 discloses a color-change material layer that converts light of a second frequency range higher than a first frequency range to light of the first frequency range. Light-emissive inorganic core/shell nano-particles (quantum dots or QDs) are also used to produce optically pumped or electrically stimulated colored light, for example as taught in U.S. Pat. No. 7,919,342.

Color conversion materials can be deposited and formed in structures similar to those of color filters. Color filters, pigments, phosphors, and quantum dots, however, can be expensive. There remains a need, therefore, for structures and methods that improve manufacturing efficiency and performance uniformity in the production of colored light in a simple and robust structure made with fewer parts and less material.

SUMMARY OF THE INVENTION

The present invention provides light-emitting, filtering, or light-converting structures and displays with reduced costs in robust structures made through efficient manufacturing processes using reduced quantities of materials. In this invention, the term 'color filter' can refer to: (i) A structure that filters light by absorbing at least a portion of some of the frequencies of the light and transmitting at least a portion of some of the frequencies of the light. Typically, the frequency of most of the absorbed light is different from the frequency of most of the transmitted light. Pigments and dyes embedded in a layer of material, such as transparent resin, are often used to form such a structure; and (ii) A structure that changes the frequency of at least some of the light by absorbing and at least a portion of some of the frequencies of the light and emitting light of a different frequency and of a lower energy thereby converting at least some of the light from a higher frequency to a lower frequency. Phosphors and quantum dots are typically embedded in a layer of material, such as a transparent resin and can be used to make a light-conversion structure. Doped or undoped semiconductor crystals can also be used in light-conversion structures. Thus, in this disclosure, the term 'color filter' refers to a structure that filters light or converts light, or both, and can be or include one or more of: a curable resin, a dye, a pigment, a color-conversion material, a semiconductor crystal, a phosphor, and a quantum dot.

In certain embodiments, a micro-transfer printed color-filter structure comprises a color filter and a fractured color-filter tether attached to the color filter. The fractured color-filter tether can include at least some of the same material as the color filter or can include a portion of an encapsulation layer. In related embodiments, a color-filter source wafer comprises a source wafer having a patterned sacrificial layer including sacrificial portions separated by anchors, a patterned color filter layer having a color filter disposed entirely on each sacrificial portion, and one or more color-filter tethers physically connecting each color filter to an anchor. In embodiments, the source wafer is or includes a glass, a polymer, a semiconductor, or silicon, the sacrificial portions are a designated portion of an anisotropically etchable silicon, a selectively etchable material, or a gap between the pixel structure and the source wafer, or any combination of these. In an embodiment, the fractured color-filter tether includes at least some of the same material as the color filter or an encapsulation layer.

In certain embodiments, a method of making a color-filter source wafer comprises providing a source wafer having a patterned sacrificial layer including sacrificial portions separated by anchors, disposing a color filter layer on the wafer, and patterning a color filter entirely on each sacrificial portion. In an embodiment, the sacrificial portion is etched to form one or more color-filter tethers physically connecting each color filter to an anchor. In another embodiment, the color filter is micro-transfer printed from the color-filter source wafer to a destination substrate, such as a display substrate.

In certain embodiments, a micro-transfer printed pixel structure comprises an LED having a light-emitting side, a color filter disposed adjacent to the light-emitting side of the LED, and a fractured pixel tether physically attached to the LED or a fractured pixel tether physically attached to the LED or to the color filter, or both. The fractured pixel tether can include at least some of the same material as the color filter, at least some of the same material as the LED, at least some of the material in an encapsulation layer, or any one or all of these.

In certain embodiments, a pixel structure source wafer comprises a source wafer having a patterned sacrificial layer including sacrificial portions separated by anchors, an LED disposed entirely on or over each sacrificial portion, the LED having a light-emitting side, a color filter disposed adjacent to the light-emitting side of the LED, the color filter disposed entirely on or over each sacrificial portion, and one or more pixel tethers physically connecting each LED or color filter to an anchor. In various embodiments, the source wafer is or includes a glass, a polymer, a semiconductor, or silicon, the sacrificial portions are a designated portion of an anisotropically etchable silicon, a selectively etchable material, or a gap between the pixel structure and the source wafer, or any one of or combination of these. The fractured pixel tether can include at least some of the same material as the color filter, can include at least some of the same material as the LED, can include a portion of an encapsulation layer, or any one or all of these.

In certain embodiments, a method of making a pixel structure source wafer comprises providing a source wafer having a patterned sacrificial layer including sacrificial portions separated by anchors, disposing an LED entirely on or over each sacrificial portion, the LED having a light-emitting side, and providing a color filter adjacent to the light-emitting side of each LED, the color filter disposed entirely on or over each sacrificial portion to form a pixel structure. The color filter can be micro-transfer printed from a color-filter source wafer onto the source wafer entirely over the sacrificial portion and an LED micro-transfer printed from an LED source wafer onto the color filter so that the color filter is disposed adjacent to the light-emitting side of the LED. Alternatively, an LED is micro-transfer printed from an LED source wafer onto the source wafer entirely over the sacrificial portion and a color filter is micro-transfer printed from a color-filter source wafer onto the LED so that the color filter is disposed adjacent to the light-emitting side of the LED. In another embodiment, an LED is micro-transfer printed from an LED source wafer onto the source wafer entirely over the sacrificial portion and a color filter is formed over the LED so that the color filter is disposed adjacent to the light-emitting side of the LED. In yet another embodiment, a color filter is formed on the source wafer entirely over the sacrificial portion and an LED is micro-transfer printed from an LED source wafer onto the color filter so that the color filter is disposed adjacent to the light-emitting side of the LED. In further embodiments, the sacrificial portion is etched to form one or more pixel tethers physically connecting each pixel structure to an anchor or a pixel structure is micro-transfer printed from the pixel structure source wafer to a destination substrate.

In certain embodiments, a micro-transfer printed intermediate structure comprises an intermediate substrate, one or more pixel structures disposed on the intermediate substrate, each pixel structure including an LED having a light-emitting side, a color filter disposed adjacent to the light-emitting side of the LED, and a fractured pixel tether physically attached to the LED or to the color filter, or both, and a fractured intermediate tether physically attached to the intermediate substrate. The intermediate substrate can be or include a glass, a polymer, a semiconductor, or silicon, or any one or any combination of these. The fractured pixel tether can include at least some of the same material as the color filter, at least some of the same material as the LED, at least some of the material in an encapsulation layer, or any one or all of these. The fractured intermediate tether can include at least some of the same material as the color filter, at least some of the same material as the intermediate substrate, at least some of the material in an encapsulation layer, or any one or all of these.

In certain embodiments, an intermediate structure source wafer comprises a source wafer having a patterned sacrificial layer including sacrificial portions separated by anchors, a patterned intermediate substrate layer disposed over the patterned sacrificial layer forming separate and independent intermediate substrates, each intermediate substrate disposed entirely over a sacrificial portion, one or more pixel structures disposed entirely on each intermediate substrate, each pixel structure including an LED, the LED having a light-emitting side, and a color filter disposed adjacent to the light-emitting side of the LED, one or more fractured pixel tethers physically attached to each pixel structure, and a fractured intermediate tether physically attached to the intermediate substrate.

In certain embodiments, the source wafer is or includes a glass, a polymer, a semiconductor, or silicon, the intermediate substrate is or includes a glass, a polymer, a semiconductor, or silicon, the sacrificial portions are a designated portion of an anisotropically etchable silicon, a selectively etchable material, or a gap between the intermediate substrate and the source wafer, or any one or any combination of these. The fractured pixel tether can include at least some of the same material as the color filter, at least some of the same material as the LED, at least some of the material in an encapsulation layer, or any one or all of these. The intermediate tether can include at least some of the same material as the color filter, at least some of the same material as the intermediate substrate, at least some of the material in an encapsulation layer, or any one or all of these. In yet another embodiment, the intermediate tether includes at least some of the same material as the source wafer or the intermediate substrate includes at least a portion of the color filter or the color filter makes up a portion of the intermediate substrate.

In certain embodiments, a method of making an intermediate structure source wafer comprises providing a source wafer having a patterned sacrificial layer including sacrificial portions separated by anchors, disposing an intermediate substrate over the patterned sacrificial layer, and disposing one or more pixel structures on the intermediate substrate entirely on or over each sacrificial portion, each pixel structure including an LED having a light-emitting side, a color filter disposed adjacent to the light-emitting side of the LED, and a fractured pixel tether physically attached to the pixel structure to form an intermediate structure. In an embodiment, each pixel structure is micro-transfer printed as a unit from a pixel structure source wafer onto the intermediate substrate entirely over the sacrificial portion. In another embodiment, one or more pixel structures are disposed on the intermediate substrate entirely on or over each sacrificial portion by micro-transfer printing a color filter from a color-filter source wafer onto the intermediate substrate of the source wafer entirely over the sacrificial portion and micro-transfer printing an LED from an LED source wafer onto the color filter so that the color filter is disposed adjacent to the light-emitting side of the LED. In another embodiment, an LED is micro-transfer printed from an LED source wafer onto the intermediate substrate of the source wafer entirely over the sacrificial portion and a color filter is micro-transfer printed from a color-filter source wafer onto the LED so that the color filter is disposed adjacent to the light-emitting side of the LED. In yet another embodiment, an LED is micro-transfer printed from an LED source wafer onto the source wafer entirely over the sacrificial portion and a color filter is formed over the LED so that the color filter is disposed adjacent to the light-emitting side of the LED. In an alternative embodiment, a color filter is formed on the source wafer entirely over the sacrificial portion and an LED is micro-transfer printed from an LED source wafer onto the color filter so that the color filter is disposed adjacent to the light-emitting side of the LED. In further embodiments, the sacrificial portion is etched to form one or more intermediate tethers physically connecting each intermediate structure to an anchor or an intermediate structure is micro-transfer printed from the intermediate structure source wafer to a destination substrate.

In certain embodiments, an LED display comprises a display substrate and a plurality of pixel structures disposed on the display substrate. Each pixel structure includes one or more LEDs and a color filter corresponding to each LED. Each LED has a light-emitting side and each color filter is disposed adjacent to the light-emitting side of the corresponding LED. In various embodiments, each color filter is located between the display substrate and an LED, each LED is located between the display substrate and a color filter, each LED is a micro-transfer printed LED having a fractured LED tether physically attached to the LED, each color filter is a micro-transfer printed color filter having a fractured color-filter tether physically attached to the color filter, each pixel structure is a micro-transfer printed pixel structure having a fractured pixel tether, or each pixel structure is a micro-transfer printed intermediate structure having a fractured intermediate tether.

In certain embodiments, a method of making an LED display comprises providing a display substrate and disposing a plurality of pixel structures on the display substrate. Each pixel structure includes one or more LEDs, for example inorganic LEDs, and a color filter corresponding to each LED. Each LED has a light-emitting side and each color filter is disposed adjacent to the light-emitting side of the corresponding LED. Each LED can be a micro-transfer printed LED having a fractured LED tether physically attached to the LED. The pixel structure can be disposed on the display substrate by micro-transfer printing a color filter from a color-filter source wafer onto the display substrate and micro-transfer printing an LED from an LED source wafer onto the color filter so that the color filter is disposed adjacent to the light-emitting side of the LED. Alternatively, an LED can be micro-transfer printed from an LED source wafer onto the display substrate and a color filter micro-transfer printed from a color-filter source wafer onto the LED so that the color filter is disposed adjacent to the light-emitting side of the LED. In another embodiment, an LED can be micro-transfer printed from an LED source wafer onto the display substrate and a color filter formed over the LED so that the color filter is disposed adjacent to the light-emitting side of the LED. In yet another embodiment, a color filter is formed on the display substrate and an LED micro-transfer printed from an LED source wafer onto the color filter so that the color filter is disposed adjacent to the light-emitting side of the LED. In an alternative embodiment, a pixel structure is micro-transfer printed from a pixel structure source wafer onto the intermediate substrate of the source wafer entirely over the sacrificial portion. In an embodiment, an intermediate structure is micro-transfer printed from an intermediate structure source wafer onto the display substrate.

In one aspect, the disclosed technology includes a micro-transfer printed color-filter structure, including: a color filter; and a fractured color-filter tether attached to the color filter or layers formed in contact with the color filter.

In certain embodiments, the color filter is or includes one or more of: a curable resin, a dye, a pigment, a color-conversion material, a semiconductor crystal, a phosphor, and a quantum dot.

In certain embodiments, the fractured color-filter tether includes at least some of the same material as the color filter or further comprising an encapsulation layer and wherein the fractured color-filter tether includes at least some of the same material as the encapsulation layer or at least a portion of the encapsulation layer forms the color-filter tether.

In another aspect, the disclosed technology includes a color-filter source wafer, including: a source wafer having a patterned sacrificial layer including sacrificial portions separated by anchors; a patterned color-filter layer including a color filter disposed entirely on or over each sacrificial portion; and one or more color-filter tethers physically connecting each color filter, or layers formed in contact with the color filter, to an anchor.

In certain embodiments, (i) the color filter is or includes one or more of: a curable resin, a dye, a pigment, a color conversion material, a semiconductor crystal, a phosphor, or a quantum dot; (ii) the source wafer is or includes a glass, a polymer, a semiconductor, or silicon; (iii) the sacrificial portions are a designated portion of an anisotropically etchable silicon, a selectively etchable material, or a gap between the color filter and the source wafer; or any one or any combination of (i), (ii), and (iii).

In certain embodiments, the color-filter tether includes at least some of the same material as the color filter or comprising an encapsulation layer encapsulating the color filter and wherein the color-filter tether includes at least some of the same material as the encapsulation layer or at least a portion of the encapsulation layer forms the color-filter tether.

In another aspect, the disclosed technology includes a method of making a color-filter source wafer, including: providing a source wafer having a patterned sacrificial layer including sacrificial portions separated by anchors; disposing a color filter layer on or over the wafer; and patterning a color filter entirely on or over each sacrificial portion.

In certain embodiments, the method includes disposing an encapsulation layer encapsulating the color filter.

In certain embodiments, the method includes etching the sacrificial portion to form one or more color-filter tethers physically connecting each color filter, or layers formed in contact with the color filter, to an anchor.

In certain embodiments, the method includes micro-transfer printing a color filter from the color-filter source wafer to a destination substrate.

In another aspect, the disclosed technology includes a micro-transfer printed pixel structure, including: an LED having a light-emitting side; a color filter disposed adjacent to the light-emitting side of the LED; and a fractured pixel tether physically attached to the LED or layers disposed on or in contact with the LED, or a fractured pixel tether physically attached to the color filter or layers disposed on the color filter.

In certain embodiments, the color filter is or includes one or more of: a curable resin, a dye, a pigment, a color conversion material, a semiconductor crystal, a phosphor, and a quantum dot.

In certain embodiments, the fractured pixel tether includes at least some of the same material as the color filter, wherein the fractured pixel tether includes at least some of the same material as the LED, or both, or comprising an encapsulation layer encapsulating the LED and color filter that forms the fractured pixel tether or the fractured pixel tether is a part of or is attached to the encapsulation layer.

In another aspect, the disclosed technology includes a pixel structure source wafer, including: a source wafer having a patterned sacrificial layer including sacrificial portions separated by anchors; an LED disposed entirely on or over each sacrificial portion, the LED having a light-emitting side; a color filter disposed adjacent to the light-emitting side of the LED, the color filter disposed entirely on or over each sacrificial portion; and one or more pixel tethers physically connecting each LED or color filter to an anchor.

In certain embodiments, (i) the color filter is or includes one or more of: a curable resin, a dye, a pigment, a color conversion material, a semiconductor crystal, a phosphor, or a quantum dot; (ii) the source wafer is or includes a glass, a polymer, a semiconductor, or silicon; (iii) the sacrificial portions are a designated portion of an anisotropically etchable silicon, a selectively etchable material, or a gap between the pixel structure and the source wafer; or any one or any combination of (i), (ii), and (iii).

In certain embodiments, the pixel tether includes at least some of the same material as the color filter or wherein the fractured pixel tether includes at least some of the same material as the LED, or both, or comprising an encapsulation layer encapsulating the color filter and LED and wherein the pixel tether includes at least some of the same material as the encapsulation layer or at least a portion of the encapsulation layer forms the pixel tether or the pixel tether is a part of or is attached to the encapsulation layer.

In another aspect, the disclosed technology includes a method of making a pixel structure source wafer, including: providing a source wafer having a patterned sacrificial layer including sacrificial portions separated by anchors; disposing an LED entirely on or over each sacrificial portion, the LED having a light-emitting side; and disposing a color filter adjacent to the light-emitting side of each LED, the color filter disposed entirely on or over each sacrificial portion to form a pixel structure.

In certain embodiments, the method includes (i) micro-transfer printing a color filter from a color-filter source wafer onto the source wafer entirely over the sacrificial portion and micro-transfer printing an LED from an LED source wafer onto the color filter so that the color filter is disposed adjacent to the light-emitting side of the LED; (ii) micro-transfer printing an LED from an LED source wafer onto the source wafer entirely over the sacrificial portion and dispose a color filter from a color-filter source wafer onto the LED so that the color filter is disposed adjacent to the light-emitting side of the LED; (iii) micro-transfer printing an LED from an LED source wafer onto the source wafer entirely over the sacrificial portion and forming a color filter over the LED so that the color filter is disposed adjacent to the light-emitting side of the LED; (iv) forming a color filter on the source wafer entirely over the sacrificial portion and micro-transfer printing an LED from an LED source wafer onto the color filter so that the color filter is disposed adjacent to the light-emitting side of the LED; or (v) encapsulating the LED and color filter with an encapsulation layer, the encapsulation layer forming a part of the pixel tether or the pixel tether including material from the encapsulation layer.

In certain embodiments, the method includes etching the sacrificial portion to form one or more pixel tethers physically connecting each pixel structure to an anchor.

In certain embodiments, the method includes micro-transfer printing a pixel structure from the pixel structure source wafer to a destination substrate.

In another aspect, the disclosed technology includes a micro-transfer printed intermediate structure, including: an intermediate substrate; one or more pixel structures disposed on or over the intermediate substrate, each pixel structure including an LED having a light-emitting side, a color filter disposed adjacent to the light-emitting side of the LED, and a fractured pixel tether physically attached to the pixel structure; and a fractured intermediate tether physically attached to the intermediate substrate or physically attached to a layer disposed on the intermediate substrate.

In certain embodiments, (i) the color filter is or includes one or more of: a curable resin, a dye, a pigment, a color conversion material, a semiconductor crystal, a phosphor, or a quantum dot; (ii) the intermediate substrate is or includes a glass, a polymer, a semiconductor, or silicon; or any one or any combination of (i), and (ii).

In certain embodiments, the fractured pixel tether includes at least some of the same material as the color filter or wherein the fractured pixel tether includes at least some of the same material as the LED, or both, or comprising an encapsulation layer encapsulating the color filter and LED and wherein the pixel tether includes at least some of the same material as the encapsulation layer or at least a portion of the encapsulation layer forms the pixel tether or the pixel tether is a part of or is attached to the encapsulation layer.

In certain embodiments, the fractured intermediate tether includes at least some of the same material as the color filter or wherein the fractured intermediate tether includes at least some of the same material as the intermediate substrate, or both, or comprising an encapsulation layer encapsulating the color filter and LED and wherein the intermediate tether includes at least some of the same material as the encapsulation layer or at least a portion of the encapsulation layer forms the intermediate tether or the intermediate tether is a part of or is attached to the encapsulation layer.

In another aspect, the disclosed technology includes an intermediate structure source wafer, including: a source wafer having a patterned sacrificial layer including sacrificial portions separated by anchors; a patterned intermediate substrate layer disposed on or over the patterned sacrificial layer forming separate and independent intermediate substrates, each intermediate substrate disposed entirely over a sacrificial portion; one or more pixel structures disposed entirely on each intermediate substrate, each pixel structure including an LED, the LED having a light-emitting side, and a color filter disposed adjacent to the light-emitting side of the LED; one or more fractured pixel tethers physically attached to each pixel structure; and an intermediate tether physically attached to the intermediate substrate or a layer on the intermediate substrate.

In certain embodiments, (i) the color filter is or includes one or more of: a curable resin, a dye, a pigment, a color conversion material, a semiconductor crystal, a phosphor, or a quantum dot; (ii) the source wafer is or includes a glass, a polymer, a semiconductor, or silicon; (iii) the intermediate substrate is or includes a glass, a polymer, a semiconductor, or silicon; (iv) the sacrificial portions are a designated portion of an anisotropically etchable silicon, a selectively etchable material, or a gap between the intermediate substrate and the source wafer; or any one or any combination of (i), (ii), (iii) and (iv).

In certain embodiments, the fractured pixel tether includes at least some of the same material as the color filter or wherein the fractured pixel tether includes at least some of the same material as the LED, or both, or comprising an encapsulation layer encapsulating the color filter and LED and wherein the pixel tether includes at least some of the same material as the encapsulation layer or at least a portion of the encapsulation layer forms the pixel tether or the pixel tether is a part of or is attached to the encapsulation layer.

In certain embodiments, the intermediate tether includes at least some of the same material as the color filter, wherein the intermediate tether includes at least some of the same material as the intermediate substrate, or wherein the intermediate tether includes at least some of the same material as the source wafer, or comprising an encapsulation layer encapsulating the color filter and LED and wherein the intermediate tether includes at least some of the same material as the encapsulation layer or at least a portion of the encapsulation layer forms the intermediate tether or the intermediate tether is a part of or is attached to the encapsulation layer.

In certain embodiments, the intermediate substrate includes at least a portion of the color filter or the color filter makes up a portion of the intermediate substrate.

In another aspect, the disclosed technology includes a method of making an intermediate structure source wafer, including: providing a source wafer having a patterned sacrificial layer including sacrificial portions separated by anchors; disposing an intermediate substrate over the patterned sacrificial layer; and disposing one or more pixel structures on the intermediate substrate entirely on or over each sacrificial portion, each pixel structure including an LED having a light-emitting side, and a color filter disposed adjacent to the light-emitting side of the LED, and a fractured pixel tether physically attached to the pixel structure to form an intermediate structure.

In certain embodiments, the method includes disposing one or more pixel structures on the intermediate substrate entirely on or over each sacrificial portion by: (i) micro-transfer printing a color filter from a color-filter source wafer onto the intermediate substrate of the source wafer entirely over the sacrificial portion and micro-transfer printing an LED from an LED source wafer onto the color filter so that the color filter is disposed adjacent to the light-emitting side of the LED; (ii) micro-transfer printing an LED from an LED source wafer onto the intermediate substrate of the source wafer entirely over the sacrificial portion and micro-transfer printing a color filter from a color-filter source wafer onto the LED so that the color filter is disposed adjacent to the light-emitting side of the LED; (iii) micro-transfer printing an LED from an LED source wafer onto the source wafer entirely over the sacrificial portion and forming a color filter over the LED so that the color filter is disposed adjacent to the light-emitting side of the LED; (iv) forming a color filter on the source wafer entirely over the sacrificial portion and micro-transfer printing an LED from an LED source wafer onto the color filter so that the color filter is disposed adjacent to the light-emitting side of the LED; or (v) micro-transfer printing a pixel structure from a pixel structure source wafer onto the intermediate substrate of the source wafer entirely over the sacrificial portion.

In certain embodiments, the method includes etching the sacrificial portion to form one or more intermediate tethers physically connecting each intermediate structure to an anchor.

In certain embodiments, the method includes micro-transfer printing an intermediate structure from the intermediate structure source wafer to a destination substrate.

In another aspect, the disclosed technology includes an LED display, including: a display substrate; and a plurality of pixel structures disposed on the display substrate, each pixel structure including one or more LEDs, each LED having a light-emitting side, and a color filter corresponding to each LED, each color filter disposed adjacent to the light-emitting side of the corresponding LED.

In certain embodiments, each color filter is located between the display substrate and an LED.

In certain embodiments, each LED is located between the display substrate and a color filter.

In certain embodiments, each LED is a micro-transfer printed LED and a fractured LED tether is physically attached to the LED.

In certain embodiments, each color filter is a micro-transfer printed color filter and a fractured color-filter tether is physically attached to the color filter.

In certain embodiments, each pixel structure is a micro-transfer printed pixel structure having a fractured pixel tether.

In certain embodiments, each pixel structure is part of an intermediate structure having a fractured intermediate tether.

In another aspect, the disclosed technology includes a method of making an LED display, including: providing a display substrate; and disposing a plurality of pixel structures on the display substrate, each pixel structure including one or more LEDs, each LED having a light-emitting side, and a color filter corresponding to each LED, each color filter disposed adjacent to the light-emitting side of the corresponding LED.

In certain embodiments, each LED is a micro-transfer printed LED having a fractured LED tether physically attached to the LED or layers on, over, or in contact with the LED.

In certain embodiments, the method includes disposing a pixel structure on the display substrate by: (i) micro-transfer printing a color filter from a color-filter source wafer onto the display substrate and micro-transfer printing an LED from an LED source wafer onto the color filter so that the color filter is disposed adjacent to the light-emitting side of the LED; (ii) micro-transfer printing an LED from an LED source wafer onto the display substrate and micro-transfer printing a color filter from a color-filter source wafer onto the LED so that the color filter is disposed adjacent to the light-emitting side of the LED; (iii) micro-transfer printing an LED from an LED source wafer onto the display substrate and forming a color filter over the LED so that the color filter is disposed adjacent to the light-emitting side of the LED; (iv) forming a color filter on the display substrate and micro-transfer printing an LED from an LED source wafer onto the color filter so that the color filter is disposed adjacent to the light-emitting side of the LED; (v) micro-transfer printing a pixel structure from a pixel structure source wafer onto the intermediate substrate of the source wafer entirely over the sacrificial portion; or (vi) micro-transfer printing an intermediate structure from an intermediate structure source wafer onto the display substrate.

In some embodiments of the present invention, a color-filter device comprises a color filter, an electrical conductor disposed in contact with the color filter, and at least a portion of a color-filter tether attached to the color filter or structures formed in contact with or supporting the color filter. The color filter is a variable color filter and can be electrically controlled. The color filter can be or include one or more of: a phase-change material, an electrically controlled ink, a gel, a photonic crystal, or a matrix of photonic crystals. The color-filter material can be a phase-change material that can be controlled to switch from an amorphous state to a crystalline state or from a crystalline state to an amorphous state. Each of the amorphous state and a crystalline state can have a different optical attribute, such as color.

The electrical conductor can be a resistor that heats the color filter in response to an electrical current passed through the resistor and the color filter can change the color of light filtered by the color filter in response to heat. The electrical conductor can be substantially reflective or transparent and be or comprise a metal or metal alloy.

The color filter can be conductive and generate heat in response to an electrical current. The resulting heat can change the state of the color filter between an amorphous state or a crystalline state and thereby change the color of the color filter.

The color filter can have a first side and a second side opposed to the first side, the electrical conductor can be a first electrode disposed on and in direct contact with the first side of the color filter, and can comprise a second electrode disposed on and in direct contact with the second side of the color filter. The color filter can change the color of light filtered by the color filter in response to an electrical current, in response to a voltage difference provided between the first and second electrodes, or in response to an electrical field provided between the first and second electrodes.

The color filter can be a reflective color filter or a transmissive color filter.

The color-filter device can comprise a color-filter substrate on or in which the color filters and electrical conductor(s) are disposed. The color-filter substrate can be a semiconductor and can include circuitry such as control circuitry. In some embodiments, the color-filter substrate is a dielectric, such as silicon dioxide or silicon nitride.

In some embodiments, the color-filter device comprises a capacitor and a switch forming a control circuit, the switch controllably connecting the capacitor to the electrical conductor. The color-filter device can include a color-filter substrate and the switch and the capacitor can form a control circuit that is disposed on or formed in the color-filter substrate and can be located under the color filter.

In some embodiments, the capacitor is charged from an external power source to a voltage appropriate for color filter material state change. Once the capacitor is charged, the switch is used to connect the capacitor to the color filter and current passes from the capacitor to the color filter. The color filter is thereby heated in a controlled manner and the state of the color filter is changed. Different capacitor initialization voltages result in different state changes.

In some embodiments, the color-filter device comprises a plurality of color filters. In some embodiments, each color filter of the plurality of color filters has an electrically separate electrical conductor disposed in contact with the color filter. The color of light filtered by each color filter of the plurality of color filters can be a different color of light from the color of light filtered by other color filters of the plurality of color filters. Each color-filter device can include a corresponding control circuit to control each color filter or a color-filter device can include multiple color filters that each have a corresponding control circuit. The color filters can be stacked or provided adjacent to each other on the surface of a color-filter substrate. In some embodiments, multiple color-filter devices, each with a color-filter tether, are stacked or provided adjacent to each other on the surface of an intermediate substrate or a destination substrate. In some embodiments, the intermediate substrate can have an intermediate tether and can be micro-transfer printed.

In some embodiments of the present invention, the color filters can include color-filter tethers that are broken by pressure from a micro-transfer stamp when the color filters are micro-transfer printed from a source wafer to a destination substrate such as an intermediate substrate or display substrate by the micro-transfer stamp. Similarly, the color-filter devices can include intermediate tethers that are broken when the devices are micro-transfer printed from a source wafer to a destination substrate such as a display substrate by the micro-transfer stamp. The color-filter devices can be pixels and the color-filter devices can be matrix-address-controlled in a display on a display substrate.

In some embodiments, a color-filter device wafer comprises a wafer having a wafer substrate, the wafer substrate comprising a patterned sacrificial layer including sacrificial portions separated by anchors. A color-filter device is disposed entirely over each sacrificial portion. In some embodiments, a plurality of color filters or color-filter devices are disposed entirely over each sacrificial portion, each color filter of the plurality of color filters having an electrically separate electrical conductor disposed in contact with the color filter, wherein the color of light filtered by each color filter of the plurality of color filters is a different color of light from the color of light filtered by other color filters of the plurality of color filters.

In some embodiments, a color-filter device display comprises a display substrate, a plurality of color-filter devices disposed on the display substrate, wherein each color-filter devices comprises a plurality of color filters, each color filter of the plurality of color filters has an electrically separate electrical conductor disposed in contact with the color filter, and wherein the color of light filtered by each color filter of the plurality of color filters is a different color of light from the color of light filtered by other color filters of the plurality of color filters.

In some embodiments, the color-filter device display comprises a plurality of device substrates, each color-filter device disposed on a device substrate. Each color-filter device can be a pixel.

A method of making a color-filter device display comprises providing a color-filter device source wafer, providing a display substrate, and micro-transfer printing the color-filter devices of the color-filter device source wafer from the color-filter device source wafer to the display substrate. In some embodiments, a capacitor or switch, or both, is micro-transfer printed to the display substrate in correspondence with each color-filter device or a capacitor or switch, or both, is micro-transfer printed to each of the color-filter devices on the color-filter device wafer.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 1A and 1B are cross sections of alternative color filter embodiments of the present invention;

FIGS. 2A and 2B are cross sections of alternative color-filter source wafer embodiments of the present invention corresponding to FIGS. 1A and 1B;

FIGS. 4A and 4B are cross sections of pixel structures including an LED and a color filter in embodiments of the present invention;

FIGS. 5A and 5B are cross sections of alternative pixel structure source wafer embodiments of the present invention corresponding to FIGS. 4B and 4A;

FIGS. 6A, 6B, and 6C are cross sections of alternative pixel structure source wafer embodiments of the present invention;

FIGS. 9A and 9B are cross sections of intermediate structure source wafer embodiments of the present invention corresponding to FIGS. 8A and 8B;

FIGS. 24A, 24B, and 25 are cross sections of illustrative embodiments of the present invention that include one or more electrodes;

FIGS. 26A, 26B, and 26C are control circuit diagrams according to illustrative embodiments of the present invention;

FIGS. 27A and 27B are perspectives according to illustrative embodiments of the present invention;

Figure 3:
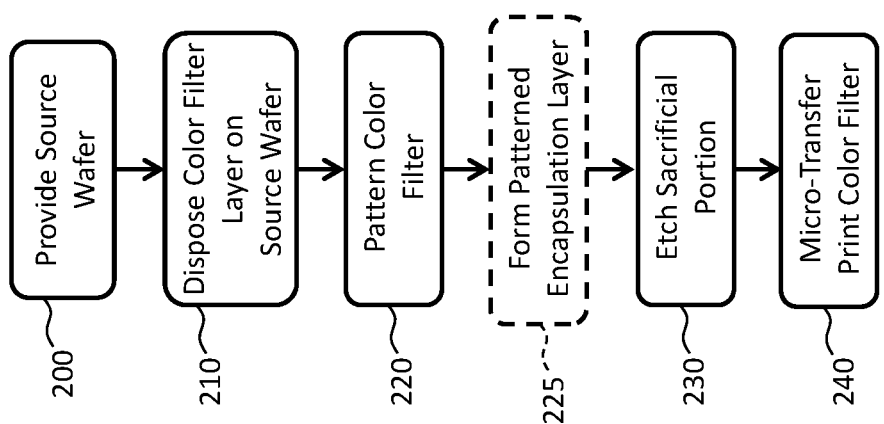
FIG. 3 is a flow chart in accordance with embodiments of the present invention corresponding to FIGS. 1 and 2.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Embodiments of the present invention provide methods and structures for integrating color filters and light-emitting diodes (LEDs) in displays, for example inorganic light-emitting diodes. The methods and structures are suitable for micro-transfer printing and reduce the amount of color-filter material used and, in some embodiments, the number of patterning steps required.

In this disclosure, the term 'color filter' refers to a structure that changes the nature or color of light that passes through the color filter. For example, the term 'color filter' can refer to a structure that filters light by absorbing at least a portion of some of the frequencies of the light and transmitting at least a portion of some of the frequencies of the light. Typically, the frequency of the majority of the absorbed light is different from the frequency of the majority of the transmitted light. Pigments and dyes embedded in a layer of material, such as transparent resin, are typically used to form such a structure. In this invention, the term 'color filter' can also refer to a structure that changes the frequency of at least some of the light by converting at least a portion of some of the frequencies of the light to light of a different frequency and of a lower energy. Phosphors and quantum dots embedded in a layer of material, such as a transparent resin, such as a curable resin, for example, curable by exposure to heat or electromagnetic radiation, can provide such a structure. Thus, in this disclosure, the term 'color filter' refers to a structure that filters light or converts light, or both, and can be or include one or more of: a curable resin, a dye, a pigment, a color-conversion material, a semiconductor crystal, a phosphor, and a quantum dot.

Various embodiments of the present invention can include micro-transfer printable structures, source wafers on or in which micro-transfer printable structures are made, destination substrates on which micro-transfer printable structures are micro-transfer printed, or methods of making the micro-transfer printable structures, source wafers, or destination substrates. As used herein, a source wafer is a wafer from which devices or structures formed on or in the source wafer are micro-transfer printed to a destination wafer.

Color Filter

In certain embodiments of the present invention and referring to FIGS. 1A and 1B, a micro-transfer printed color-filter structure 20 comprises a color filter 22 and a fractured color-filter tether 24 physically attached to the color filter 22. A fractured tether is a tether that is broken, fractured, or cracked by pressure from a transfer stamp in the process of micro-transfer printing. A tether physically attached to an element is a tether that is attached to the element or physically attached to one or more single or multiple layers, structures, multi-layers, or multi-component structures over, on, or in contact with or supporting or protecting the element. As shown in FIG. 1A, the fractured color-filter tether 24 can include at least some of the same material as the color filter 22. In an embodiment, the fractured color-filter tether 24 and the color filter 22 are part of a common color-filter layer 28. The fractured color-filter tether 24 is a portion of the color-filter layer 28 and the color filter 22 is a portion of the color-filter layer 28 separate from the fractured color-filter tether 24. Alternatively, as shown in FIG. 1B, the color-filter structure 20 includes an encapsulation layer 31 that also forms the color-filter tether 24. The color-filter tether 24 can have a thickness that is thinner than the color filter 22. The micro-transfer printed color-filter structure 20 can be a resin or polymer, for example a cured resin or polymer cured by heat or electromagnetic radiation, impregnated with color-filter materials such as dyes, pigments, phosphors, or quantum dots. The encapsulation layer 31 can be an oxide such as silicon dioxide or a nitride such as silicon nitride.

Referring to FIGS. 2A and 2B in a related embodiment, a color-filter source wafer 26 comprises a source wafer 80 having a patterned sacrificial layer 82 including sacrificial portions 84 separated by anchors 94. The source wafer 80 can be a semiconductor, silicon, glass, plastic, resin, or polymer substrate or wafer and can include layers formed on a substrate. The sacrificial portions 84 can be a designated portion of an anisotropically etchable silicon or a selectively etchable material and the anchors 94 include portions of the source wafer 80 between the sacrificial portions 84. The color-filter layer 28 can include patterned color-filter material disposed on the patterned sacrificial layer 82 that form color filters 22 disposed entirely on each sacrificial portion 84 and provides an opening over each sacrificial portion 84. The anchor 94 can include portions of the color-filter layer 28 physically connected to the color-filter tethers 24. The color-filter layer 28 can include a cured photo-curable material.

As shown in FIG. 2A, one or more color-filter tethers 24 physically connect each color filter 22 to an anchor 94 and physically connects each color filter 22 to an anchor 94. The color-filter tether 24 can include at least some of the same material as the color filter 22 and can be part of a common color-filter layer 28. As shown in FIG. 2B, an encapsulation layer 31 encapsulates the color filter 22. A portion of the encapsulation layer 31 forms at least a part of the color-filter tether 24. The encapsulation layer 31 can be an oxide such as silicon dioxide or a nitride such as silicon nitride deposited and patterned using photolithographic processes.

Referring also to FIG. 3, a method of making a color-filter source wafer 26 according to embodiments of the present invention comprises providing a source wafer 80 having a patterned sacrificial layer 82 including sacrificial portions 84 separated by anchors 94 in step 200, disposing a color-filter layer 28 on the source wafer 80 in step 210, and patterning a color filter 22 entirely on each sacrificial portion 84 in step 220. For example, the color-filter layer 28 can be disposed on the patterned sacrificial layer 82 in step 210 by coating, for example, spin coating or curtain coating, and patterned in step 220 by exposing the color-filter layer 28 to electromagnetic energy (for example, ultra-violet light) through a patterned mask and washing away the uncured (unexposed) photo-curable material. Optionally, an encapsulation layer 31 is deposited, for example by sputtering or evaporation, and patterned in step 225, using photolithographic methods and materials. In step 230, in an embodiment, the sacrificial portion 84 is etched to form one or more color-filter tethers 24 physically connecting each color filter 22 to an anchor 94. Etching can be accomplished, for example, by exposing the sacrificial portion 84 to an acid that selectively etches the sacrificial portion 84 material or anisotropically etches the sacrificial portion 84 in preference to the anchors 94. In step 240, a color filter 22 is micro-transfer printed from the color-filter source wafer 26 to a destination substrate, such as a display substrate, by pressing a stamp, such as a PDMS stamp against the color-filter structure 20 to fracture the color-filter tether 24, adhere the color-filter structure 20 to the stamp, transport the stamp and the color-filter structure 20 to the destination substrate and adhere the color-filter structure 20 to the destination substrate, and remove the stamp. The destination substrate can include an adhesive layer that is then cured to permanently adhere the color-filter structure 20 to the destination substrate.

LED with Color Filter

In another embodiment of the present invention and referring to FIGS. 4A and 4B, a micro-transfer printed pixel structure 30 comprises a light-emitting diode (LED) 33 having a light-emitting side 39, a color filter 22 disposed adjacent to the light-emitting side 39 of the LED 33, and a fractured pixel tether 34 physically attached to the LED 33 or a fractured pixel tether 34 physically attached to the LED 33 and to the color filter 22 or layers disposed on the LED 33 or color filter 22. A color filter 22 is adjacent to the light-emitting side 39 of the LED 33 if it is closer to the light-emitting side 39 of the LED 33 than any other side of the LED 33 and if it is located in optical association with LED 33 to absorb or transmit light emitted by the LED 33. A color filter 22 can be in contact with, formed on, or adhered to an LED 33 and can be physically located within 0 to 250 microns of the LED 33. The color filter 22 can be formed in a layer that is essentially planar or has opposing planar surfaces. The color filter 22 can be a semiconductor crystal structure.

In a further embodiment of the present invention, the LED 33 is a part of an LED structure 32 that includes a fractured LED tether 35 disposed, for example, by micro-transfer printing the LED 33 from an LED source wafer onto the color filter 22. The LED structure 32 can include patterned dielectric structures 37 that electrically isolate portions of the LED 33 and expose other portions of the LED 33 that are electrically connected to electrodes 38. The electrodes 38 can provide electrical power to the LED 33 to cause the LED 33 to emit light, for example through the light-emitting side 39 and through the color filter 22, so that the LED structure 32 emits color-filtered light.

The fractured pixel tether 34 can be the fractured color-filter tether 24 and can include at least some of the same material as the color filter 22, as shown in FIG. 4A. The color filter 22 and the color-filter tether 24 can be a color-filter structure 20. Alternatively, as shown in FIG. 4B, an encapsulation layer 31 can encapsulate the LED 33 and color filter 22 and form a part of the fractured pixel tether 34 or the fractured pixel tether 34 can be a part of or attached to the encapsulation layer 31. In another embodiment, not shown, the color filter 22 is attached to a color-filter tether 24 (as in FIG. 4A) and an encapsulation layer 31 encapsulates the LED 33, the color filter 22, and the color-filter tether 24 and also forms a part of the fractured pixel tether 34 or the fractured pixel tether 34 can be a part of or attached to the encapsulation layer 31 (i.e., the encapsulation layer 31 of FIG. 4B is applied to the structure of FIG. 4A, see FIG. 5A described below).

Referring also to FIGS. 5A and 5B, in certain embodiments of the present invention, a pixel structure source wafer 36 comprises a source wafer 80 having a patterned sacrificial layer 82 including sacrificial portions 84 separated by anchors 94. An LED 33 is disposed entirely on or over each sacrificial portion 84. The LED 33 has a light-emitting side 39. A color filter 22 is disposed adjacent to the light-emitting side 39 of the LED 33 and is disposed entirely on or over each sacrificial portion 84. One or more pixel tethers 34 physically connects each LED 33 or color filter 22 to an anchor 94. In the embodiment of FIG. 5A, an encapsulation layer 31 encapsulates the LED 33 and color filter 22 and forms at least a portion of the pixel tether 34 and the color-filter structure 20 includes a color-filter tether 24 in the color-filter layer 28. The pixel tether 34 can be thinner than the color-filter structure 20 to facilitate fracturing. The encapsulation layer 31 can be an oxide such as silicon dioxide or a nitride such as silicon nitride deposited and patterned using photolithographic processes. In the embodiment of FIG. 5B, the color-filter layer 28 forms at least a portion of the pixel tether 34. In various embodiments, the source wafer 80 is or includes a glass, a polymer, a semiconductor, or silicon. The sacrificial portions 84 can be a designated portion of an anisotropically etchable silicon or a selectively etchable material, or any one of or combination of these. The fractured pixel tether 34 can include at least some of the same material as the color filter 22.

Figure 7:
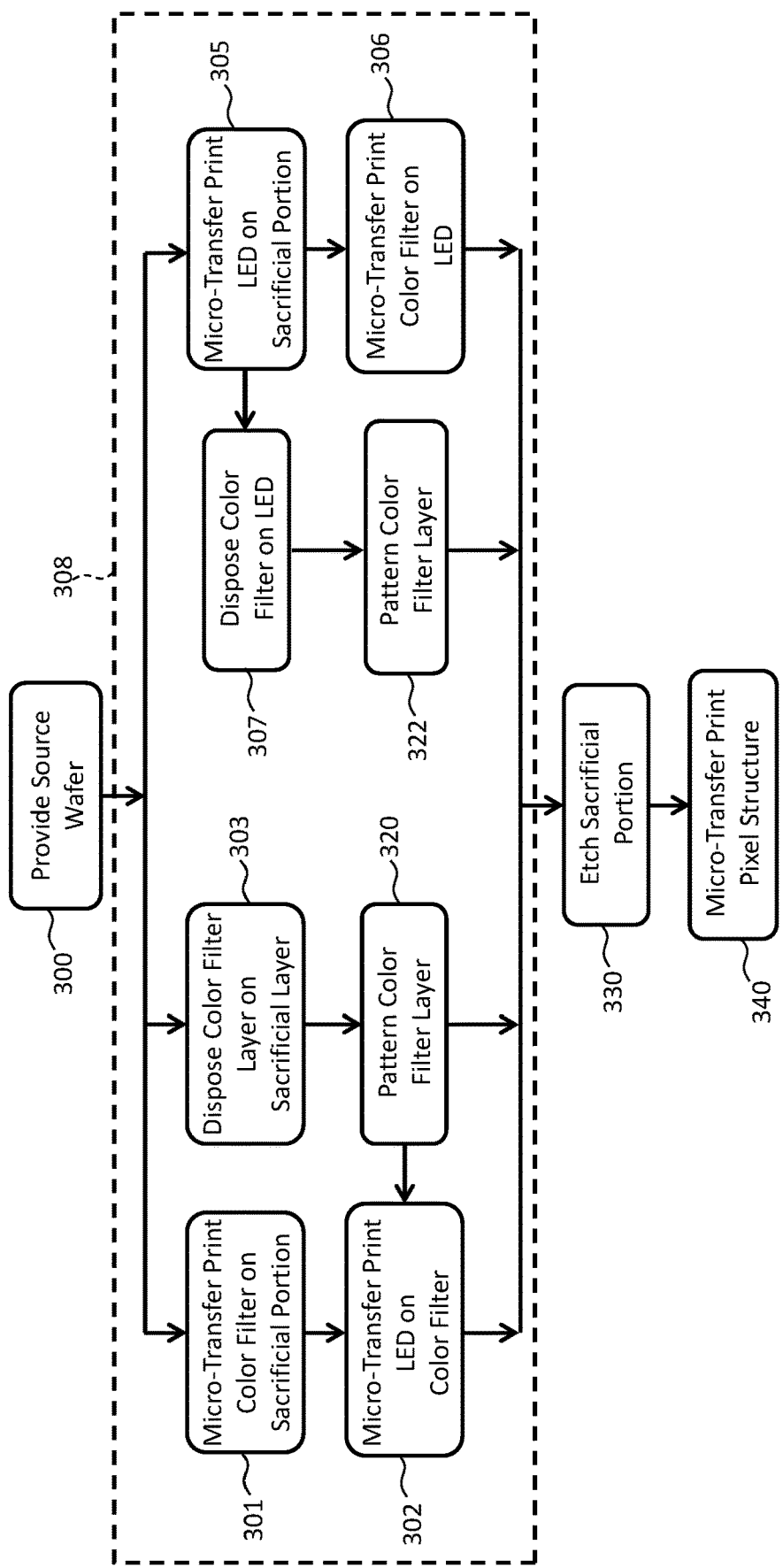
FIG. 7 is a flow chart in accordance with embodiments of the present invention corresponding to FIGS. 4, 5A, 5B, and 6A-6C.

Referring also to FIG. 7, in an embodiment of the present invention, a method of making a pixel structure source wafer 36 comprises providing a source wafer 80 having a patterned sacrificial layer 82 including sacrificial portions 84 separated by anchors 94 in step 300. In step 308, an LED 33 is disposed entirely on or over each sacrificial portion 84, the LED 33 having a light-emitting side 39, and a color filter 22 provided adjacent to the light-emitting side 39 of each LED 33. The color filter 22 is also disposed entirely on or over each sacrificial portion 84 to form a pixel structure 30. The sacrificial portion 84 is etched in step 330 to form one or more pixel tethers 34 physically connecting each pixel structure 30 to an anchor 94. In step 340, the pixel structure 30 is micro-transfer printed from the pixel structure source wafer 36 to a destination substrate.

The color filter 22 and LED 33 can be provided or disposed in a variety of ways according to a corresponding variety of embodiments of the present invention. In one embodiment corresponding to FIG. 5A, the color filter 22 is micro-transfer printed in step 301 from a color-filter source wafer 26 onto the source wafer 80 entirely over the sacrificial portion 84 and an LED 33 is micro-transfer printed from an LED source wafer onto the color filter 22 in step 302 so that the color filter 22 is disposed adjacent to the light-emitting side 39 of the LED 33. The color filter 22 can be part of a color-filter structure 20 with a fractured color-filter tether 24 as shown in FIG. 1A or 1B micro-transfer printed from a color-filter source wafer 26 as shown in FIG. 2A or 2B onto or over the sacrificial portion 84 of the source wafer 80. An encapsulation layer 31 is optionally disposed, for example by deposition using any of a variety of methods such as sputtering or evaporation, and can form at least a portion of the pixel tether 34.

In another embodiment corresponding to FIG. 5B, a color-filter layer 28 is disposed over the patterned sacrificial layer 82, for example by coating, in step 303 and then patterned in step 320, for example using photolithographic methods and materials as described above. The color filter 22 is patterned in step 302 on the source wafer 80 entirely over the sacrificial portion 84 and the LED structure 32 is micro-transfer printed from an LED source wafer onto the color filter 22 in step 302 so that the color filter 22 is disposed adjacent to the light-emitting side 39 of the LED 33. The pixel tether 34 is then the same tether as the color-filter tether 24. Thus, the fractured pixel tether 34 can include the LED tether 35 and can include at least some of the same material as the color filter 22. The pixel tether 34 can also include at least some of the same material as the LED 33.

Figure 6C:
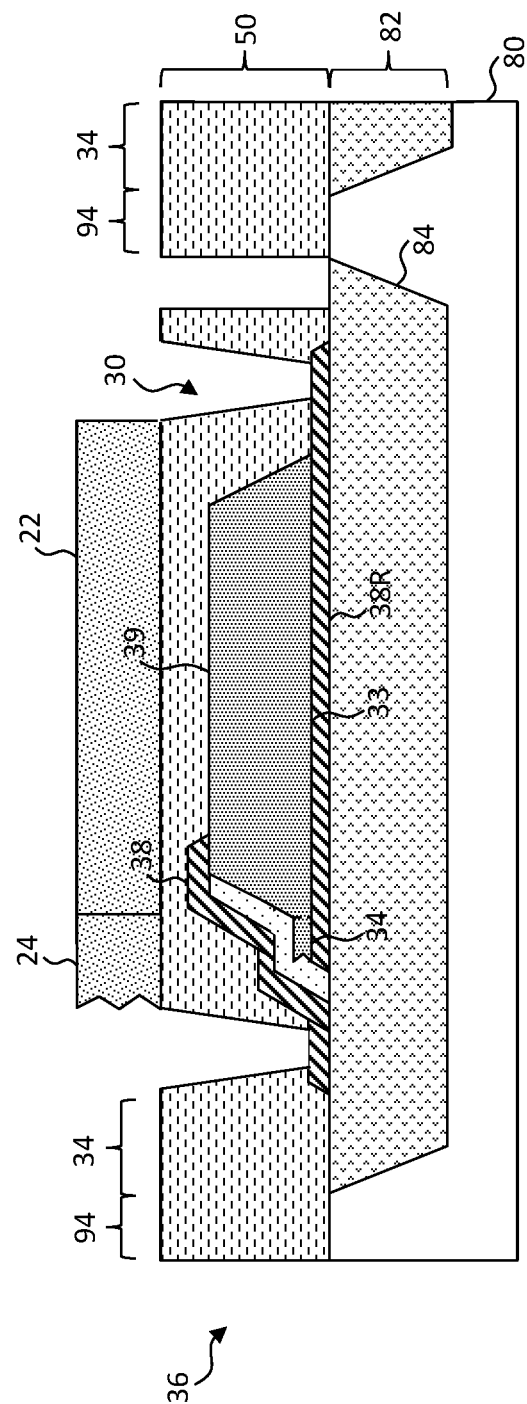

Referring to FIGS. 6A-6C, in alternative structures of the present invention, an optional reflective or conductive electrode 38R or layer is disposed on the sacrificial portion 84.

Electrical power is provided to the LED 33 through the electrodes 38, 38R. As shown in FIGS. 6A and 6B, electrodes 38 can be contacted through vias in the color-filter layer 28. The color-filter layer 28 is patterned to form the vias and the color filter 22 disposed adjacent to the light-emitting side 39 of the LED 33 in the pixel structure 30. The color-filter layer 28 can provide the pixel tether 34 (as shown in FIG. 6A) or an encapsulation layer 31 can be coated over the color-filter structure 20 and form at least a portion of the pixel tether 34 (as in FIG. 6B).

A method of making a pixel structure source wafer 36 in embodiments corresponding to FIGS. 6A and 6B, includes micro-transfer printing an LED 33 from an LED source wafer onto the source wafer 80 entirely over the sacrificial portion 84 in step 305. The LED 33 can be part of an LED structure 32 including an LED tether 35. In the embodiment of FIG. 6A, a color-filter layer 28 is coated over the LED 33 in step 307. The color-filter layer 28 is patterned in step 322, for example using photolithography, to form a color filter 22 disposed adjacent to the light-emitting side 39 of the LED 33. Vias can be formed in the same step to expose the electrodes 38, 38R and the color-filter layer 28 can form the pixel tether 34 so that the pixel tether 34 is a color-filter tether 24. In the embodiment of FIG. 6B, the color-filter layer 28 is patterned to form the color filter 22 only and an encapsulation layer 31 is disposed, for example by deposition using any of a variety of methods such as sputtering or evaporation, to form at least a portion of the pixel tether 34. The pixel tether 34 can be thinner than the color filter 22 to facilitate fracturing.

In another method forming a structure shown in FIG. 6C, color filters 22 are micro-transfer printed from a color-filter source wafer 26 onto the LED structure 32 in step 306 to form the pixel structure 30. The color filters 22 can be part of a color-filter structure 20 that includes a color-filter tether 24. An adhesive or planarizing layer 50 can be used to adhere the color-filter structure 20 to the LED structure 32, for example an uncured curable encapsulation layer 31, and then cured.

Intermediate Substrate

Figure 8A:
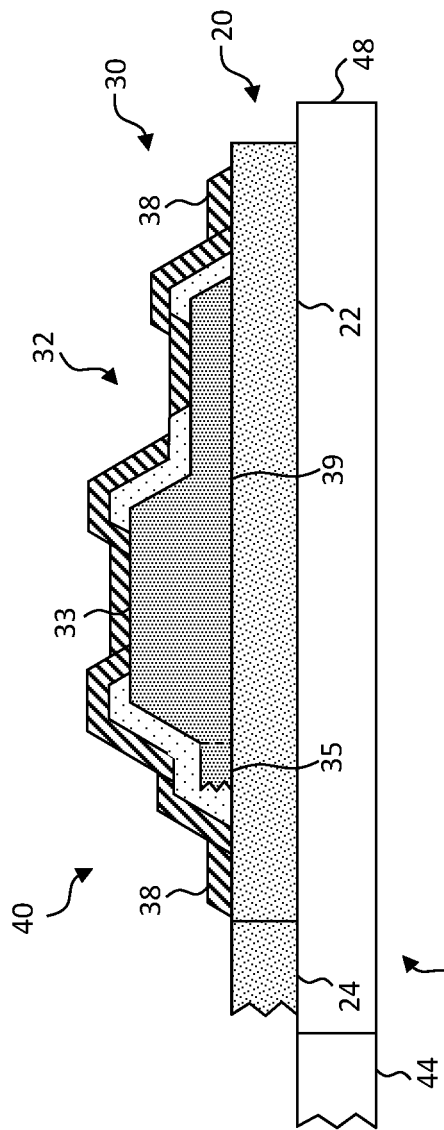
FIGS. 8A and 8B are cross sections of intermediate structures, each including an intermediate substrate, an LED, and a color filter embodiment of the present invention.
Figure 8B:
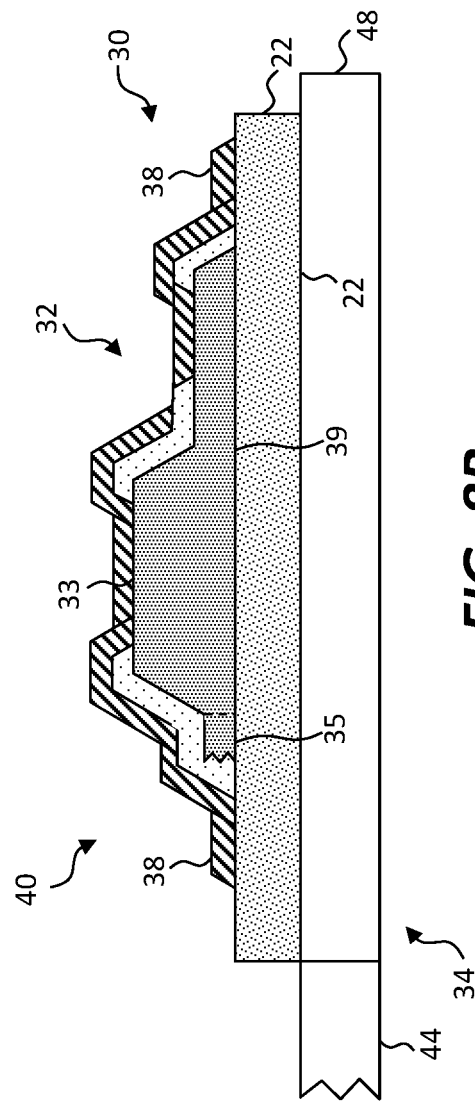

In an embodiment of the present invention referring to FIGS. 8A and 8B, a micro-transfer printed intermediate structure 40 comprises an intermediate substrate 48 and one or more pixel structures 30 disposed on the intermediate substrate 48. Each pixel structure 30 includes an LED 33 having a light-emitting side 39, a color filter 22 disposed adjacent to the light-emitting side 39 of the LED 33, and a fractured pixel tether 34 physically attached to the LED 33 or physically attached to the LED 30 and to the color filter 22. The pixel structure 30 can be any of the pixel structures 30 described herein, for example including any of the pixel structures 30 illustrate in FIGS. 4, 5A, 5B 6A, 6B, and 6C and can include encapsulation layers 31 (not shown). The LED 33 can be a part of an LED structure 32 that also includes a fractured LED tether 35. As shown in FIG. 8A, the color filter 22 can be a part of a color-filter structure 20 that also includes a fractured color-filter tether 24. Alternatively, as shown in FIG. 8B, the color filter 22 is not attached to a color-filter tether 24 but is formed in place. The fractured pixel tether 34 can be or include any of the color-filter tether 24, the LED tether 35, and a portion or materials of an encapsulation layer 31 (not shown).

A fractured intermediate tether 44 is physically attached to the intermediate substrate 48 to form a micro-transfer printed intermediate structure 40. The intermediate substrate 48 can be or include a glass, a polymer, a semiconductor, or silicon, or any one or any combination of these. The fractured intermediate tether 44 can include at least some of the same material as the color filter 22, or at least some of the same material as the intermediate substrate 48, or both, or an encapsulation layer 31 (not shown) encapsulating the LED 33 and color filter 22 can form at least a part of the fractured intermediate tether 44 or the fractured intermediate tether 44 can be a part of the encapsulation layer 31 (similar to the structure of FIG. 5A).

Referring also to FIGS. 9A and 9B, in certain embodiments an intermediate structure source wafer 46 comprises a source wafer 80 having a patterned sacrificial layer 82 including sacrificial portions 84 separated by anchors 94. A patterned intermediate substrate layer 42 disposed on or over the patterned sacrificial layer 82 forms separate and independent intermediate substrates 48. Each intermediate substrate 48 is disposed entirely over a sacrificial portion 84. One or more pixel structures 30 are disposed entirely on each intermediate substrate 48. Each pixel structure 30 includes an LED structure 32 having an LED 33 with a fractured LED tether 35, the LED 33 having a light-emitting side 39, and a color filter 22 disposed adjacent to the light-emitting side 39 of the LED 33. One or more fractured pixel tethers 34 are physically attached to each pixel structure 30 and an intermediate tether 44 is physically attached to the intermediate substrate 48.

In certain embodiments, the source wafer is or includes a glass, a polymer, a semiconductor, or silicon, the intermediate substrate 48 is or includes a glass, a polymer, a semiconductor, or silicon, the sacrificial portions 84 are a designated portion of an anisotropically etchable silicon or a selectively etchable material, or any one or any combination of these. The fractured pixel tether 34 can include at least some of the same material as the color filter 22, at least some of the same material as the LED 33, or portions of or materials from an encapsulation layer 31 encapsulating the color filter 22 and LED 33. The intermediate tether 44 can include at least some of the same material as the color filter 22 or some of the material from an encapsulation layer 31. Alternatively, the intermediate tether 44 can include at least some of the same material as the intermediate substrate 48. In yet another embodiment, the intermediate tether 44 includes at least some of the same material as the source wafer. In an embodiment, the intermediate substrate 48 includes portions of or materials from the color filter 22.

As shown in FIG. 9A, the color filter 22 is part of a color-filter structure 22 including a color-filter tether 24 that is micro-transfer printed onto or over the intermediate substrate 48. Alternatively, as shown in FIG. 9B, the color filter 22 is coated and patterned using photolithography on the intermediate substrate 48 so that no color-filter tether 24 is present.

Figure 10A:
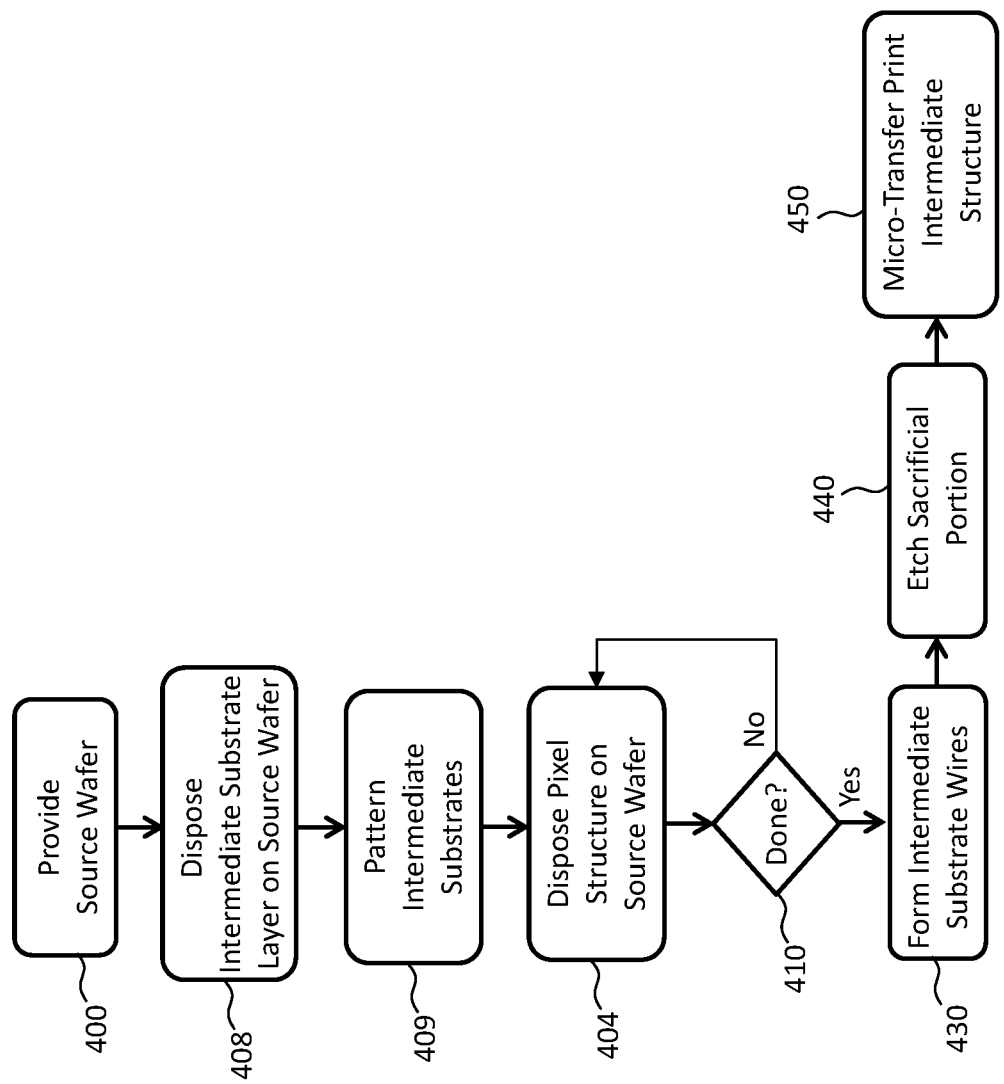
FIGS. 10A and 10B are flow charts in accordance with embodiments of the present invention corresponding to FIGS. 8 and 9.

Referring also to FIG. 10A, a method of making an intermediate structure source wafer 46 comprises providing in step 400 a source wafer having a patterned sacrificial layer 82 including sacrificial portions 84 separated by anchors 94. In step 408, an intermediate substrate layer 42 is disposed over the patterned sacrificial layer 82 and patterned in step 409 to form an intermediate substrate 48 entirely over each sacrificial portion 84. In step 404, one or more pixel structures 30 are disposed on each intermediate substrate 48 entirely on or over each sacrificial portion 84 and intermediate substrate 48. Each pixel structure 30 includes an LED 33 having a light-emitting side 39, a color filter 22 disposed adjacent to the light-emitting side 39 of the LED 33, and a fractured pixel tether 34 physically attached to the pixel structure 30 to form an intermediate structure 40. This step is repeated as often as desired until done in step 410, for example to dispose a red, green, and blue pixel structure 30 on the intermediate substrate 48. The pixel structures can be electrically connected with wires on the intermediate substrate 48 in step 430. In this case, the intermediate structure 40 can be a full-color pixel with improved color gamut including a red LED 33 emitting red light through a red color filter 22R, a green LED 33 emitting green light through a green color filter 22G, and a blue LED 33 emitting blue light through a blue color filter 22B.

In further embodiments, the sacrificial portion 84 is etched to form one or more intermediate tethers 44 physically connecting each intermediate structure 40 to an anchor 94 in step 440 and an intermediate structure 40 is micro-transfer printed in step 450 from the intermediate structure source wafer 46 to a destination substrate, such as a display substrate.

In one embodiment, one or more pixel structures 30 are disposed on each intermediate substrate 48 entirely on or over each sacrificial portion 84 by micro-transfer printing a pixel structure 30 from a pixel structure source wafer 36 onto the intermediate substrate 48 of the source wafer 80 entirely over the sacrificial portion 84.

Figure 10B:
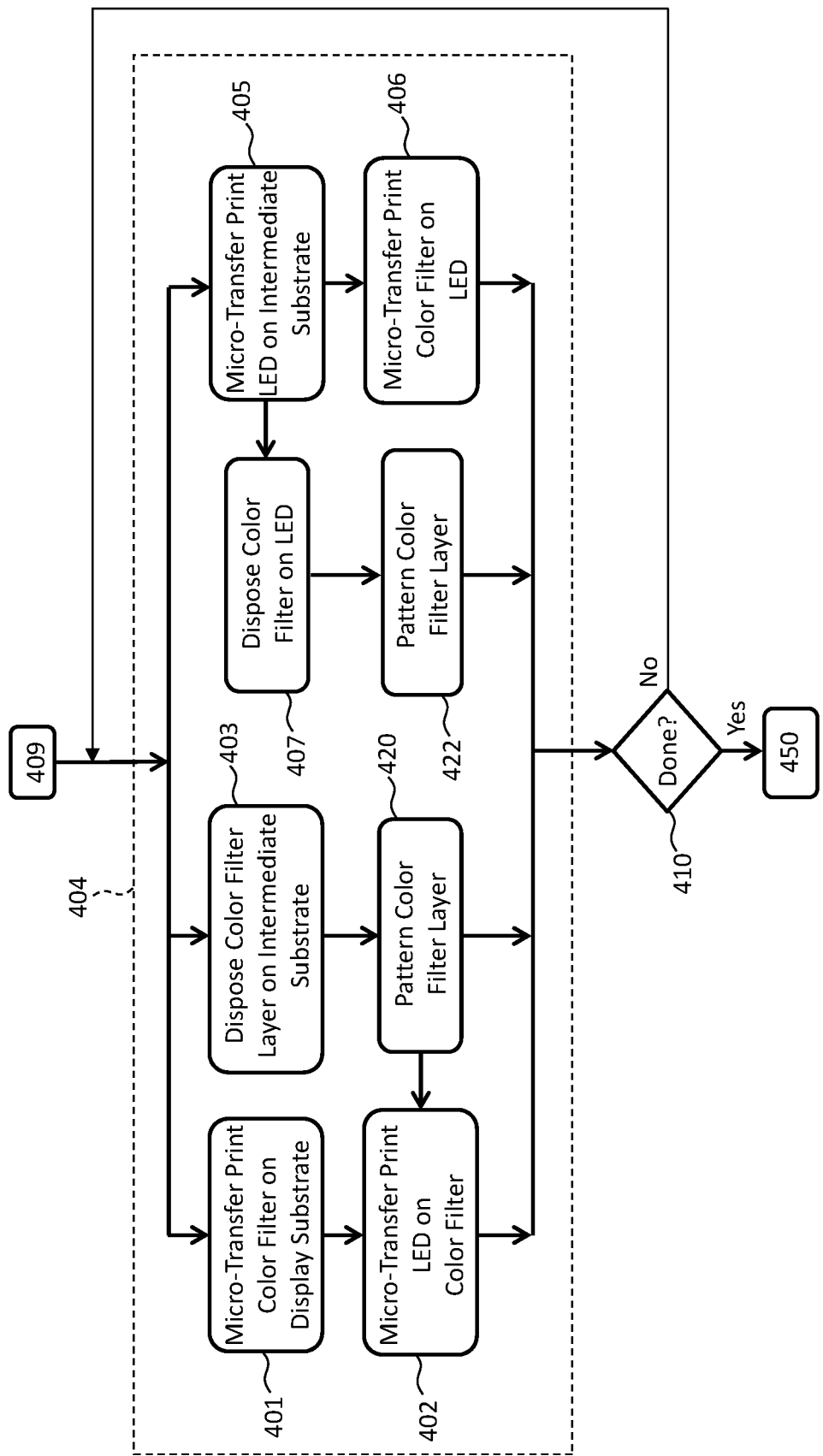

In other embodiments, referring to FIG. 10B, one or more pixel structures 30 are disposed on each intermediate substrate 48 entirely on or over each sacrificial portion 84 by micro-transfer printing a color filter 22 in step 401 from a color-filter source wafer 26 onto the intermediate substrate 48 of the source wafer 80 entirely over the sacrificial portion 84 and then micro-transfer printing an LED 33 from an LED source wafer onto or over the color filter 22 in step 402 so that the color filter 22 is disposed adjacent to the light-emitting side 39 of the LED 33, for example in a bottom-emitting configuration.

In another embodiment, the steps are reversed so that the color-filter structure 20 is micro-transfer printed onto the LED structure 32. In this embodiment, an LED 33 is micro-transfer printed from an LED source wafer onto the intermediate substrate 48 of the source wafer 80 entirely over the sacrificial portion 84 in step 405 and a color filter 22 is micro-transfer printed from a color-filter source wafer 26 onto the LED 33 in step 406 so that the color filter 22 is disposed adjacent to the light-emitting side 39 of the LED 33 in a top-emitting configuration. A planarizing or adhesive layer 50 can be provided to adhere the color filter 22 to the LED 33 (FIG. 6C).

In yet another embodiment, an LED 33 is micro-transfer printed from an LED source wafer onto the source wafer 80 entirely over the sacrificial portion 84 and intermediate substrate 48 in step 405 and a color filter 22 is formed over the LED 33 by disposing the color-filter layer 28 over the LED 33 in step 407 and patterning the color-filter layer 28 in step 422 so that the color filter 22 is disposed adjacent to the light-emitting side 39 of the LED 33. In an alternative embodiment, a color filter 22 is formed on the source wafer 80 entirely over the sacrificial portion 84 by disposing the color-filter layer 28 over the LED 33 in step 403, patterning the color-filter layer 28 in step 420, and micro-transfer printing an LED 33 from an LED source wafer onto the color filter 22 so that the color filter 22 is disposed adjacent to the light-emitting side 39 of the LED 33 in step 402.

Display

Figure 11:
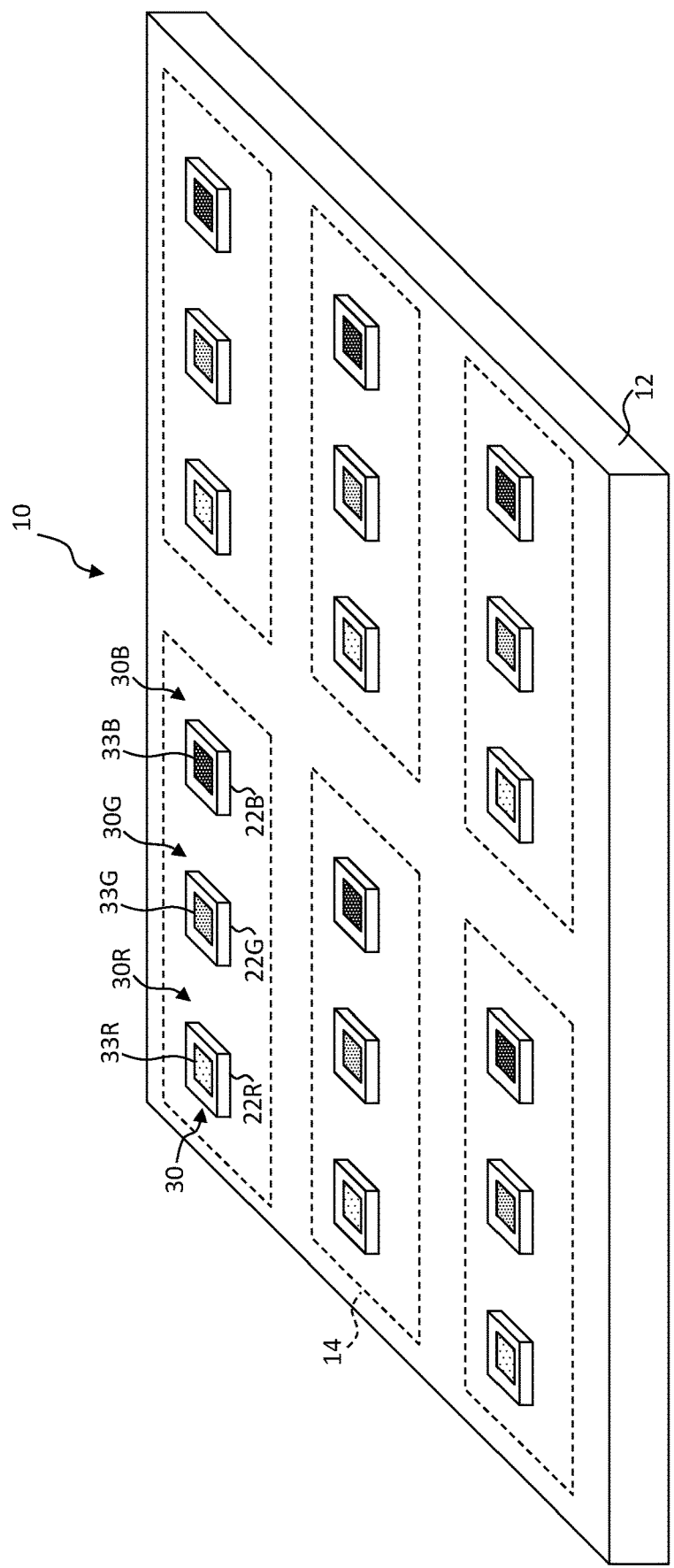
FIGS. 11 and 12 are perspectives illustrating embodiments of the present invention.

In an embodiment of the present invention illustrated in FIG. 11, an inorganic LED display 10 includes a display substrate 12. A plurality of pixel structures 30 (e.g., red pixel structure 30R, green pixel structure 30G, and blue pixel structure 30B) are disposed on the display substrate 12. Each pixel structure 30 includes one or more LEDs 33, each LED 33 having a light-emitting side 39 (FIG. 4), and a color filter 22 corresponding to each LED 33, each color filter 22 disposed adjacent to the light-emitting side 39 of the corresponding LED 33. The plurality of pixel structures 30 can include a red pixel structure 30R having a red LED 33R emitting red light through a red color filter 22R, a green pixel structure 30G having a green LED 33G emitting green light through a green color filter 22G, and a blue pixel structure 30B having a blue LED 33B emitting blue light through a blue color filter 22B. The red, green, and blue pixel structures 30R, 30G, 30B, can form a full-color pixel 14 having improved color gamut.

In a variety of embodiments corresponding to the various pixel structures 30 and methods described above, each color filter 22 can be located between the display substrate 12 and a corresponding LED 33 (a bottom-emitter configuration) or each LED 33 can be located between the display substrate 12 and a corresponding color filter 22 (a top-emitter configuration). Each LED 33 can be part of a micro-transfer printed LED structure 32 including an LED 33 having a fractured LED tether 35 physically attached to the LED 33. Each color filter 22 can be part of a color-filter structure 20 having a color a micro-transfer printed color filter 22 having a fractured color-filter tether 24 physically attached to the color filter 22. Each pixel structure 30 can be a micro-transfer printed pixel structure 30 having a fractured pixel tether 34. (Tethers are not shown in FIG. 11.)

Figure 12:
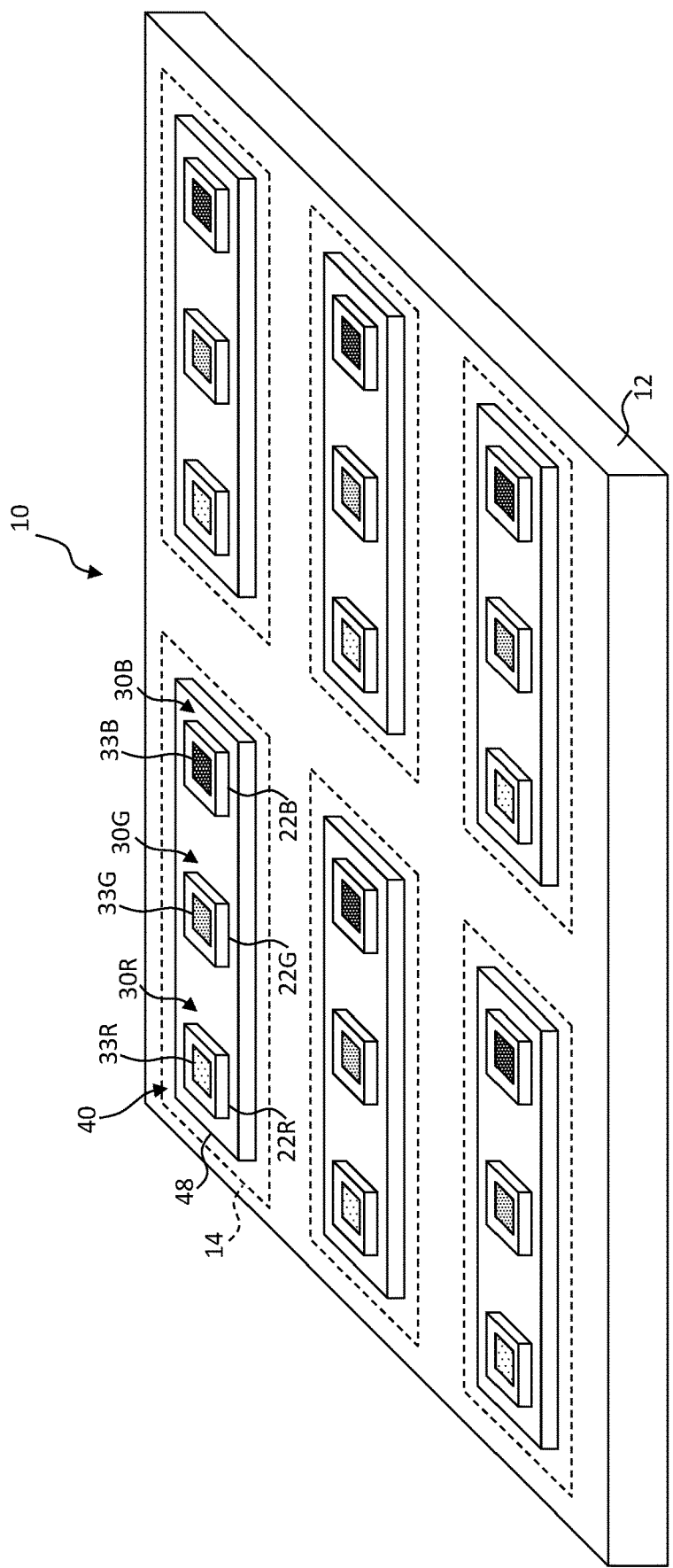

Referring to the alternative embodiment of FIG. 12, each pixel structure 30 is part of an intermediate structure 40 having an intermediate substrate 48 and a fractured intermediate tether 44. The pixel structures 30 can be micro-transfer printed onto the intermediate substrate 48 of the intermediate structure 40, so that each pixel structure 30 includes a pixel tether 34 (FIG. 4). (Tethers are not shown in FIG. 12.)

Figure 13:
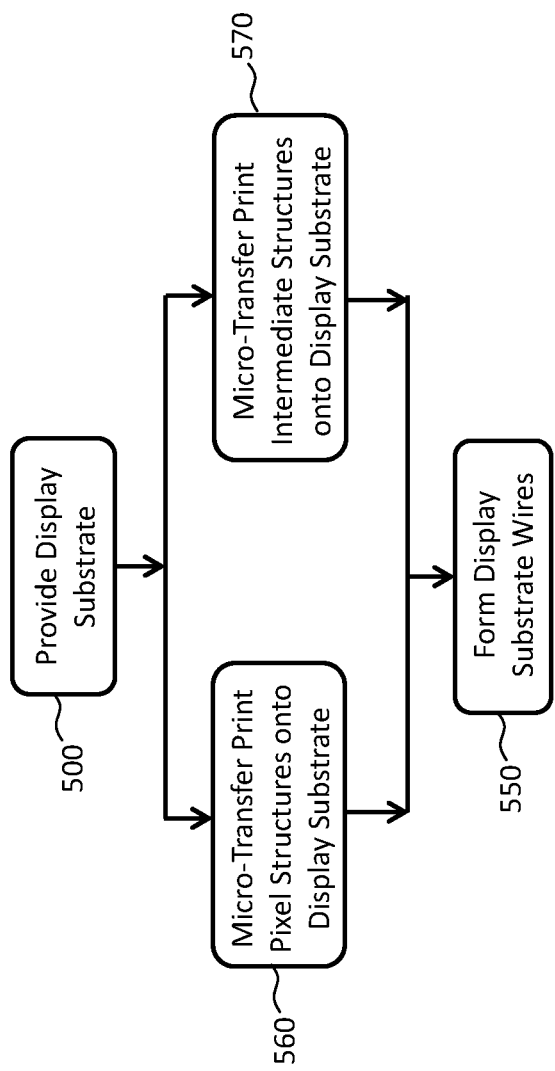
FIGS. 13 and 14 are flow charts in accordance with display embodiments of the present invention.
Figure 15:
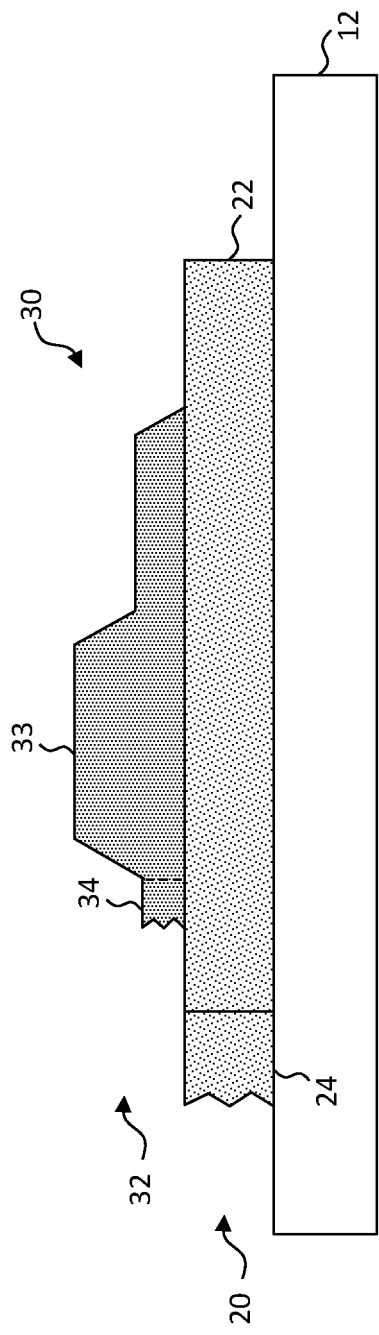
FIGS. 15-23 are cross sections illustrating various embodiments of the present invention.

Referring to FIG. 13, a method of making an LED display 10 comprises providing a display substrate 12 in step 500 and disposing a plurality of pixel structures 30 on the display substrate 12 in step 560. Each pixel structure 30 includes one or more LEDs 33, each LED 33 having a light-emitting side 39 (FIG. 4), and a color filter 22 corresponding to each LED 33. Each color filter 22 is disposed adjacent to the light-emitting side 39 of the corresponding LED 33. The pixel structures 30 can be micro-transfer printed from a pixel structure source wafer 36 to the display substrate 12. FIG. 15 is a simplified illustration of such a structure. In step 550, substrate wires (not shown) are formed, for example photolithographically, over the display substrate 12 and electrically connected to the LEDs 33 in the pixel structures 30.

Figure 19:
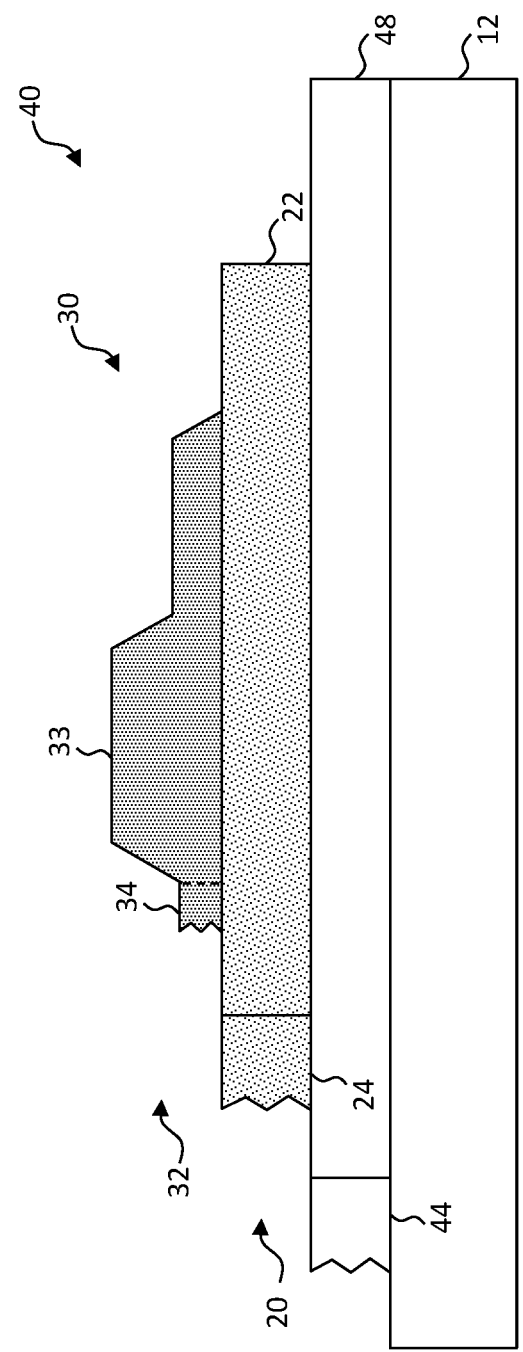
Figure 20:
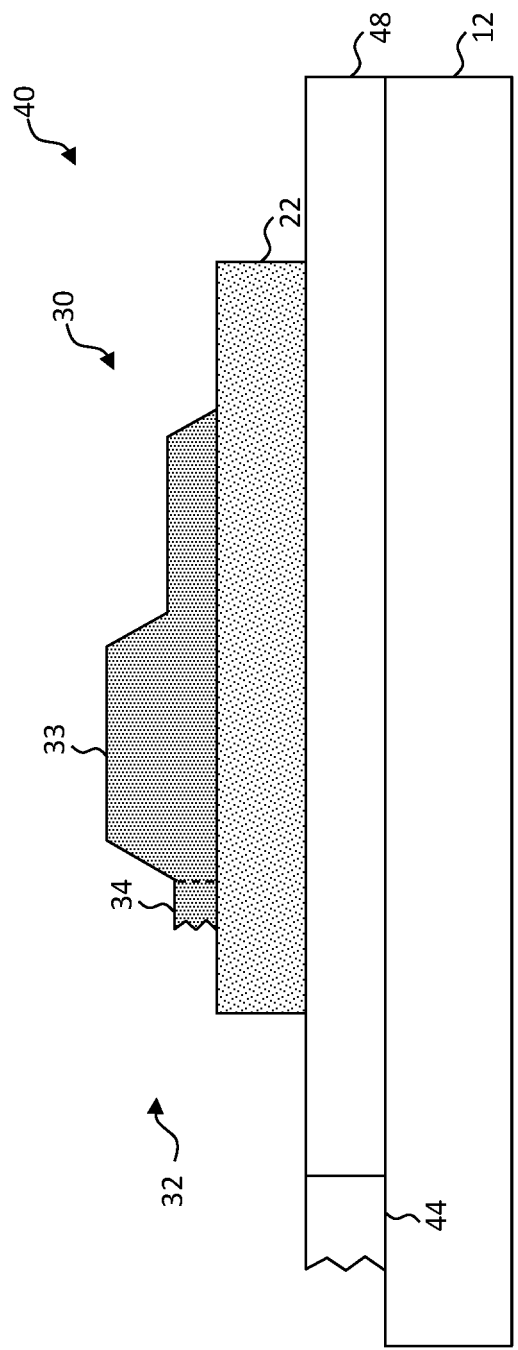
Figure 21:
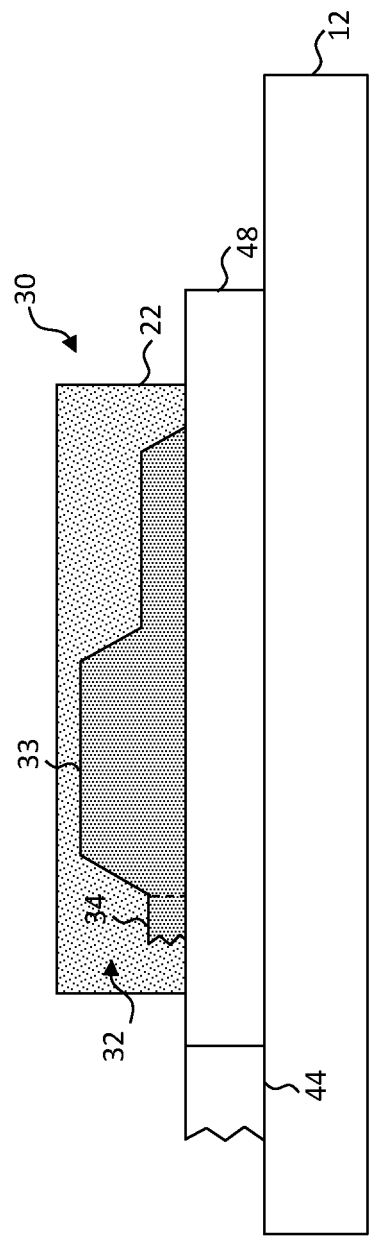
Figure 22:
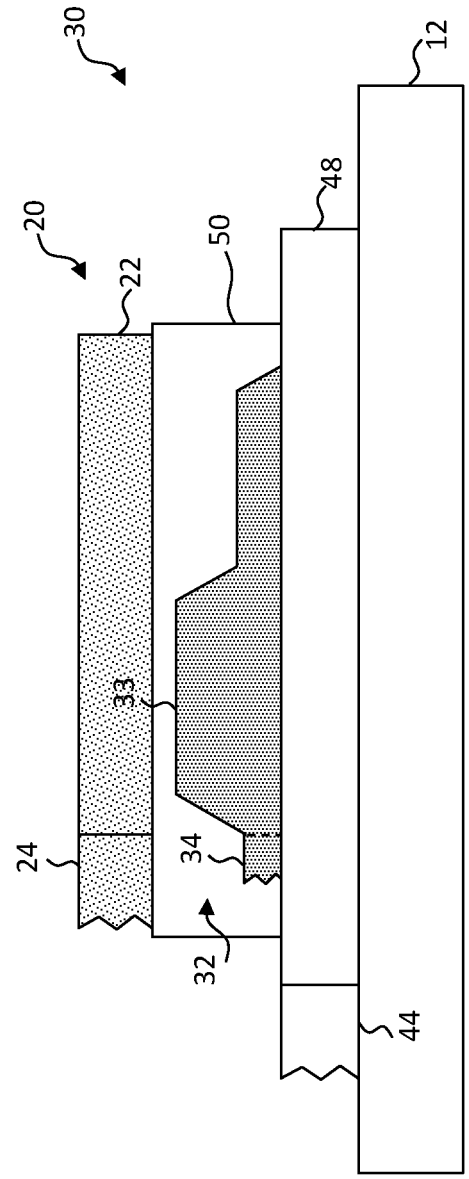

In an alternative method as also shown in FIG. 13, intermediate structures 40, for example each including a full-color pixel 14, are micro-transfer printed to the display substrate 12 from an intermediate structure source wafer 46 in step 570 and electrically connected in step 550. FIG. 19 is a simplified illustration of this structure in which the color filter 22 is micro-transfer printed onto the intermediate substrate 48 and FIG. 20 is a simplified illustration of this structure in which the color filter 22 is coated and patterned on the intermediate substrate 48 and the LED 33 micro-transfer printed onto or over the color filter 22. FIG. 21 is a simplified illustration for the case in which the color filter 22 is coated and patterned over the micro-transfer printed LED 33 and FIG. 22 is a simplified illustration for the case in which the color filter 22 is micro-transfer printed over the micro-transfer printed LED 33, for example on a planarization or adhesive layer 50.

Figure 14:
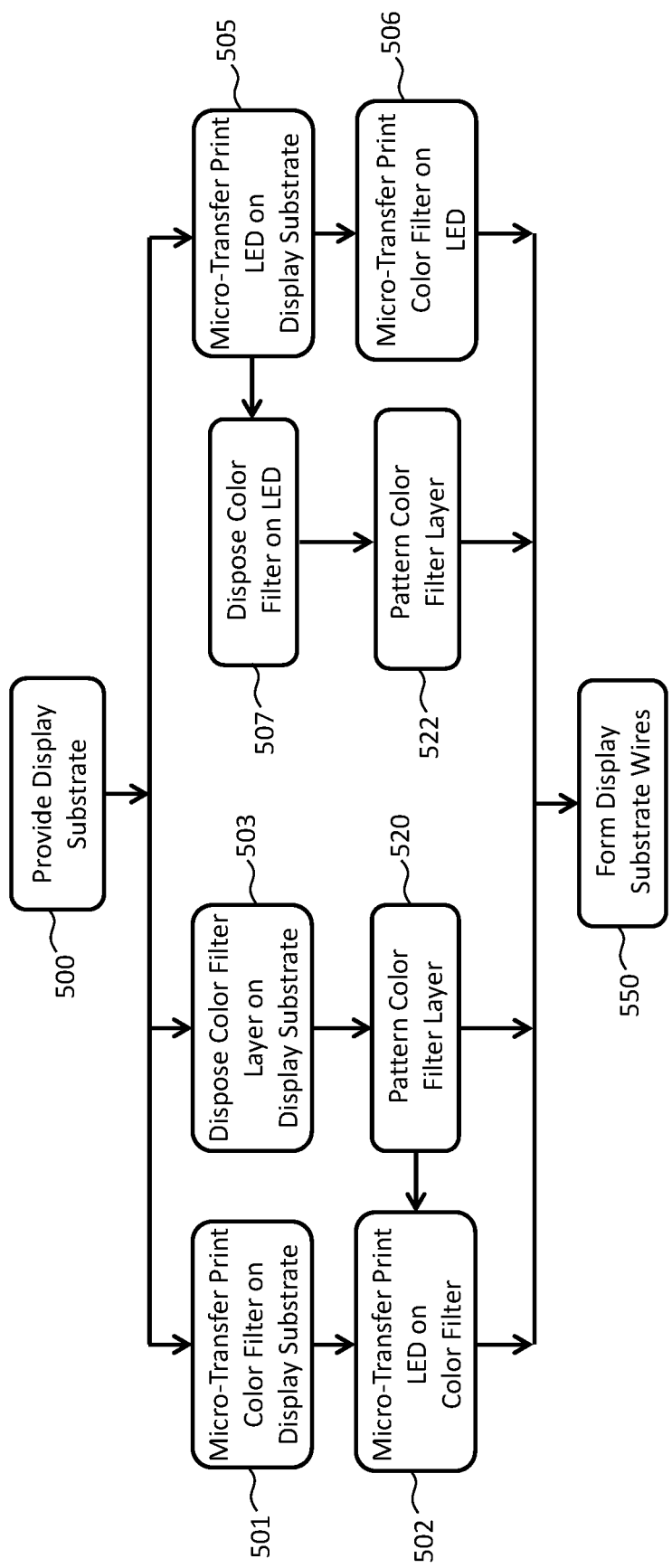
Figure 17:
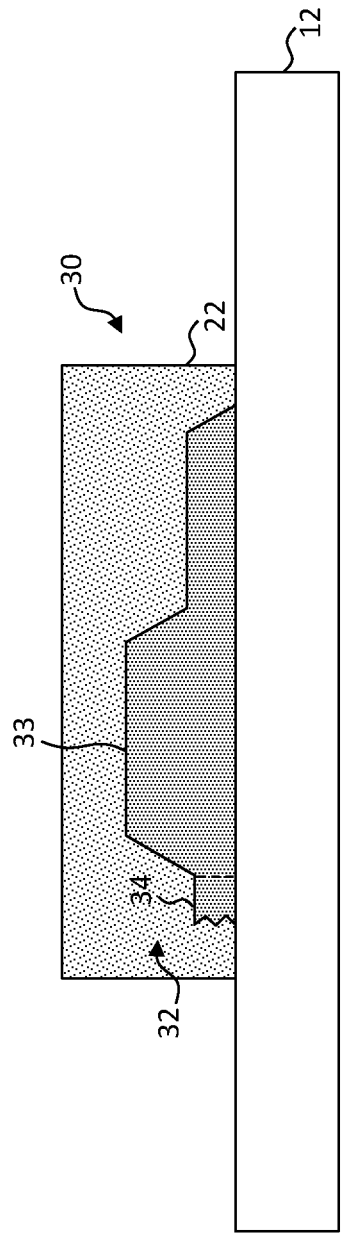
Figure 18:
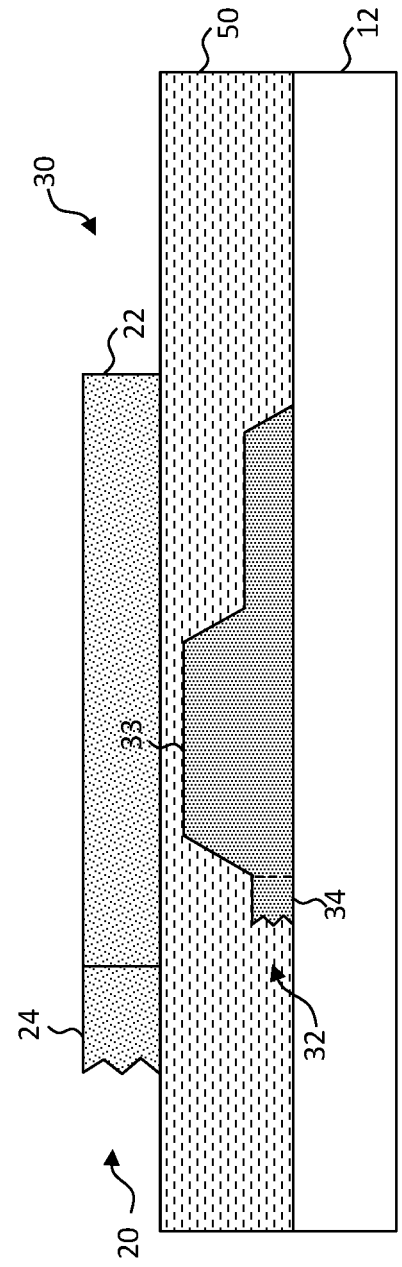

In other embodiments, referring to FIG. 14, an LED 33 is micro-transfer printed from an LED source wafer onto the display substrate 12 in step 505 and a color filter 22 is formed over the LED 33 by disposing the color-filter layer 28 over the LED 33 in step 507 and patterning the color-filter layer 28 in step 522 so that the color filter 22 is disposed adjacent to the light-emitting side 39 of the LED 33 as shown in the simplified illustration of FIG. 17. Alternatively, a color filter 22 is micro-transfer printed on the LED 33 in step 506 as shown in the simplified illustration of FIG. 18.

In yet another embodiment, the color filter 22 is micro-transfer printed onto the display substrate 12 in step 501 and the LED 33 is micro-transfer printed from an LED source wafer onto the micro-transfer printed color filter 22 so that the color filter 22 is disposed adjacent to the light-emitting side 39 of the LED 33 in step 502. FIG. 15 is also a simplified illustration of this structure.

Figure 16:
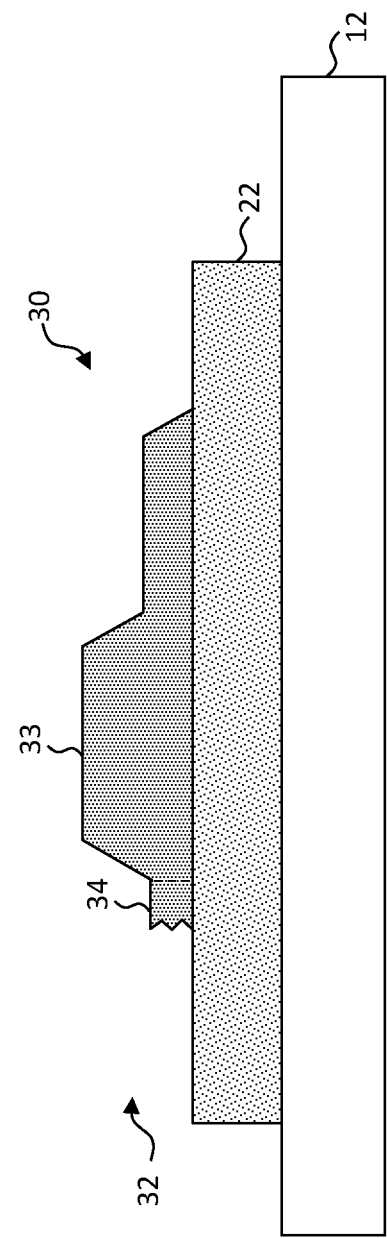

In an alternative embodiment, a color filter 22 is formed on the display substrate 12 by disposing the color-filter layer 28 over the display substrate 12 in step 503, patterning the color-filter layer 28 in step 520, and micro-transfer printing an LED 33 from an LED source wafer onto or over the patterned color filter 22 in step 502 so that the color filter 22 is disposed adjacent to the light-emitting side 39 of the LED 33. FIG. 16 is a simplified illustration of this structure.

Figure 23:
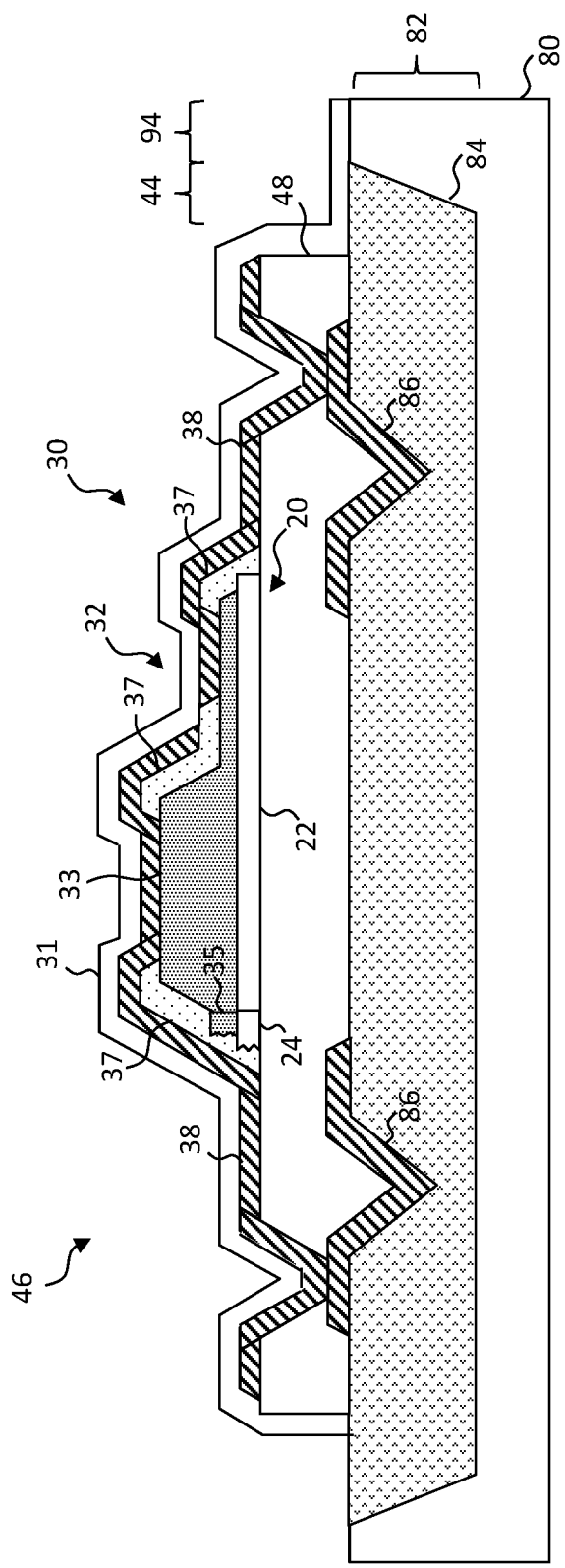

Both the intermediate structures 40 and the pixel structures 30 can be constructed with connection posts. For example, FIG. 23 illustrates an intermediate structure source wafer 46 including connection posts 86 electrically connected to the LED 33. The encapsulation layer 31 forms the intermediate tether. The color-filter structure 20 includes a color filter 20 and a fractured color-filter tether 24 that is micro-transfer printed onto the intermediate substrate 48 and the LED structure 32 is micro-transfer printed onto the color-filter structure 20 to make a pixel structure 30.

The present invention provides simple structures and methods for constructing flat-panel displays 10 that do not require large and expensive fabrication facilities. By employing micro-transfer printing to dispose LEDs 33, pixel structures 30, or intermediate structures 40, the need for extensive flat-panel processing tools for large substrates with high resolution are mitigated. High-resolution processing can be performed on smaller wafers, for example 8-inch diameter wafers or 12-inch-diameter wafers using much smaller equipment.

Furthermore, the present invention provides a way to greatly reduce the amount of color-filter material used in a flat-panel display. The following example is illustrative and structure sizes are chosen for simplicity. Photo-curable color filters and black-matrix materials in flat-panel displays (for example as in a liquid crystal display or OLED display using white-light emitting layers) are typically deposited by coating the entire substrate and then photolithographically exposing the materials through a mask to pattern-wise cure the materials in desired pixel locations and then wash away the uncured material. Thus, for a one square meter display, one square meter of each material type is deposited.

In contrast, according to embodiments of the present invention, an inorganic LED display 10 using micro-transfer printed color filters 22, pixel structures 30, or intermediate structures 40 uses a greatly reduced quantity of color-filter material. In this example, a 4 k display having eight million three-color pixels is presumed. Each light emitter (LED 33) is presumed to be formed in a 20-micron by 20-micron cell area on an LED source wafer including LED tethers 35 and anchor 94 areas. Since the color filters 22 filter or process the light emitted from the LEDs 33, they are of similar size and, to enhance micro-transfer printing efficiency, have the same spatial arrangement and pitch. For simplicity, the LEDs 33 and color filters 22 are assumed to be arranged in a rectangle of four thousand by two thousand elements, occupying a space of 8 cm by 4 cm.

In the case in which a micro-transfer printable color filter 22 is used, the color filters 22 are constructed as part of the color filter source wafer 26 and the minimum area of color-filter material necessary is 32 square centimeters. In contrast, the conventional process requires 10,000 square centimeters, resulting in a cost reduction of color-filter materials alone of more than 300 times (thus using 0.3% as much material). The same savings are found for the micro-transfer printed pixel structure 30 embodiments and any embodiment in which the color filters 22 are micro-transfer printed.

In the intermediate structure embodiment in which the color filters 22 are patterned on the intermediate substrate 48 (steps 407 and 422 or steps 403 and 420 of FIG. 10B) the coated area is larger. Presuming that the intermediate substrates 48 are 90 microns by 90 microns, include three LEDs 33 and a controller integrated circuit, and are separated by 10 microns on the intermediate structure source wafer 46, an area of 100 microns by 100 microns is coated for each color and each pixel. In this case, the minimum area of color-filter material is 800 square centimeters, resulting in a cost reduction of color-filter materials of 12.5 (using 8 percent as much material).

In the case of a 2000 by 1000 pixel display (approximately conventional high definition pixel count), only 25% as much color-filter material is needed. In contrast, in a conventional design, reducing the number of pixels in a display having the same size substrate does not reduce the use of color-filter materials.

The LEDs 33 can be arranged and electrically connected in rows and columns over the display substrate 12 to enable matrix addressing with electrical signals supplied by passive- or active-matrix controllers. Electrical signals from the controllers can cause the LEDs 33 to emit light.

The display substrate 12 can be polymer, plastic, resin, polyimide, PEN, PET, metal, metal foil, glass, a semiconductor, or sapphire.

Each LED 33 can be a light-emitting diode (LED), a micro-LED, a laser, a diode laser, or a vertical cavity surface emitting laser and can include known light-emitting diode materials and structures. The LEDs 33 can comprise an inorganic solid single-crystal direct bandgap light emitter, can emit visible light, such as red, green, blue, yellow, or cyan light, violet, or ultra-violet light, and can emit either coherent or incoherent light. The light emitters used herein can have at least one of a width, length, and height from 2 to 5 µm, 4 to 10 µm, 10 to 20 µm, or 20 to 50 µm. Light emitted from or through the color filters 22 can be a very pure light and highly saturated and can have a full width half max (FWHM) less than or equal to 100 nm, 50 nm, or even less than or equal to 20 nm.

Various embodiments of the present invention incorporate different color filters and light emitters in full-color pixels 14. In one embodiment, a full-color pixel 14, for example in an intermediate structure 40 includes one each of a red, green, and blue LEDs 33R, 33G, 33B with corresponding red, green, and blue color filters 22R, 22G, 22B, as shown in FIG. 12. In other embodiments, the red pixel does not include a red color filter 22R or the red and blue pixels do not include red or blue color filters 22R, 22B, respectively. In another embodiment, a blue LED 33B is used for all of the pixels and the red and green pixels employ a color filter including red and green color-change materials, respectively. In yet another embodiment, an ultra-violet LED 33 is used for all of the pixels and the red, green, and blue pixels employ a color filter including red, green, and blue color-change materials, respectively. Other arrangements of light emitting LEDs 33 and color filters 22, including color-change materials, are possible and included in the present invention.

A discussion of micro-LEDs 33 and micro-LED displays can be found in U.S. Provisional patent application Ser. No. 14/743,981, filed Jun. 18, 2015, entitled Micro Assembled LED Displays and Lighting Elements, which is hereby incorporated by reference in its entirety. Micro-transfer methods are described in U.S. Pat. Nos. 8,722,458, 7,622,367 and 8,506,867, each of which is hereby incorporated by reference in its entirety.

Controllable Color Filters

According to some embodiments of the present invention, color filters 22 are controllable color filters 22 disposed on or over a color-filter substrate 72. For example, the color filters 22 can be responsive to control signals such as a voltage or electric field, for example, provided between electrodes disposed on either side of the color filter 22 or to heat provided to the color filters 22, where the color filters 22 are at least substantially planar and have a thickness significantly less than its extent over the color-filter substrate 72, for example length and width. Color filters 22 can be very thin, for example having a thickness less than or equal to ten microns, less than or equal to one micron, less than or equal to 100 nm, less than or equal to 50 nm, or less than or equal to 20 nm. In certain embodiments, color filters 22 are controlled to absorb, transmit, or reflect different colors of light. Color filters 22 can include optical spacers to enable constructive and destructive optical interference at desired frequencies. Color filter 22 and optical spacers can be deposited and patterned using photolithographic methods and materials.

In some embodiments, referring to FIGS. 24A, 24B, and 25, a color-filter device 99 comprises a color filter 22 and at least one electrical conductor 38 disposed in contact with the color filter 22. At least a portion of a color-filter tether 24 is attached to the color filter 22 or structures formed in contact with or supporting the color filter 22. A color-filter tether 24 can also be a pixel tether 34 (as shown in FIGS. 27A, 27B) and can be broken (e.g., fractured) (as shown in FIGS. 24A, 24B, and 25).

In certain embodiments, because the color filters 22 are controllable, they are variable color filters 22 that can change their optical attributes, such as color, transparency, absorption, or reflectivity. In some embodiments, a color filter 22 is or includes one or more of: a phase-change material, an ink, a gel, a metallopolymer material, or a photonic crystal. In some embodiments, the color filter 22 includes photonic crystals embedded within an electroactive polymer. Other usable color-filter materials include germanium-antimony-tellurium (GST). For example, in certain embodiments, a color-filter comprising GST can change phase with applied voltage of less 10 volts amplitude and a sub-millisecond duration. In some embodiments, the color filter 22 includes additional optical layers or structures, for example spacing layers, to optimize the optical effect of the controllable color-filter material. The color filter 22 can include multiple layers of different materials, for example multiple layers of controllable materials and one or more optical spacer layers, to provide a wide range of potential states and colors.

In certain embodiments, a color filter 22 can be electrically controlled. According to some embodiments of the present invention, the color-filter material is a phase-change material that can be controlled to switch, for example, from an amorphous state to a crystalline state or from a crystalline state to an amorphous state. Each of the amorphous state and the crystalline state can have a different optical attribute, such as color. In some embodiments, a single color filter 22 can be controlled to have a variety of colors.

Referring to FIGS. 24A and 24B, a color-filter device 99 comprises the electrical conductor 38, for example a bottom electrode 38M (FIG. 24A) or top electrode 38T (FIG. 24B) that is resistive or has a portion that is a resistive electrode 38V and is heated when electrical current flows through the resistive electrode 38V. The resistive electrode 38V can be, for example a metal or metal alloy, such as aluminum, or a semiconductor. The heated resistive electrode 38V then heats the color filter 22 in response to the electrical current passed through the resistive electrode 38V. In some embodiments, a color filter 22 is or includes a phase-change material that changes the color of light filtered by the color filter 22 in response to heat.

In some embodiments, an electrical conductor 38 or resistive electrode 38V is substantially transparent and allows visible light to pass through. Light 70A incident on the color filter 22 is transmitted through the resistive electrode 38V and passes through the color filter 22 once. In some embodiments, an electrical conductor 38 or resistive electrode 38V is substantially reflective and reflects visible light. Light 70B incident on the color filter 22 is reflected by the resistive electrode 38V, passing through the color filter 22 twice. In some embodiments, a color filter 22 is a reflective color filter 22 and reflects light itself. In some embodiments, a color filter 22 is a transmissive color filter 22 and transmits light. In some embodiments of the present invention, a transparent electrode transmits more than 50% of the light incident on the transparent electrode (e.g., more than 70%, 80%, 90%, or 95%) and a reflective electrode reflects more than 50% the light incident on the reflective electrode (e.g., more than 70%, 80%, 90%, or 95%). A reflective electrode can be a metal or metal alloy, such as aluminum, silver, titanium, or tin or alloys thereof. Transmissive electrodes can be thin metal or metal alloys or transparent metal oxides such as indium tin oxide.

In some embodiments of the present invention, referring to FIG. 25, the color filter 22 has a first side 21a and a second side 21b opposed to the first side 21a, the electrical conductor 38 is a first electrode 38M disposed on the first side 21a of the color filter 22, and a second electrode 38T is disposed on the second side 21b of the color filter 22 and is part of another electrical conductor 38. In various embodiments, both the first and second electrodes 38M, 38T are transparent, the first electrode 38M is transparent and the second electrode 38T is reflective, or alternatively the second electrode 38T is transparent and the first electrode 38M is reflective. In such various embodiments, the color filter 22 can alter the color of light that it transmits, reflects, or absorbs in response to an electrical current, a voltage, or an electrical field provided between the first and second electrodes 38M, 38T.

In some embodiments, for example, the illustrative embodiments of FIG. 24A, FIG. 24B, or FIG. 25, the electrical current or voltage can be provided by a controller, e.g., an electronic circuit, provided on the color-filter substrate 72 or a controller external to a color-filter device 99 or color-filter substrate 72 (e.g., a micro-transfer printable color-filter device or substrate). However, some variable and controllable color-filter materials require a relatively large amount of current to change their state, for example if the color-filter material requires heating or a high current density. In large-area devices this can be a problem, since much applied power is lost via substrate interconnect wiring and therefore requires a very large drive current and voltage that result in significant substrate heating. According to some embodiments of the present invention, this problem can be mitigated by providing charge storage locally to each color filter 22 or group of color filters 22.

Referring to FIG. 26A, in certain embodiments, for example, a control circuit 66 comprises a switch 60, for example a transistor, controllably connecting a capacitor 62 to an electrical conductor 38 (e.g., resistive electrode 38V, first electrode 38M, or second electrode 38T). The capacitor 62 stores charge provided through electrical connections to ground and $V_{dd}$ power supplies. The capacitor 62 can be charged for a relatively long period of time at a low current rate through the interconnect wiring, then discharged relatively quickly and at high current density into the color filter 22 or a heater disposed adjacent to the color filter 22 (e.g., the resistive electrode 38V) by a local transistor (e.g., switch 60) over very short interconnects inside the pixel. Such a control method using low current-drive voltage can be very precise, and can provide sufficient control of the color-filter material state conversion. In some embodiments, the color filter 22 is converted to a crystalline state with a smaller amplitude and longer term electrical pulse and converted to an amorphous state with a larger amplitude and shorter term electrical pulse, for example at 10 volts.

In certain embodiments, when a control signal turns on the switch 60, the capacitor 62 discharges through the resistive electrode 38V (bottom electrode 38M as shown in FIG. 24A). Alternatively, the switch 60 can provide power to the top electrode 38T or bottom electrode 38M (but not both) while the other electrode is grounded. In certain embodiments, a capacitor 62 stores power locally to each color filter 22 on the color-filter substrate 72. In certain embodiments, by providing local capacitors 62, the instantaneous current passing through the power lines is reduced. In certain display applications, local capacitors 62 can be charged once per frame update rather than once per line or pixel update, reducing the current flow density through the power lines by a factor corresponding to the number of lines or pixels. This can greatly reduce losses due to resistance and increase the maximum frame rate of a display using a color-filter devices 99 (e.g., a micro-transfer color-filter device) in accordance with certain embodiments of the present invention. In some embodiments of the present invention, the control circuit 66 is disposed underneath the bottom electrode 38M so that the extent of the color filter 22 over the color-filter substrate 72 includes the control circuit 66, enabling a large fill factor for the color-filter device 99. In a reflective display application, an increased fill factor can improve display contrast.

Referring to FIG. 26B, a circuit in accordance with the illustrative embodiment of FIG. 26A can additionally include another switch (isolation switch 61) that isolates the power supply from the capacitor 62. The isolation switch 61 can be turned on when the control switch 60 is turned off and can be turned off when the control switch 60 is turned on. This enables precise control of the amount of charge deposited in the capacitor 62 and the charge that is applied to the resistive electrode 38V, resulting in very precise heating or other control of the characteristics of the load (e.g., resistive electrode 38V). The use of an isolation switch 61 enables more relaxed control and timing signals and eliminates the effect of the load from the $V_{dd}$ power supply and wiring thereby keeping the $V_{dd}$ across the array at a more stable voltage. The isolation switch 61 characteristics such as transistor width and length can be chosen to limit the current into the capacitor 62 thereby minimizing voltage drops on $V_{dd}$ and stabilizing the $V_{dd}$ across the array. A lower, more even current is applied during charging and the sharp high current impulse into the load is isolated from the $V_{dd}$ supply.

As shown in FIG. 26C, in certain embodiments, two different power supplies, $V_{dd1}$ and $V_{dd2}$, are provided, each with a separate isolation switch 61, that are alternatively controlled and can provide different amounts of power or voltage to the load. One isolation switch 61 provides a connection to a $V_{dd1}$ power supply for one state transition (e.g., a transition to a crystalline state), and the other isolation switch 61 provides a connection to a $V_{dd2}$ power supply for a second state transition (e.g., a transition to an amorphous state). In certain embodiments, this can be necessary in a system where selection between amorphous and crystalline states would need to be made simultaneously. In certain embodiments, such circuits allow the capacitor voltage to be set appropriately for each state transition without requiring adjustment of the single $V_{dd}$ between the states.

As also shown in FIG. 26C, in certain embodiments, a color-filter device 99 (e.g., a micro-transfer color-filter device) can include a readout terminal that, in some embodiments, also includes an isolation switch 61. When turned on, typically when a control switch 60 is turned off, a readout circuit can detect a change in permittivity and/or conductivity of a color-filter device 99 which is an indication of amorphous or crystalline color-filter material state. This structure already exists for a color-filter device 99 that uses the color-filter material as its own heater via current conduction through the color-filter material. The readout circuits can sense a change in permittivity/conductivity of a color-filter material, for example, by measuring current through, or voltage across, a resistive electrode 38V. In some embodiments of the present invention, a color filter 22 has two states, a programmed crystal state and an erased amorphous state. Without wishing to be bound to any particular theory, in general, changing a color filter 22 to a crystalline state is more difficult. Therefore, if states are interpreted in an application as a valid or invalid indicator, it can be useful to consider the crystal state as valid and the amorphous state as invalid, since any unauthorized tampering can more easily convert the color filter 22 from the crystal (valid) to amorphous (invalid) state than the reverse. In some embodiments of the present invention, local circuits can be added to each color-filter device 99 to detect the state of the color filter 22.

Referring to FIG. 27A, in certain embodiments, a color-filter device 99 can comprise a plurality of color filters 22 disposed on a common color-filter substrate 72. Each color filter 22 of the plurality of color filters 22 can have an electrically separate electrical conductor 38 disposed in contact with the color filter 22. The color of light filtered by each color filter 22 of the plurality of color filters 22 is a different color of light from the color of light filtered by other color filters 22 of the plurality of color filters 22. For example, as shown in FIG. 27A, a color-filter device 99 includes three color filters 22, each controllably filtering a different color of light, for example red, green, and blue, to form a pixel in a display 10 (as shown in FIGS. 11 and 12). The color filters 22 and the electrical conductors 38 on the color-filter substrate 72 can be disposed on the display substrate 12 (as shown in FIG. 11). As shown in FIG. 26A, each color filter 22 can have a capacitor 62 and switch 60.

Alternatively, a common capacitor 62 can be provided for the group of color filters 22 in the color-filter device 99 (e.g., as in FIG. 27A) and controllably connected through individual switches 60 to each of the color filters 22 in the color-filter device 99.

In certain embodiments, referring to FIG. 27B, a plurality of color-filter devices 99 are disposed on an intermediate substrate 48 that is separate from the color-filter substrates 72. The intermediate substrates 48 are disposed on the display substrate 12 (as shown in FIG. 12). Each color filter 22 can have an attached color-filter tether 24 so that the color filters 22 can be, but are not necessarily, micro-transfer printed from a color filter source wafer 80 to the intermediate substrate 48. Moreover, the intermediate substrate 48 can have an intermediate tether 44 so that the intermediate substrate 48 itself can be, for example, micro-transfer printed to a destination or display substrate 12. The intermediate tether 44 can be a portion of or attached to the intermediate substrate 48 or a layer or structure formed on, in, over, or under the intermediate substrate 48.

Figure 28A:
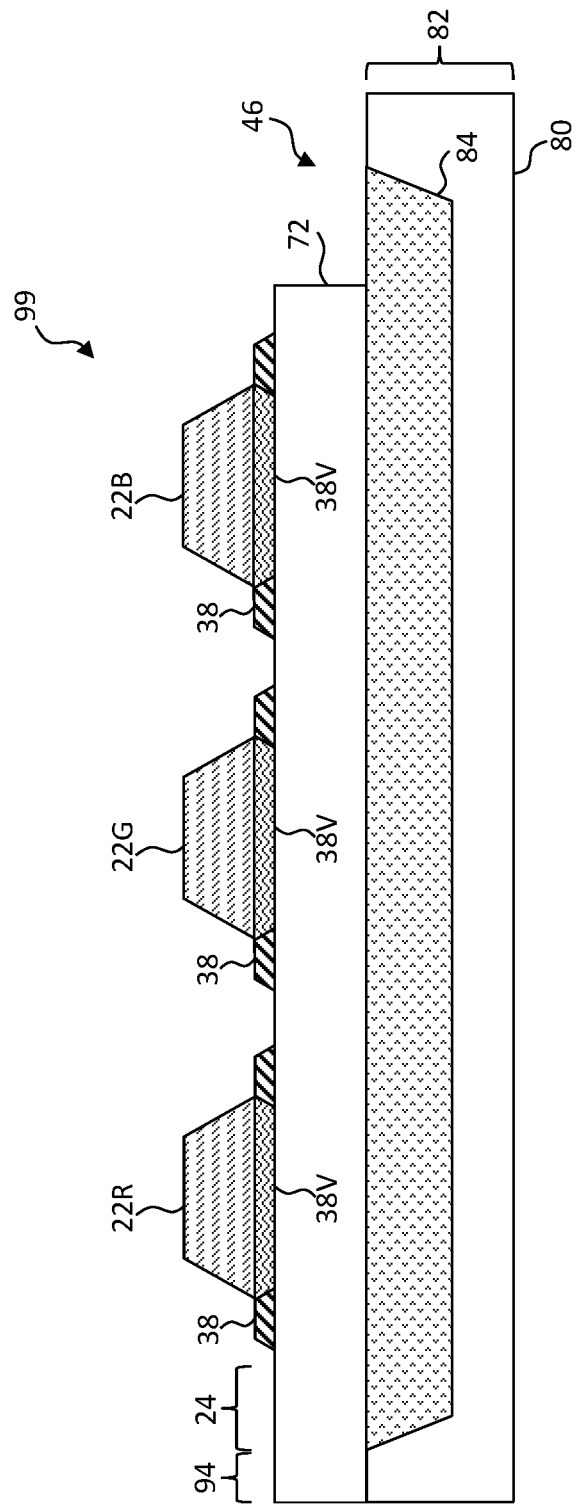
FIGS. 28A and 28B are cross sections of micro-transfer printable wafers having a color-filter device with multiple color filters and corresponding electrodes in a planar or stacked configuration according to illustrative embodiments of the present invention.
Figure 28B:
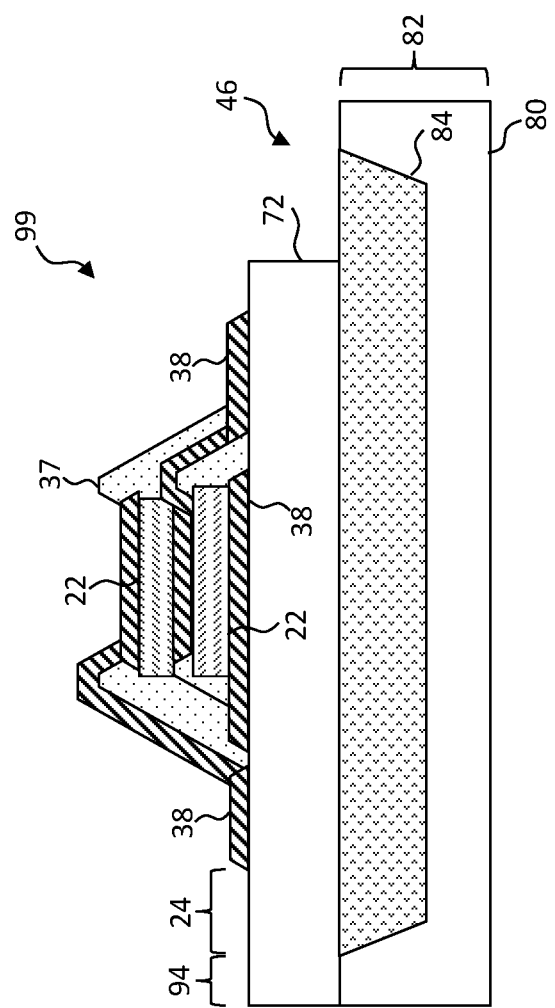
Figure 28C:
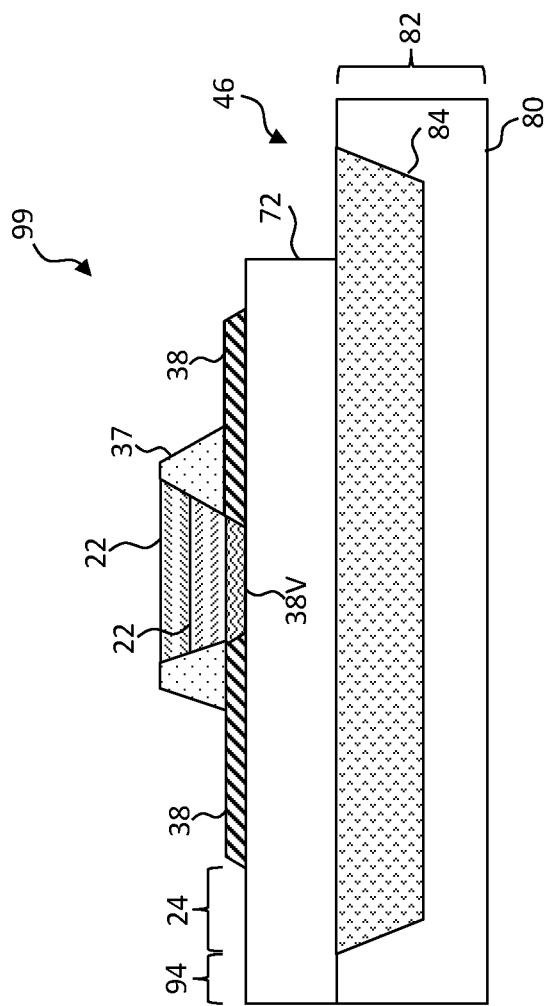
FIG. 28C is an cross section of micro-transfer printable wafers having multiple color filters in a stacked configuration according to illustrative embodiments of the present invention.

Referring to FIG. 28A, in certain embodiments, a color-filter device 99 can be formed or provided on a source wafer 80. The source wafer 80 has a substrate comprising a sacrificial layer 82 with patterned sacrificial portion 84 separate by anchors 94. One or more micro-transfer color filters 22 are disposed entirely over each sacrificial portion 82. As shown in FIG. 28A, a color-filter device source wafer 80 can comprise a plurality of color filters 22 disposed adjacent to each other in a common plane. Each color filter 22 of the plurality of color filters 22 has an electrically separate electrical conductor 38 disposed in contact with the color filter 22. In some embodiments, each of the different color filters 22 can be made on a different color-filter device source wafer 80, thereby simplifying the manufacturing process, reducing costs and improving quality or yield of the color filters 22. In some embodiments, referring to FIG. 28B, a color-filter device 99 can comprise a plurality of color filters 22 and electrical conductors 39 disposed in a stack entirely over each sacrificial portion 82. In the illustrative embodiment shown in FIG. 28C, the color filters 22 are disposed in a stack entirely over each sacrificial portion 82 and have a common electrical conductor 38.

Figure 29:
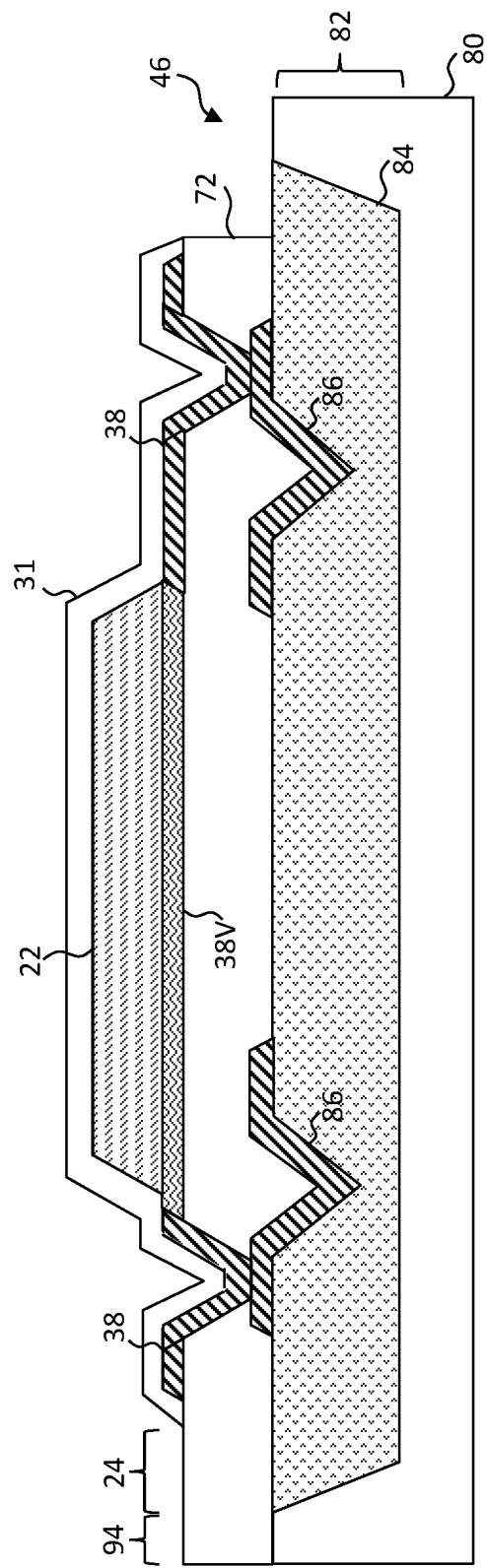
FIGS. 29 and 30 are cross sections of a color-filter device having a single electrodes having connection posts in a micro-transfer printable wafer according to illustrative embodiments of the present invention.
Figure 30:
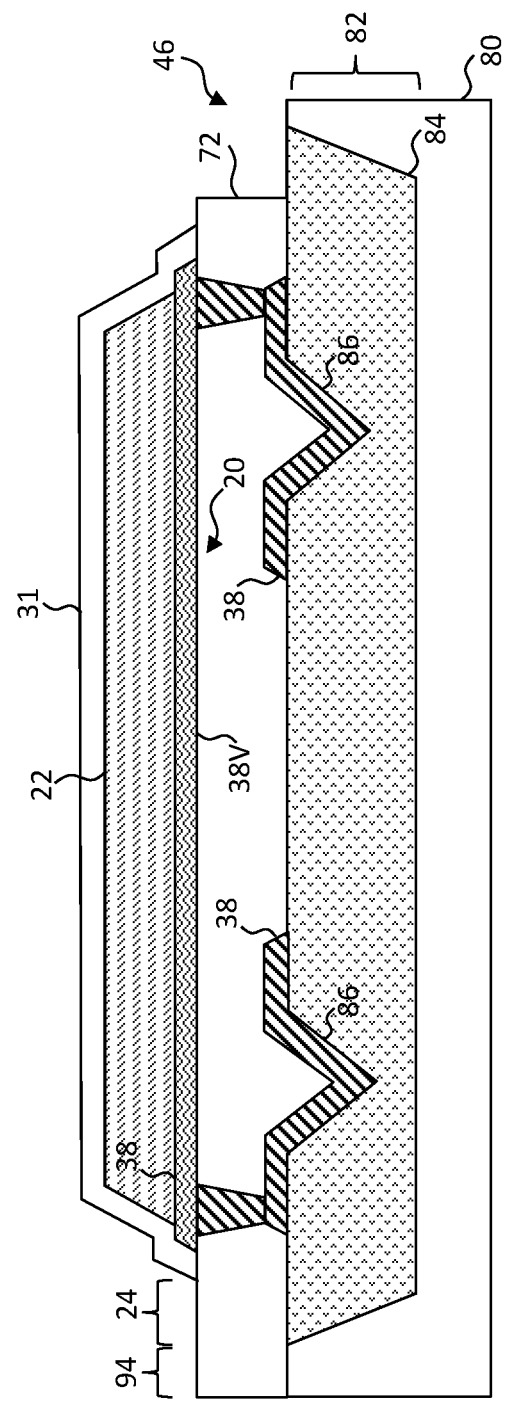

Referring to FIGS. 29 and 30, a micro-transfer printable color-filter device 99 can include connection posts 86 on a side of the color-filter substrate 72 opposite the color filters 22. The connection posts 86 are electrically connected through vias in the color-filter substrate 72 to the electrical conductor 38 and are formed in a process similar to that of FIG. 23. A form for each connection post 86 is formed by etching material in the sacrificial portion 84, for example, pyramidal structures having planes at an angle of 57 degrees, patterning a metal layer over the forms to make the posts, depositing and, for example, patterning the color-filter substrate 72 to make vias, and patterning a metal layer to electrically connect the connection posts 86 to the electrical conductor 38. FIG. 29 differs from FIG. 30 in that the vias in FIG. 30 are beneath the color filters 22, thereby reducing the area of the color-filter device 99 that is not covered with the color filter 22 and increasing the fill factor (aperture ratio) of the color-filter device 99. A large fill factor (percent of the device area covered with the color filter 22) is desirable to improve the contrast of a color-filter device 99.

Figure 31:
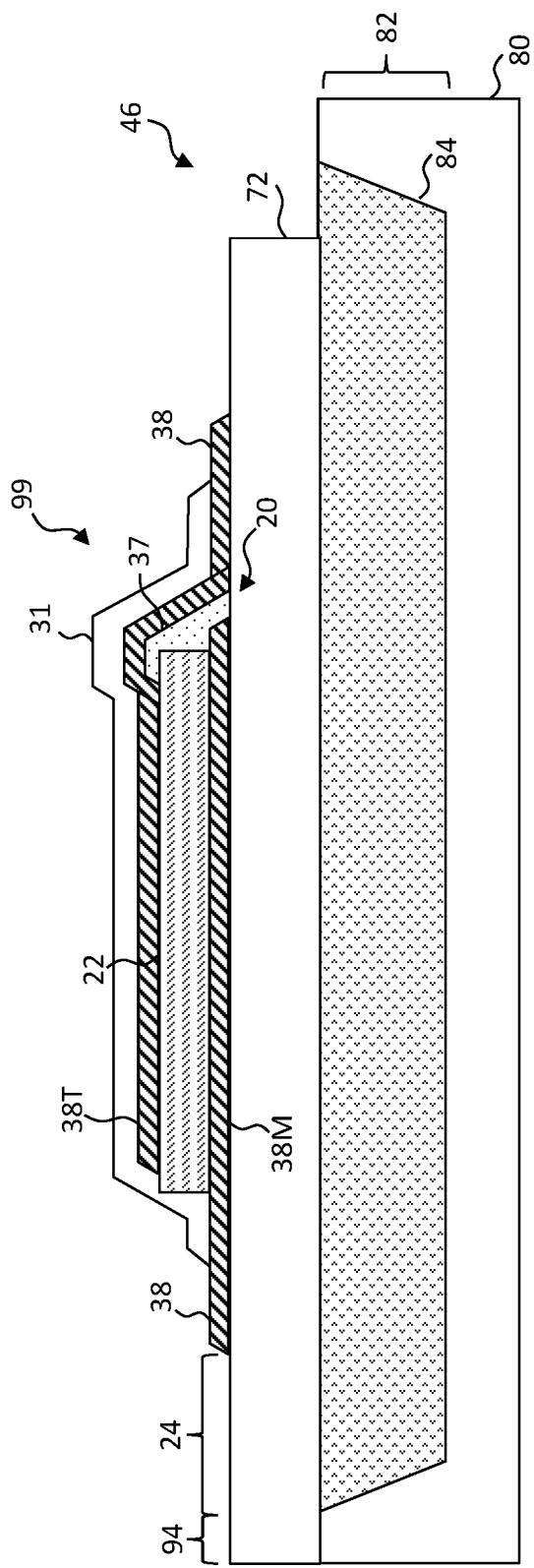
FIGS. 31-32 are cross sections of a color-filter device having two electrodes on a wafer without, and with, connection posts according to illustrative embodiments of the present invention.
Figure 32:
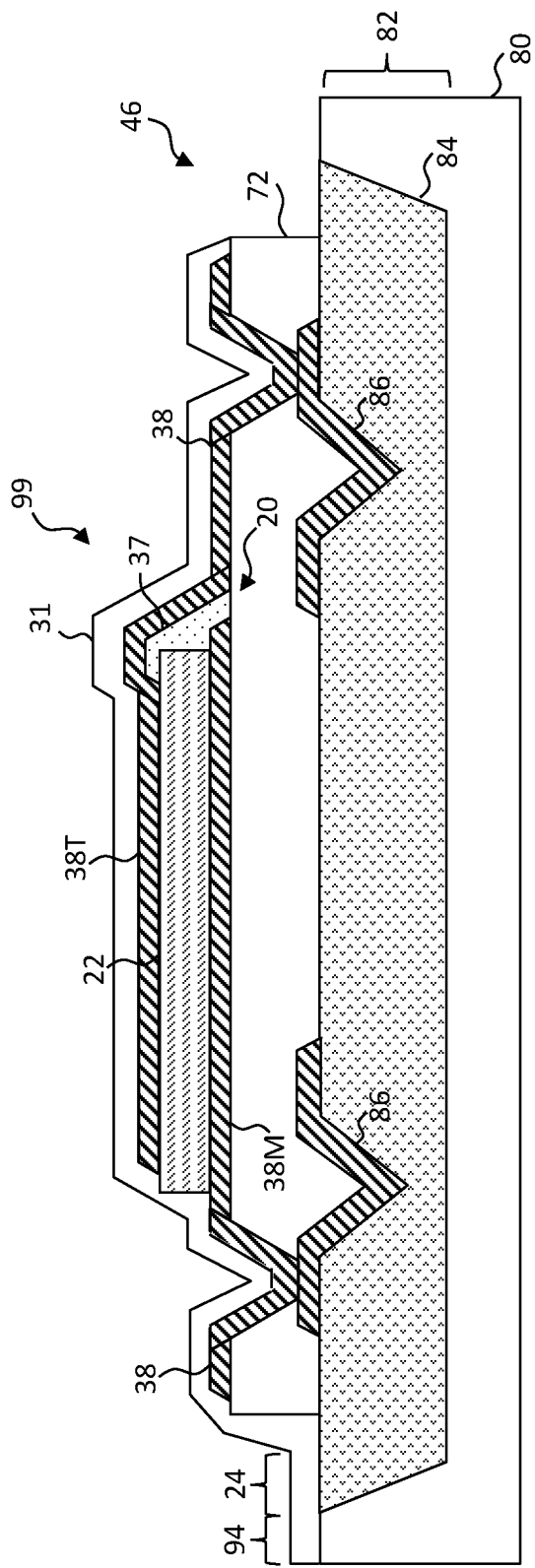

In some embodiments, as shown in FIG. 31, micro-transfer printable color-filter devices 99 of a color-filter wafer have first and second electrodes 38M, 38T that are used in accordance with the electrodes of the illustrative embodiment shown in FIG. 25. FIG. 32 shows an illustrative embodiment in which the first and second electrodes 38M, 38T are electrically connected to connection posts 86. In all of the illustrative embodiments of FIGS. 29-32, an encapsulation layer 31 protects the color filter 22 and a portion of the encapsulation layer 31 can serve as the color-filter tether 24. In some embodiments, a portion of a color-filter substrate 72 can serve as the color-filter tether 24. A color filter 22 can be formed in place over sacrificial portions 84. In some embodiments in accordance with FIG. 27, color-filter devices 99 are micro-transfer printed onto an intermediate substrate 48 over a sacrificial portion 84 that, when etched forms an intermediate tether 44. FIG. 32 illustrates a color-filter device 99 with connection posts 86.

According to some embodiments of the present invention, display 10 comprises a display substrate 12 with a plurality of color-filter devices 99 disposed on the display substrate 12. Each color-filter device 99 can comprise one or more color filters 22, each color filter 22 of the one or more color filters 22 having an electrically separate electrical conductor 38 disposed in contact with the color filter 22, and the color of light filtered by each color filter 22 of the one or more color filters 22 is a different color of light from the color of light filtered by other color filters 22 of the plurality of color filters 22 in the color-filter devices 99 so that the color-filter devices 99 form pixels disposed on the display substrate 12. In some embodiments, color-filter devices 99 are disposed on intermediate substrates 48 separate and independent of the display substrate 12 and color-filter substrates 72. In some embodiments, each color-filter device 99 includes multiple color filters 22 corresponding to the different colors of a display and forming a color pixel. In some embodiments, different color-filter devices 99 have different color filters 22 and multiple different color-filter devices 99 form a color pixel. Different color filters 22 can be sourced from different color-filter device source wafers 80.

Figure 33:
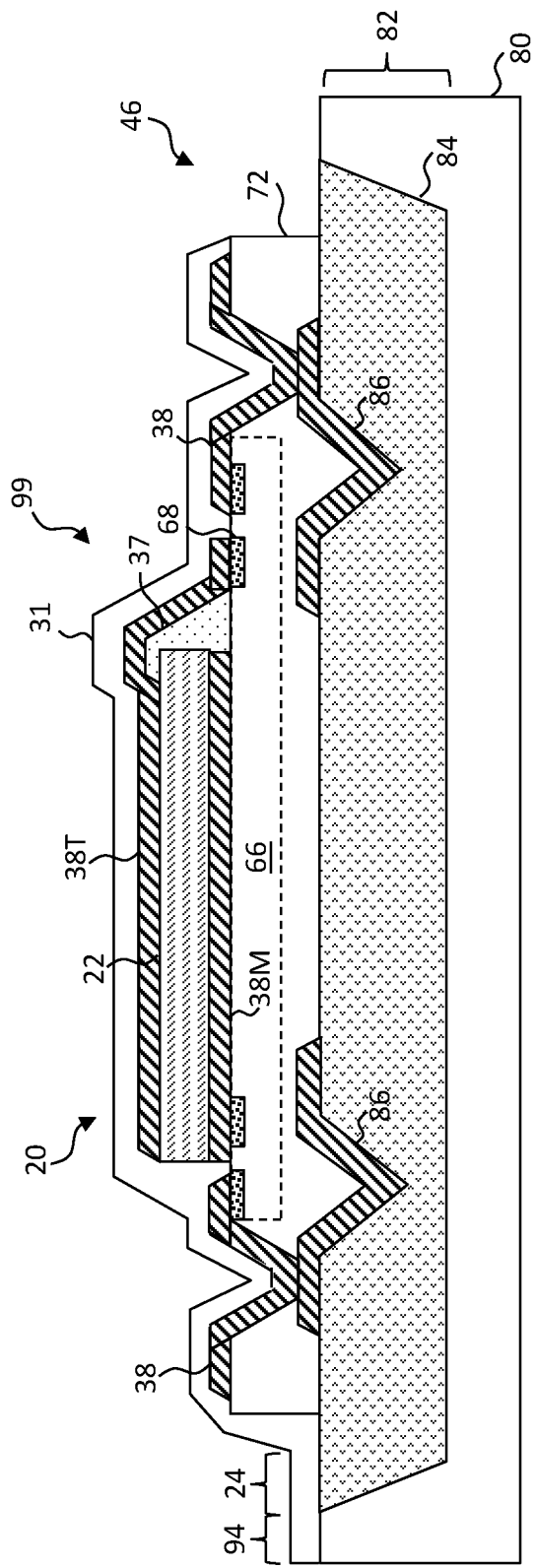
FIG. 33 is an cross section of a color-filter device having a control circuit on a wafer with connection posts according to illustrative embodiments of the present invention.

In some embodiments of the present invention, for example, referring to FIG. 33, control circuits 66 comprising electrical contacts 68, for example, the control circuit 66 of FIG. 26A having a switch 60 and optional capacitor 62, are provided on or in a color-filter substrate 72. In certain embodiments, control circuit 66 comprises electrical contacts 68 for providing a controlled current/voltage to the top and bottom electrodes 38T, 38M (i.e., through pixel control circuit 66) from input current/voltage from electrodes 38 and connection posts 86. In some embodiments, as shown in FIG. 33, the color-filter substrate 72 is a semiconductor substrate and the pixel control circuit 66, for example the circuit of FIG. 26A, is formed in or on the color-filter substrate 72 using integrated circuit and photolithographic methods and materials. In some embodiments, the control circuits 66 are provided by micro-transfer printing an integrated circuit having the pixel control circuit 66 therein onto the device substrate 48 (not shown). In some embodiments, the intermediate substrate 48 is a semiconductor substrate and the pixel control circuit 66 is formed in or on the intermediate substrate 48 using integrated circuit and photolithographic methods and materials. Control circuit(s) 66 can be micro-transfer printed onto the intermediate substrate 48.

Figure 34:
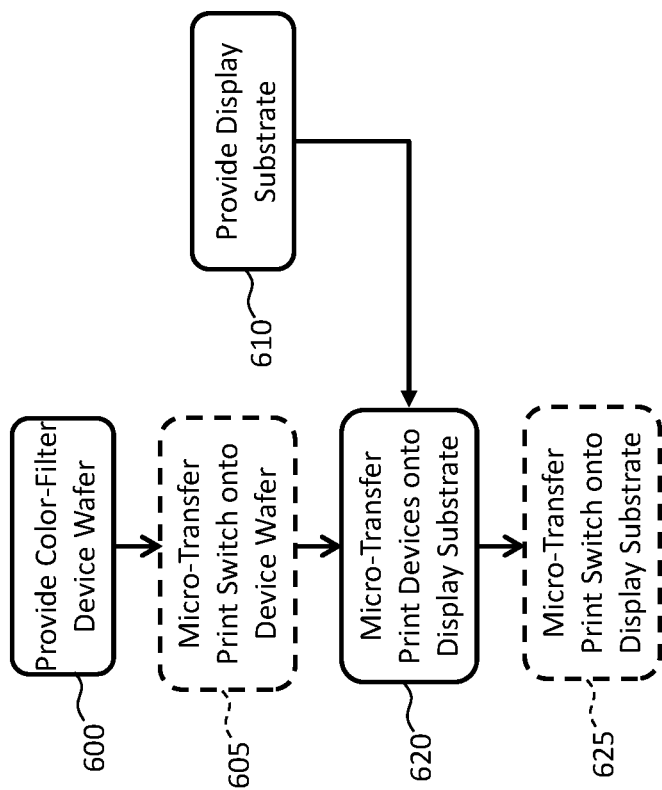
FIG. 34 is a flow chart according to illustrative methods of certain embodiments the present invention.

Referring to FIG. 34, in some embodiments of the present invention, a method of making a color-filter device display 10 comprises providing a color-filter device source wafer 80 in step 600, providing a display substrate 12 in step 610, and micro-transfer printing the micro-transfer printable color-filter devices 99 of the color-filter device source wafer 80 from the color-filter device source wafer 80 to the display substrate 12 in step 620. In optional step 605, a capacitor 62 or switch 60, or both, are micro-transfer printed to the display substrate 12 in correspondence with each micro-transfer color-filter device 99. Alternatively, in optional step 625, a capacitor 62 or switch 60, or both, is micro-transfer printed to each of the micro-transfer color-filter devices 99 on the color-filter device source wafer 80. In some embodiments of the present invention, the display substrate 12 is a flexible substrate, for example comprising polymer or plastic.

The intermediate or pixel structures 40 of the present invention can be constructed using compound micro-assembly techniques. A discussion of compound micro-assembly structures and methods is provided in U.S. patent application Ser. No. 14/822,868 filed Aug. 10, 2015, entitled Compound Micro-Assembly Strategies and Devices, which is hereby incorporated by reference in its entirety.

The display substrate 12, LEDs 33, and color filters 22 can all be provided at the same or at different times and in any order.

In general, structures, features, and elements of the present invention can be made using photolithographic methods and materials found in the integrated circuit arts, the light-emitting diode arts, and the laser arts, for example including doped or undoped semiconductor materials, optically pumped crystals, conductors, passivation layer, electrical contacts, and controllers.

As is understood by those skilled in the art, the terms "over" and "under" are relative terms and can be interchanged in reference to different orientations of the layers, elements, and substrates included in the present invention. For example, a first layer or device on a second layer, in some implementations means a first layer or device directly on and in contact with a second layer. In other implementations a first layer or device on a second layer includes a first layer or device and a second layer with another layer there between.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The mention herein of any publication, for example, in the Background section, is not an admission that the publication serves as prior art with respect to any of the claims presented herein. The Background section is presented for purposes of clarity and is not meant as a description of prior art with respect to any claim. Headers are provided for the convenience of the reader and are not intended to be limiting with respect to the claimed subject matter.

PARTS LIST 10 display
12 display substrate
14 pixel
20 color-filter structure
21a first side
21b second side
22 color filter
22R red color filter
22G green color filter
22B blue color filter
24 color-filter tether
26 color-filter source wafer
28 color-filter layer
30 pixel structure
30R red pixel structure
30G green pixel structure
30B blue pixel structure
31 encapsulation layer
32 LED structure
33 LED
33R red LED
33G green LED
33B blue LED
34 pixel tether
35 LED tether
36 pixel structure source wafer
37 dielectric structure
38 electrode/electrical conductor
38R reflective electrode
38M bottom electrode/first electrode
38T top electrode/second electrode
38V resistive electrode
39 light-emitting side
40 intermediate structure
42 intermediate substrate layer
44 intermediate tether
46 intermediate structure source wafer
48 intermediate substrate
50 planarizing layer
60 switch
61 isolation switch
62 capacitor
66 control circuit
68 electrical contact
70A, 70B light
72 color-filter substrate
80 source wafer
82 sacrificial layer
84 sacrificial portion
86 connection post
94 anchor
99 color-filter device (e.g., micro-transfer printable color-filter device)
200 provide source wafer step
210 dispose color filter layer on source wafer step
220 pattern color filter layer step
225 optional form patterned encapsulation step
230 etch sacrificial portion step
240 micro-transfer print color filter step
300 provide source wafer step
301 micro-transfer print color filter on sacrificial portion step
302 micro-transfer print LED on color filter step
303 dispose color filter on sacrificial layer step
305 micro-transfer print LED on sacrificial portion step
306 micro-transfer print color filter on LED step
307 dispose color filter on LED step
308 micro-transfer print LED and dispose color filter step
320 pattern color filter layer step
322 pattern color filter layer step
330 etch sacrificial portion step
340 micro-transfer print color filter step
400 provide source wafer step
401 micro-transfer print color filter on sacrificial portion step
402 micro-transfer print LED on color filter step
403 dispose color filter on sacrificial layer step
404 dispose pixel structure on intermediate substrate step
405 micro-transfer print LED on sacrificial portion step
406 micro-transfer print color filter on LED step
407 dispose color filter on LED step
408 dispose intermediate substrate layer on source wafer step
409 pattern intermediate substrates step
410 done step
420 pattern color filter layer step
422 pattern color filter layer step
430 form intermediate substrate wires step
440 etch sacrificial portion step
450 micro-transfer print intermediate structure on display substrate step
500 provide display substrate step
501 micro-transfer print color filter on sacrificial portion step
502 micro-transfer print LED on color filter step
503 dispose color filter on sacrificial layer step
505 micro-transfer print LED on sacrificial portion step
506 micro-transfer print color filter on LED step
507 dispose color filter on LED step
520 pattern color filter layer step
522 pattern color filter layer step
550 micro-transfer print intermediate structure onto display substrate step
560 micro-transfer print pixel structure onto display substrate step
570 micro-transfer print intermediate substrate onto display substrate step
600 provide color-filter device wafer step
605 micro-transfer print switch onto device wafer step
610 provide display substrate step
620 micro-transfer print devices onto display substrate step
625 micro-transfer print switch onto display substrate step

The invention claimed is:

1. A method of making a color-filter device display, comprising:
  providing a color-filter device source wafer, wherein the color-filter device source wafer comprises
    a wafer comprising a wafer substrate, the wafer substrate comprising a patterned sacrificial layer including sacrificial portions separated by anchors; and
    a color-filter device disposed entirely over each sacrificial portion, wherein the color-filter device comprises:
      a color filter,
      an electrical conductor disposed in contact with the color filter, and
      at least a portion of a color-filter tether attached to the color filter or structures formed in contact with or supporting the color filter, wherein the color filter is a variable color filter;
providing a display substrate; and
micro-transfer printing the color-filter devices of the color-filter device source wafer from the color-filter device source wafer to the display substrate.

2. The method of claim 1, comprising micro-transfer printing a capacitor or switch, or both, to the display substrate in correspondence with each color-filter device or micro-transfer printing a capacitor or switch, or both, to each of the color-filter devices on the color-filter device wafer.

3. The method of claim 1, wherein the step of micro-transfer printing the color-filter devices of the color-filter device source wafer from the color-filter device source wafer to the display substrate comprises fracturing the at least a portion of the color-filter tether.

4. The method of claim 1, comprising providing a color-filter substrate on, in, over, or under which the electrical conductor and the color filter are disposed.

5. The method of claim 4, comprising providing multiple color filters on a surface of the color-filter substrate.

6. The method of claim 5, comprising stacking the multiple color filters on a surface of the color-filter substrate.

7. The method of claim 1, comprising providing a light-emitting diode (LED) on an LED source wafer, micro-transfer printing the color filter to the display substrate, and micro-transfer printing the LED onto or over the color filter.

8. The method of claim 1, comprising providing a light-emitting diode (LED) on an LED source wafer, micro-transfer printing the LED onto the display substrate, and micro-transfer printing the color filter onto or over the LED.

9. The method of claim 1, comprising providing an intermediate substrate and disposing the color filter on or over the intermediate substrate or an adhesive layer formed on, over, or under the intermediate substrate.

10. The method of claim 9, wherein the intermediate substrate comprises at least a portion of an intermediate tether.

11. The method of claim 10, wherein the at least a portion of an intermediate tether is the at least a portion of a color-filter tether.

12. The method of claim 10, comprising fracturing the intermediate tether.

13. The method of claim 9, comprising providing multiple color-filter devices on a surface of the intermediate substrate or an adhesive layer formed on, over, or under the intermediate substrate.

14. The method of claim 13, comprising stacking the multiple color-filter devices on a surface of the intermediate substrate or an adhesive layer formed on, over, or under the intermediate substrate.

15. The method of claim 9, comprising micro-transfer printing the intermediate substrate.

16. The method of claim 9, comprising providing a light-emitting diode (LED) on an LED source wafer, micro-transfer printing the LED onto the color filter to form an intermediate structure, and micro-transfer printing the intermediate structure to the display substrate.

17. The method of claim 9, wherein the step of disposing the color filter comprises micro-transfer printing the color filter onto the intermediate substrate or an adhesive layer formed on, over, or under the intermediate substrate.

18. The method of claim 9, wherein the step of disposing the color filter comprises forming the color filter on or over the intermediate substrate or an adhesive layer formed on, over, or under the intermediate substrate.

19. The method of claim 1, wherein the color filter is or comprises one or more of: a phase-change material, an electrically controlled ink, a gel, a photonic crystal, or a matrix of photonic crystals.

20. The method of claim 1, wherein the electrical conductor is a resistor that heats the color filter in response to an electrical current passed through the resistor and wherein the color filter changes the color of light filtered by the color filter in response to heat received from the electrical conductor.

* * * * *